United States Patent
Liang et al.

(10) Patent No.: US 11,217,524 B1
(45) Date of Patent: Jan. 4, 2022

(54) INTERCONNECT STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Shuen-Shin Liang, Hsinchu County (TW); Ken-Yu Chang, Hsinchu (TW); Hung-Yi Huang, Hsin-Chu (TW); Chien Chang, Hsinchu (TW); Chi-Hung Chuang, Changhua County (TW); Kai-Yi Chu, Hsinchu (TW); Chun-I Tsai, Hsinchu (TW); Chun-Hsien Huang, Hsinchu (TW); Chih-Wei Chang, Hsin-Chu (TW); Hsu-Kai Chang, Hsinchu (TW); Chia-Hung Chu, Taipei (TW); Keng-Chu Lin, Ping-Tung (TW); Sung-Li Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 20 days.

(21) Appl. No.: 16/900,622

(22) Filed: Jun. 12, 2020

(51) Int. Cl.
*H01L 23/522* (2006.01)
*H01L 21/768* (2006.01)

(52) U.S. Cl.
CPC .... *H01L 23/5226* (2013.01); *H01L 21/76805* (2013.01); *H01L 21/76828* (2013.01); *H01L 21/76834* (2013.01); *H01L 21/76877* (2013.01); *H01L 23/5228* (2013.01)

(58) Field of Classification Search
CPC ........... H01L 23/5226; H01L 21/76834; H01L 21/76877; H01L 21/76828; H01L 23/5228; H01L 21/76805
See application file for complete search history.

(56) References Cited

U.S. PATENT DOCUMENTS

| | | | |
|---|---|---|---|
| 9,293,412 B2 * | 3/2016 | Bao | .................... H01L 23/53228 |
| 2019/0164887 A1 | 5/2019 | Wang et al. | |
| 2019/0214296 A1 | 7/2019 | Wang et al. | |
| 2020/0091067 A1 * | 3/2020 | Yang | ................. H01L 21/76879 |

OTHER PUBLICATIONS

U.S. Appl. No. 16/887,577, Liang et al., filed May 29, 2020.

* cited by examiner

*Primary Examiner* — Karen Kusumakar
(74) *Attorney, Agent, or Firm* — Wpat, P.C., Intellectual Property Attorneys; Anthony King

(57) ABSTRACT

The present disclosure provides an interconnect structure, including a first interlayer dielectric layer, a bottom metal line including a first metal in the first interlayer dielectric layer, a conductive via including a second metal over the bottom metal line, wherein the second metal is different from the first metal, and the first metal has a first type of primary crystalline structure, and the second metal has the first type of primary crystalline structure, a total area of a bottom surface of the conductive via is greater than a total cross sectional area of the conductive via, and a top metal line over the conductive via, wherein the top metal line comprises a third metal different from the second metal.

20 Claims, 71 Drawing Sheets

| Via (Ω-m) | Top Metal Line or Bottom Metal Line | Type of primary metallic crystalline structure |
|---|---|---|
| Mo (59.9) | W, Nb, V, Ta | BCC |
| Rh (32.3) | Ir, Ni, Cu, Pt | FCC |
| Ir (36.9) | Ni, Pt, Rh | FCC |
| Ni (40.7) | Ir, Cu, Rh, Pt | FCC |
| Cu (67.0) | Rh, Ni | FCC |
| Co (48.2) | Ru, Re, Co, Os | HCP |
| Ru (38.1) | Re, Co, Os | HCP |
| Os (43.3) | Re, Co, Os | HCP |

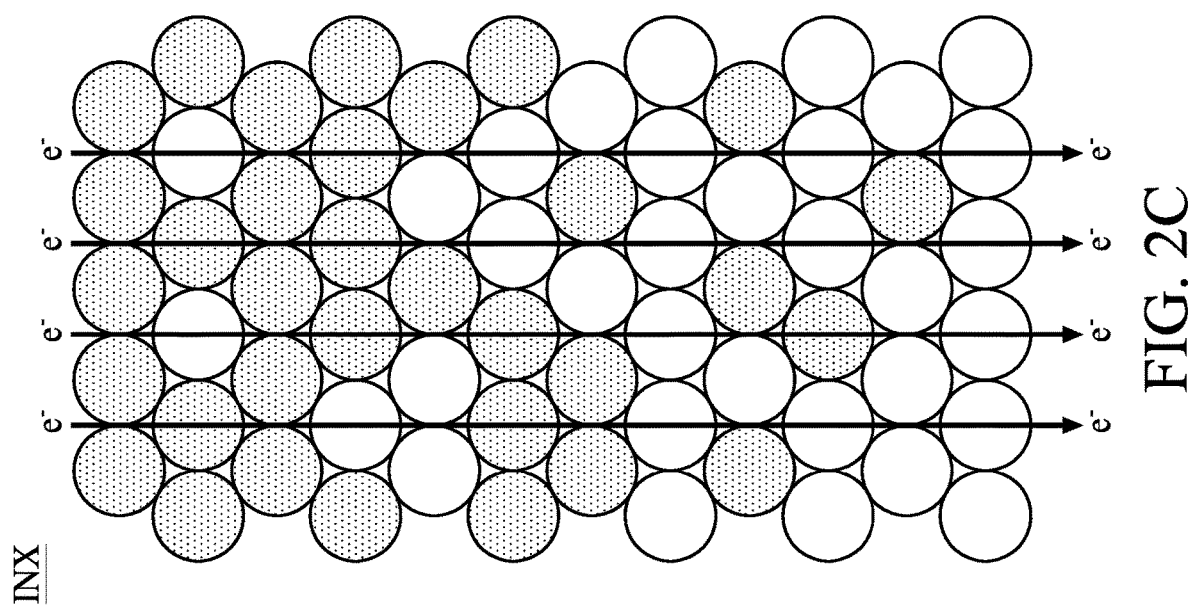

| Via (Ω-m) | Top Metal Line or Bottom Metal Line | Type of primary metallic crystalline structure |
|---|---|---|
| Mo (59.9) | W, Nb, V, Ta | BCC |
| Rh (32.3) | Ir, Ni, Cu, Pt | FCC |
| Ir (36.9) | Ni, Pt, Rh | FCC |
| Ni (40.7) | Ir, Cu, Rh, Pt | FCC |
| Cu (67.0) | Rh, Ni | FCC |
| Co (48.2) | Ru, Re, Co, Os | HCP |
| Ru (38.1) | Re, Co, Os | HCP |
| Os (43.3) | Re, Co, Os | HCP |

FIG. 2E

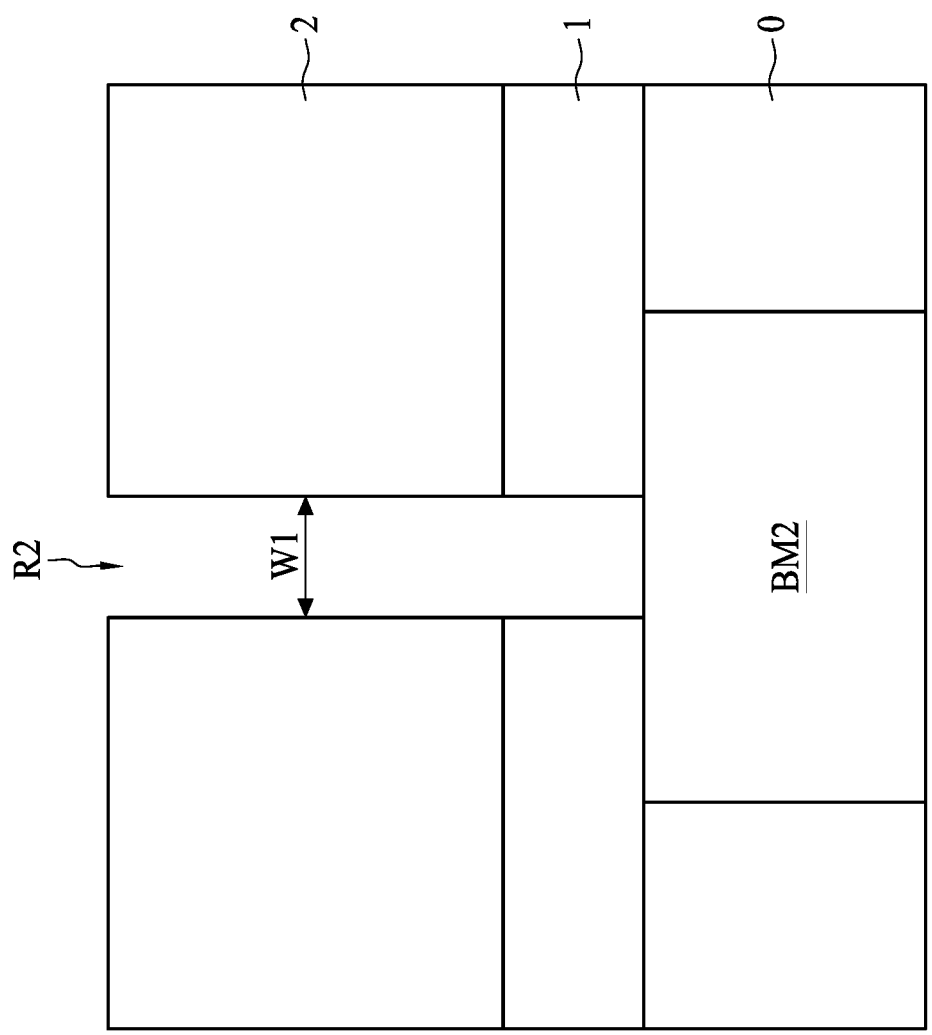

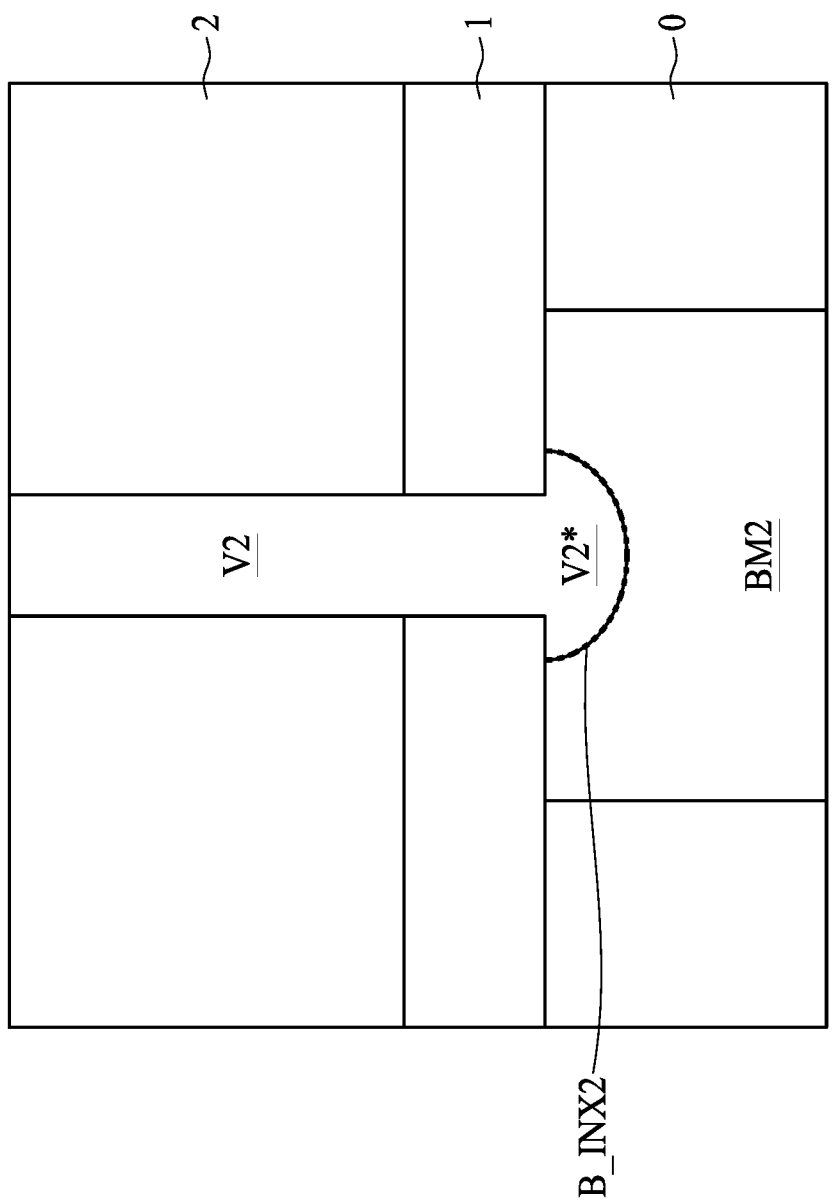

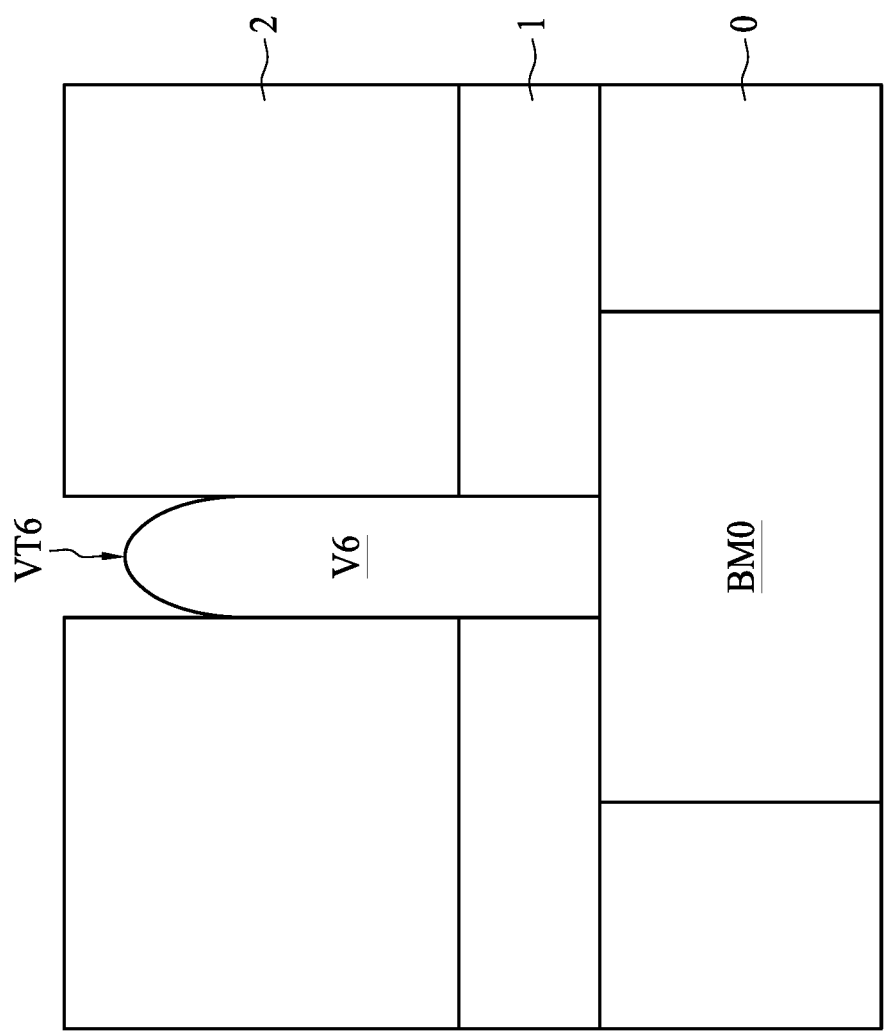

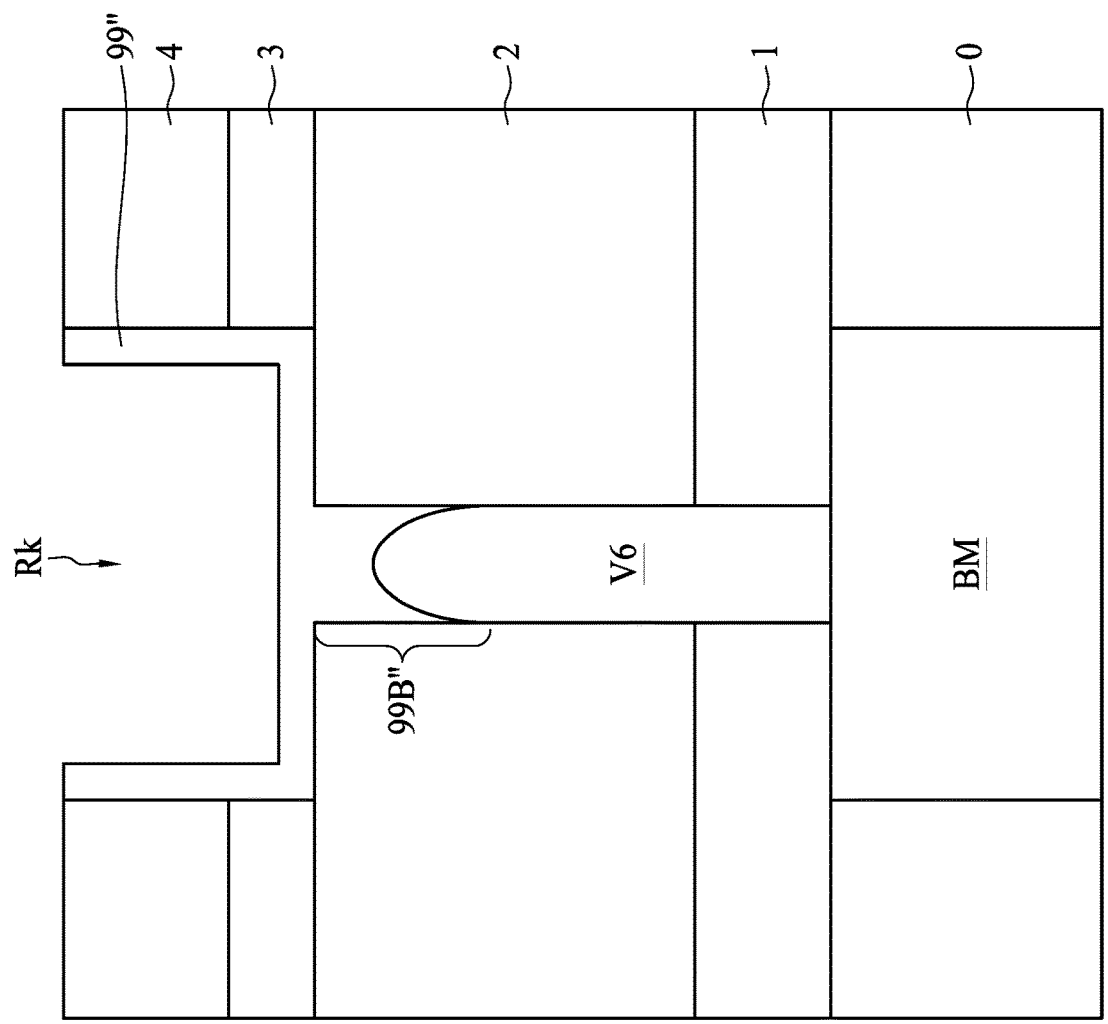
FIG. 13A"

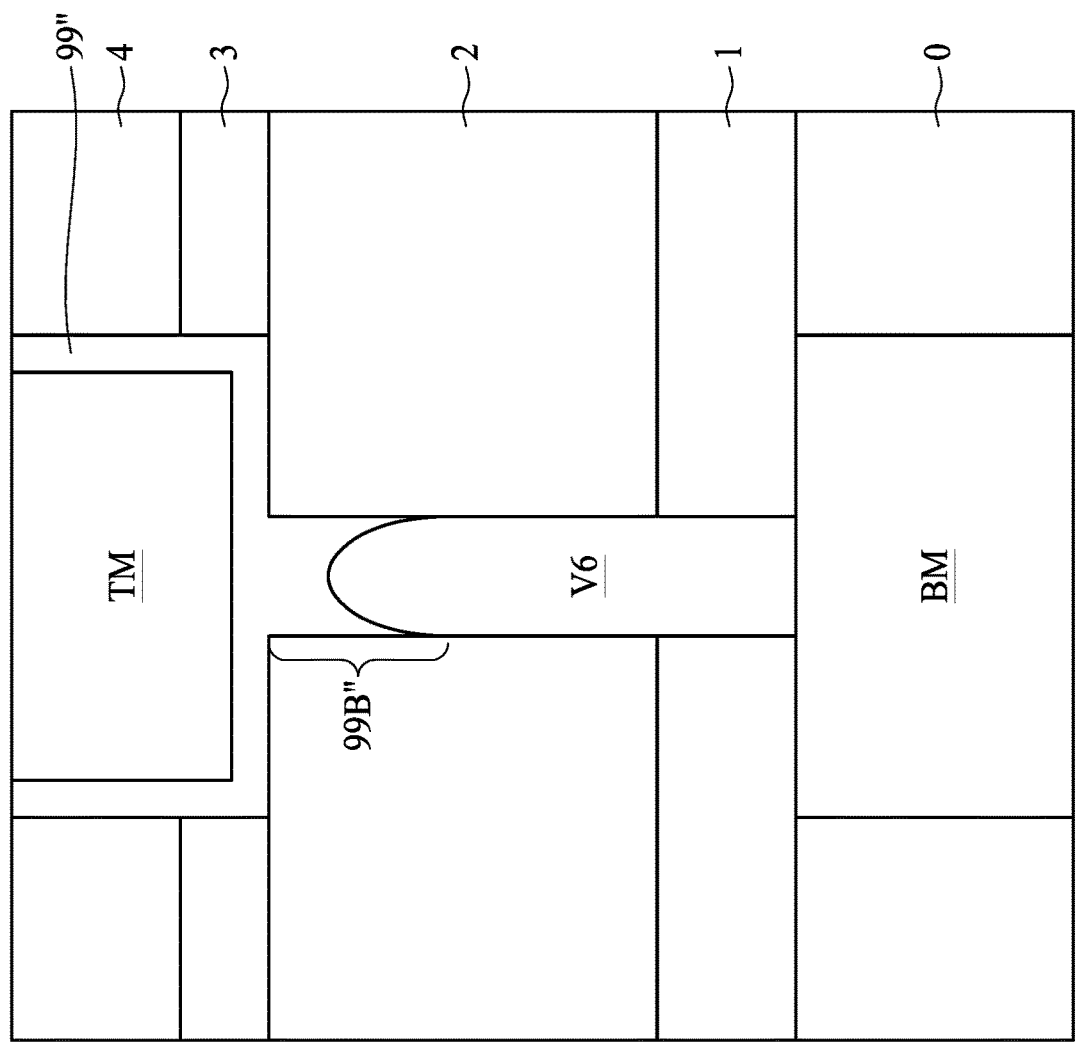
FIG. 13B"

INTERCONNECT STRUCTURE AND MANUFACTURING METHOD FOR THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a schematic diagram showing the condition of electron scattering at an intermixing interface between two conductive materials, in accordance with some embodiments of the present disclosure.

FIG. 2E is a lookup table illustrating combinations of material of a top metal, bottom metal and a via, in accordance with some embodiments of the present disclosure.

FIG. 5A to FIG. 5E are cross sectional views of an interconnect structure during intermediate stages of manufacturing operations, according to some embodiments of the present disclosure.

FIG. 9A to FIG. 9G are cross sectional views of an interconnect structure during intermediate stages of manufacturing operations, according to some embodiments of the present disclosure.

FIG. 13A' to FIG. 13B' are cross sectional views of an interconnect structure during intermediate stages of manufacturing operations, according to some embodiments of the present disclosure.

FIG. 13A" to FIG. 13B" are cross sectional views of an interconnect structure during intermediate stages of manufacturing operations, according to some embodiments of the present disclosure.

FIG. 13A''' to FIG. 13B''' are cross sectional views of an interconnect structure during intermediate stages of manufacturing operations, according to some embodiments of the present disclosure.

DETAILED DESCRIPTION

Figure 1A:
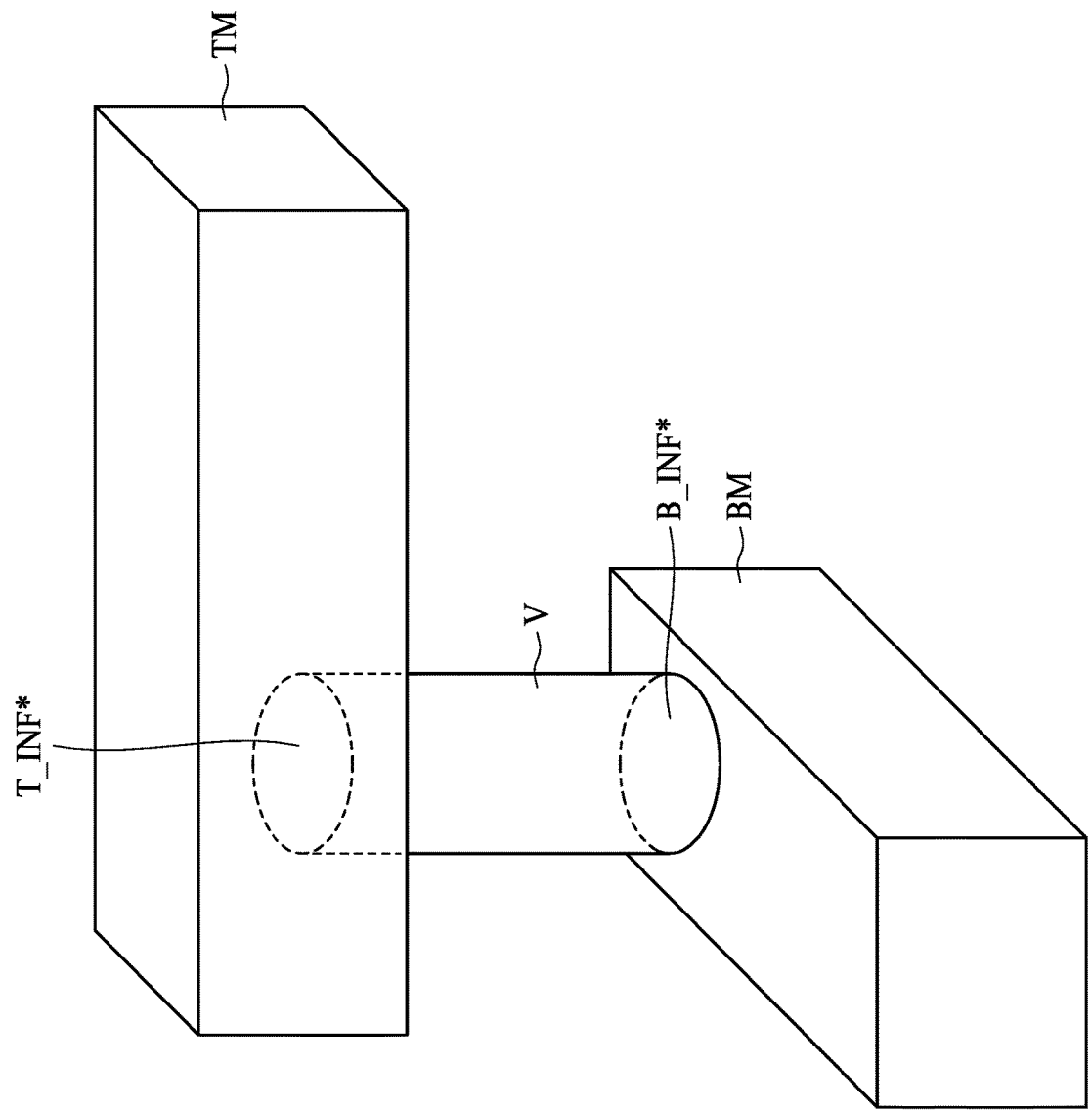
FIG. 1A is a perspective view showing an interconnect structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The scaling down process increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

The resistivity of the material and the interfacial resistance between two conductive layers contributes to the overall resistance of an interconnect structure, wherein the trend of decreasing the dimension/the area of the interface would make it more challenging to limit the increase of resistivity. When the dimension of a via is less than 18 nm (or an interconnect structure beyond N3 technology node), the contribution of interfacial resistance may be especially dominant.

The present disclosure provides an interconnect structure and method for fabricating an interconnect structure. Specifically, the present disclosure aims to decrease the interfacial resistivity and increase interface area. In some embodiments, the present disclosure provides an interconnect structure and the fabrication method that can be implemented in back-end-of-line (BEOL) fabrication process. Alternatively, the interconnect structure and the fabrication method can be implemented in other contexts, such as in middle-end-of-line (MEOL) fabrication process.

Referring to FIG. 1A, FIG. 1A is a perspective view showing an interconnect structure 100, in accordance with some embodiments of the present disclosure. The interconnect structure 100 has a bottom metal line BM, a via V over and electrically connected to the bottom metal line BM, and a top metal line TM over and electrically connected to the via V. An interface T_INF* is between the top metal line TM and the via V, an interface B_INF* is between the via V and the bottom metal line BM. The configuration may be deemed as the bottom metal line BM, the via V, and the top metal line TM connecting in series. Each of the bulk resistance of the bottom metal line BM, bulk resistance of the via V, the bulk resistance of the top metal line TM, the interfacial resistance at the interface T_INF*, and the interfacial resistance at the interface B_INF* may be positively related to (and be a factor contribute to) the overall resistance of the interconnect structure 100. As previously discussed, when the dimension of the via V is less than 18 nm (or in some cases, less than 10 nm), the interfacial resistance at the interface T_INF*, and the interfacial resistance at the interface B_INF* may be a more dominating factor among the overall resistance of the interconnect structure 100.

Figure 1B:
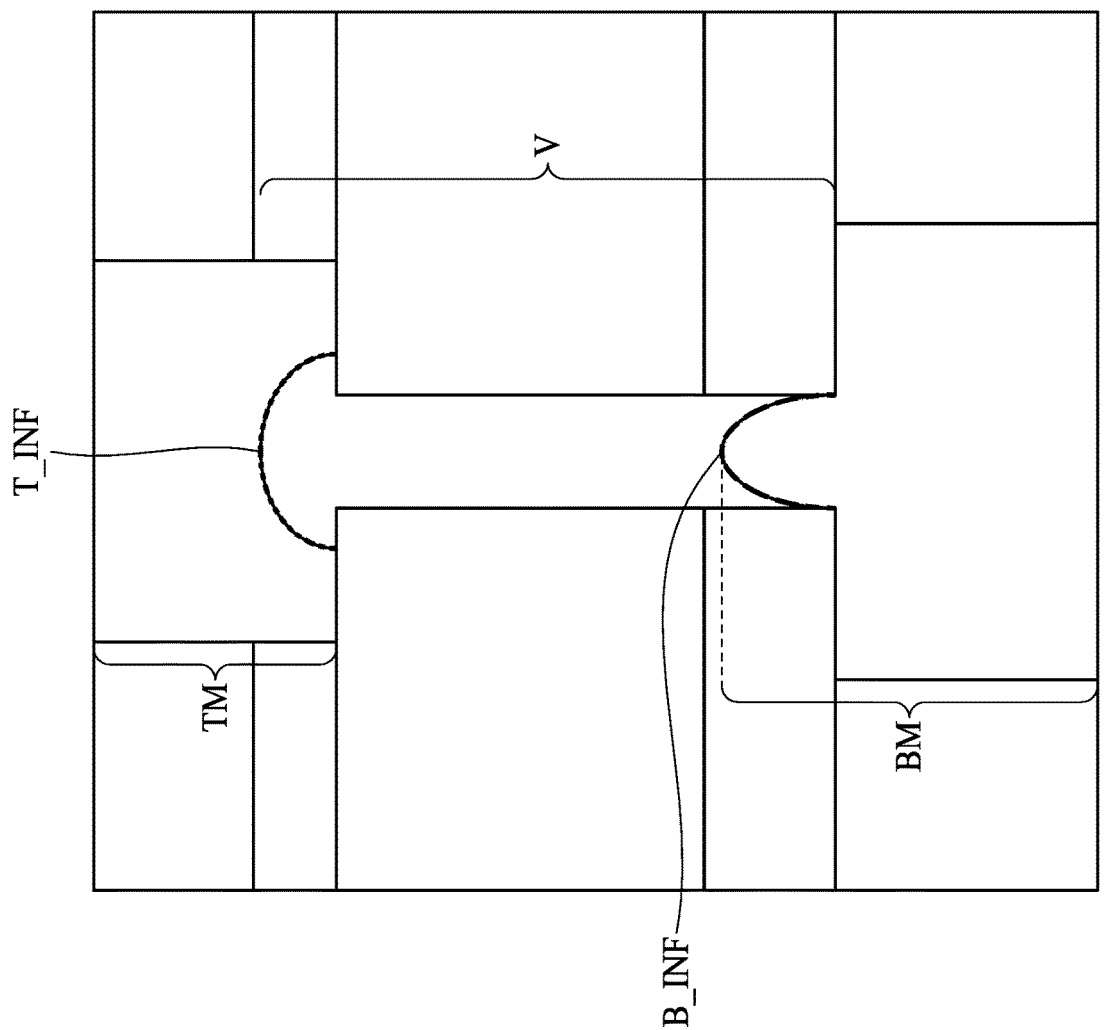
FIG. 1B is a cross sectional view of an interconnect structure, according to some embodiments of the present disclosure.

Referring to FIG. 1B, FIG. 1B is a cross sectional view of an interconnect structure, according to some embodiments of the present disclosure. The interfacial resistance at the interface T_INF* and the interfacial resistance at the interface B_INF* may be decreased in order to decrease the overall resistance of the interconnect structure 100. As will be discussed in FIG. 2A to FIG. 2G, by specifically selecting the combinations of material for the bottom metal line BM, the via V, and the top metal line TM, the resistivity at the interfaces T_INF* and B_INF* may be decreased. Furthermore, as will be discussed in FIG. 4A to FIG. 10G, by the configurations and the fabrication operations provided in the present disclosure, the total area of interface T_INF* and/or the total area of the interface B_INF*, the interfacial resistance can be decreased.

Specifically, each set of embodiments discussed in FIG. 4A to FIG. 4E, FIG. 5A to FIG. 5E, and FIG. 6A to FIG. 6I can be applied to the configuration and fabrication method of the bottom metal line BM and the via V; each set of embodiments discussed in FIG. 7A to FIG. 7F, FIG. 8A to FIG. 8G, FIG. 9A to FIG. 9G, and FIG. 10A to FIG. 10G can be applied to the configuration and fabrication method of the via V and the top metal line TM.

The top metal lines denoted as TM0 as well as a top portion of each of the via V1 to V3 in FIG. 4A to FIG. 4E, FIG. 5A to FIG. 5E, and FIG. 6A to FIG. 6I can optionally be substituted by any one of the top metal lines TM4 to TM7 and a top portion of the vias V4 to V7 as discussed in FIG. 7A to FIG. 7F, FIG. 8A to FIG. 8G, FIG. 9A to FIG. 9G, and FIG. 10A to FIG. 10G, respectively.

The bottom metal lines denoted as BM0 as well as a bottom portion of each of the vias discussed in FIG. 7A to FIG. 7F, FIG. 8A to FIG. 8G, FIG. 9A to FIG. 9G, and FIG. 10A to FIG. 10G can optionally be substituted by any one of the bottom metal lines BM1 to BM3 and a bottom portion of the vias V1 to V3 as discussed in FIG. 4A to FIG. 4E, FIG. 5A to FIG. 5E, and FIG. 6A to FIG. 6I, respectively.

Alternatively stated, an interconnect structure may include a bottom metal line and a bottom portion of the via selected from the configurations provided in FIG. 4A to FIG. 4E, FIG. 5A to FIG. 5E, and FIG. 6A to FIG. 6I; and may include a top metal line and a top portion of the via selected from the configurations provided in FIG. 7A to FIG. 7F, FIG. 8A to FIG. 8G, FIG. 9A to FIG. 9G, and FIG. 10A to FIG. 10G. Furthermore, each set of the fabrication operations from FIG. 7A to FIG. 7F, FIG. 8A to FIG. 8G, FIG. 9A to FIG. 9G, and FIG. 10A to FIG. 10G can be performed after performing any one of the set of fabrication operations from FIG. 4A to FIG. 4E, FIG. 5A to FIG. 5E, and FIG. 6A to FIG. 6I.

For example, the interconnect structure provided in FIG. 1B can be deemed as a incorporating the configuration provided in FIG. 8A to FIG. 8G to the configuration provided in FIG. 4A to FIG. 4E.

Figure 2A:
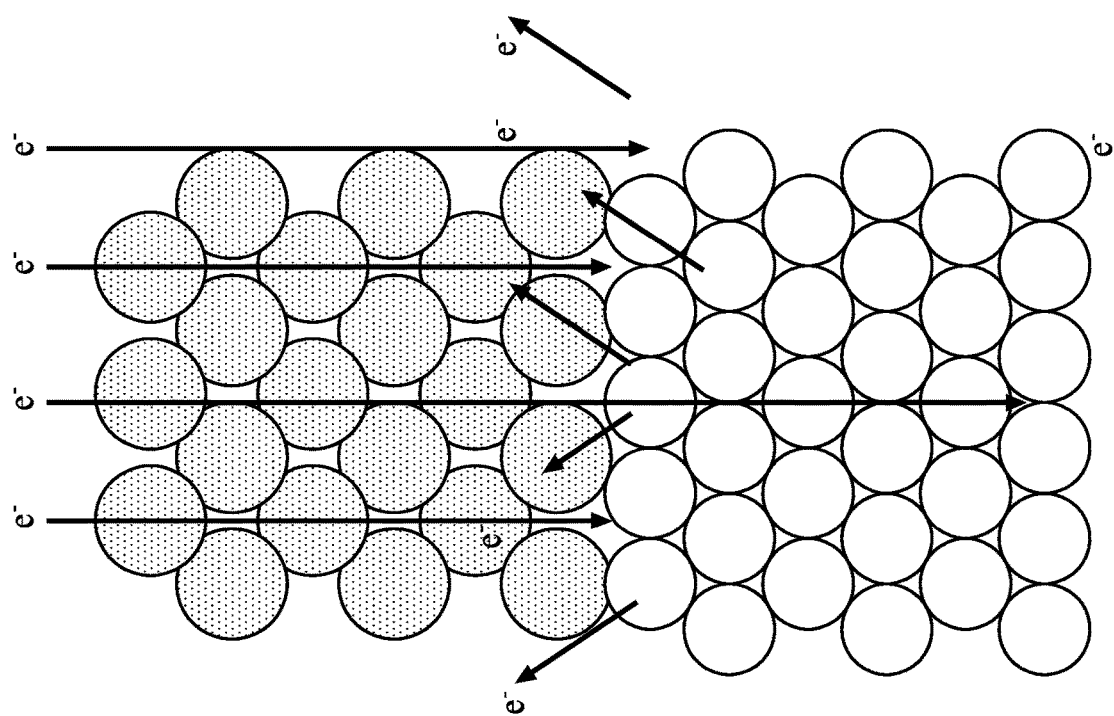
FIG. 2A is a schematic diagram showing the condition of electron scattering at an interface between two conductive materials, according to a comparative embodiment.

Referring to FIG. 2A, FIG. 2A is a schematic diagram showing the condition of electron scattering at an interface between two conductive materials with different types of primary crystalline structure, according to a comparative embodiment. A comparative embodiment of two conductive material contacting at an interface between two conductive materials with different types of primary crystalline structure is shown in FIG. 2A. In some embodiments, no intermixing is occurred at such interface. It can be observed that when the line width is too small (e.g. having a dimension less than 18 nm), the effect of electron scattering may be more apparent when electron passing the interface, thus the interfacial resistance may be significantly increased. In the case of an interconnect structure having a greater line width under traditional structure, the effect of electron scattering as well as the interfacial resistance may be less apparent, thereby the bulk resistance of metal line material or via material may be one of the more dominant factors among overall resistance. For example, the proportion of interfacial resistance in a bottom metal-bridge metal-top metal scenario is about 16% of the overall resistance under a conventional greater line width structure (e.g., greater than about 18 nm) while the other 84% being accounted to bulk resistance. However, the proportion of the interfacial resistance rises to 64% of the overall resistance under a smaller line width structure (e.g., smaller than about 18 nm) while the other 36% being accounted to bulk resistance.

Figure 2B:
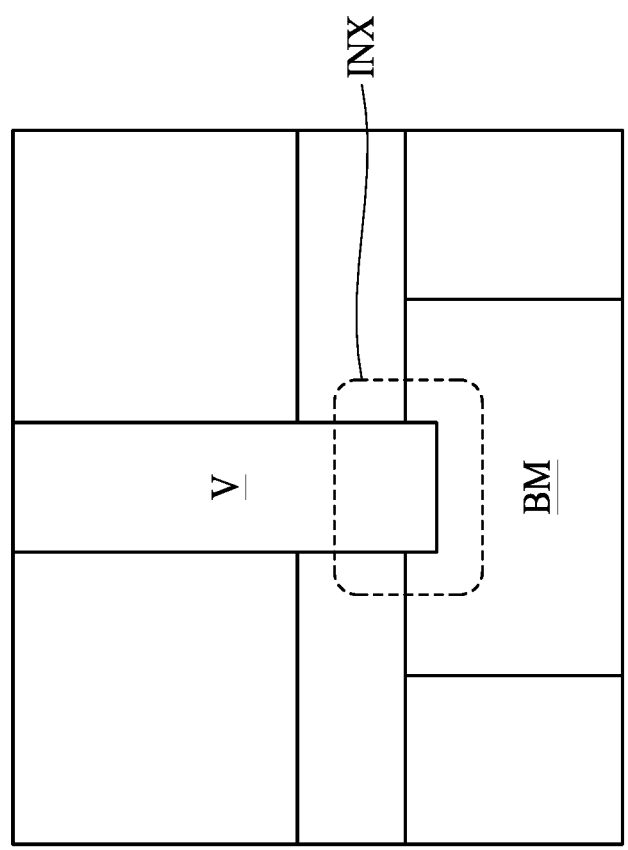
FIG. 2B is a schematic diagram showing an intermixing surface between two conductive materials, in accordance with some embodiments of the present disclosure.

Referring to FIG. 2B and FIG. 2C, FIG. 2B is a schematic diagram showing an interface between two conductive materials with same type of primary crystalline structure, FIG. 2C is a schematic diagram showing the condition of electron scattering at an interface between two conductive materials with same type of primary crystalline structure, in accordance with some embodiments of the present disclosure. In some embodiments, electron scattering of an interconnect structure may be reduced at an interface between two conductive materials with same type of primary crystalline structure. In some of the cases, electron scattering of an interconnect structure may be greatly reduced when intermixing is occurred at material interface. In the present disclosure, intermixing refers to the combining effect between two materials at the interface, which includes atomic diffusion and/or similar crystallinity.

Figure 2D:
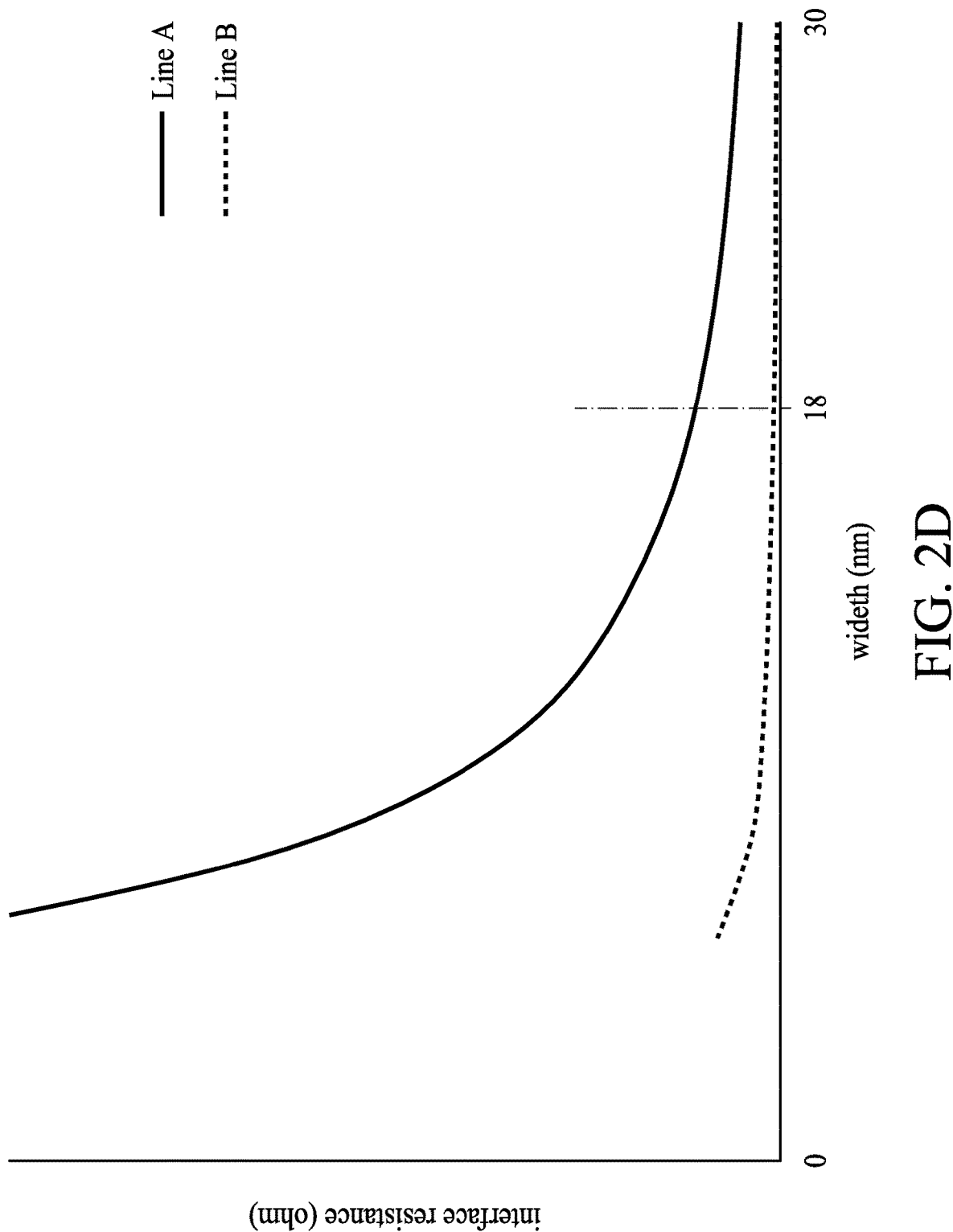
FIG. 2D is a diagram showing a comparison of interfacial resistance between an intermixing interface and an interface without intermixing, in accordance with some embodiments of the present disclosure.

By selecting specific material combination for bottom metal line BM-via V or via V-top metal line TM (see FIG. 1A), an intermixing interface INX may be formed between the bottom metal line BM and the via V, and/or between the via V and the top metal line TM (see FIG. 1A). Intermixing may be especially apparent when one of the materials of bottom metal line BM, via V or top metal line TM has a lower melting temperature and demonstrate greater diffusion length. The occurrence of intermixing demonstrated by diffusion length may further alleviate the effect of electron scattering. Alternatively, in some other cases, the intermixing effect occurs at grain-level at the interface, which a single grain may contain two kinds of atoms at the respective sides of the interface. Referring to FIG. 2D, FIG. 2D is a diagram showing a comparison of interfacial resistance between an intermixing interface and an interface without intermixing, in accordance with some embodiments of the present disclosure. Line A of FIG. 2D shows a relationship between a dimension (or line width) and the corresponding interface resistance at a non-intermixing interface between the bottom metal line BM and the via V (or the interface between the via V and the top metal line TM). Line B of FIG. 2D shows a relationship between a dimension (or line width) and the corresponding interface resistance at an intermixing interface between the bottom metal line BM and the via V (or the interface between the via V and the top metal line TM). It can be observed that by selecting specific material combination to have an intermixing interface between different materials, the interface resistance can be reduced. Having two conductive materials with same type of primary crystalline structure may reduce interface resistance. Specifically, for the technology node that requires a dimension (or line width) of via V to be smaller 18 nm, the reduction of interface resistance may be even more apparent. The criteria of selecting material combinations will be discussed in FIG. 2E.

Referring to FIG. 2E, FIG. 2E is a lookup table illustrating combinations of material of a top metal, bottom metal and a via, in accordance with some embodiments of the present disclosure. The bottom metal line includes a first metal, the via includes a second metal, and the top metal line includes a third metal. Conventionally, only the bulk resistivity of a material is considered when selecting a material of the via. However, in the generations of requiring the via to have a smaller dimension (e.g. less than 18 nm), factors with regard to interface scattering should further be considered. The present disclosure provides a criteria of selecting optimized materials for the second metal of via, that is, a product of mean free path $\lambda_{rt}$ times resistivity $\rho$, is preferably to be less than 7E-17 (g-m$^2$). The materials having the product $\lambda_{rt}*\rho$ less than 7E-17 $\Omega$-m$^2$ may have less bulk resistivity and incurring less interfacial resistance. The material may be selected from Rhodium (Rh, 3.23E-17 $\Omega$-m$^2$), Iridium (Ir, 3.69 E-17 $\Omega$-m$^2$), Ruthenium (Ru, 3.81 E-170 $\Omega$-m$^2$), Nickel (Ni, 4.07 E-17 $\Omega$-m$^2$), Osmium (Os, 4.33 E-17 $\Omega$-m$^2$), Cobalt (Co, 4.82 E-17 $\Omega$-m$^2$), Aluminum (Al, 5.01 E-17 $\Omega$-m$^2$), Molybdenum (Mo, 5.99 E-17 $\Omega$-m$^2$), and Copper (Cu, 6.70 E-17 $\Omega$-m$^2$). It should be noted that Tungsten (8.2E-17 $\Omega$-m$^2$) and Silver (8.46E-17 $\Omega$-m$^2$) have the product $\lambda_{rt}* \rho$ greater than 7E-17 $\Omega$-m$^2$.

In order to inhibiting the electron scattering at the interface(s) between two metals, the two metals may have identical type of primary crystalline structure, which generally indicate that two materials have a relatively smaller lattice mismatch. A type of primary crystalline structure of second metal is identical with a type of primary crystalline structure of first metal or third metal.

In some of the cases, a solid state solution of first metal and second metal (or second metal and third metal) can be formed, and, the electron scattering effect is alleviated in solid state solution since the interface may be less distinct. In some of the embodiments, the first metal and the third metal can be the same. In some embodiments, the material combination selected for the bottom metal line BM and the via V or the via V and the top metal line TM may possess a binary phase diagram showing solid solution property under the temperature range of interest. The temperature range of interest may cover from room temperature to the highest temperature during various manufacturing operations.

For example (referring back to FIG. 1B), in the case of the second metal of via V includes material of a primary crystalline structure of Body Centered Cubic (BCC), such as molybdenum (Mo), the first metal of the bottom metal line BM and/or the third metal of the top metal line TM can be selected from a group of conductive material having BCC crystalline structure, such as tungsten (W), niobium (Nb), vanadium (V), or tantalum (Ta).

Similarly, in the case of the second metal of via V includes a material having a primary crystalline structure of Face-Centered Cubic (FCC), the first metal of the bottom metal line BM and/or the third metal of the top metal line TM can be selected from a group of conductive material having FCC crystalline structure. For example, in the case of the second metal is Rhodium (Rh), the first metal and/or the third metal can be selected from a group of a group of conductive material having FCC crystalline structure, such as iridium (Ir), nickel (Ni), copper (Cu), or platinum (Pt). In the case of the second metal is iridium (Ir), the first metal and/or the third metal can be selected from a group of nickel (Ni), platinum (Pt), or Rhodium (Rh). In the case of the second metal is nickel (Ni), the first metal and/or the third metal can be selected from a group of iridium (Ir), copper (Cu), rhodium (Rh), or platinum (Pt). In the case of the second metal is copper (Cu), the first metal and/or the third metal can be selected from a group of rhodium (Rh), or nickel (Ni).

It should be noted that some of the materials have lower melting points, for example, nickel (1453° C.) or copper (1085° C.). In the case of such material(s) with lower melting points is used as the first metal, second metal, or third metal, the forming of solid solution is more apparent. In some embodiments, the metal with lower melting point would be diffused into the interfacing metal entirely (for example, interfacing metal is with higher melting temperature). Furthermore, a barrier, liner, or block layer can be formed around or over such material to alleviate migration, which will be discussed in FIG. 13 to FIG. 13B'''.

Similarly, in the case of the second metal of via V includes a material having a primary crystalline structure of Hexagonal Closest Packed (HCP), the first metal of the bottom metal line BM and/or the third metal of the top metal line TM can be selected from a group of conductive material having HCP crystalline structure. In the case of the second metal is ruthenium (Ru), the first metal and/or the third metal can be selected from a group of rhenium (Re), cobalt (Co), or osmium (Os). In the case of the second metal is osmium (Os), the first metal and/or the third metal can be selected from a group of rhenium (Re), cobalt (Co), or osmium (Os). In the case of the second metal is cobalt (Co), the first metal and/or the third metal can be selected from a group of ruthenium (Ru), rhenium (Re), cobalt (Co), or osmium (Os).

It should be noted that some of the materials have lower melting points, for example, cobalt (1495° C.), the forming of solid solution is more apparent. In some embodiments, the metal with lower melting point would be diffused into interfacing metal entirely (for example, the interfacing metal is with higher melting temperature). In some embodiments, a barrier, liner, or block layer can be formed around or over such material to alleviate migration, which will be discussed in FIG. 13 to FIG. 13B'''.

The phenomenon of intermixing may be observed by spectrometry techniques, such as secondary-ion mass spectrometry (SIMS) or Energy-dispersive X-ray spectroscopy (EDX). The comparison between an interface without intermixing and an interface with intermixing is presented in FIG. 2F and FIG. 2G.

Figure 2F:
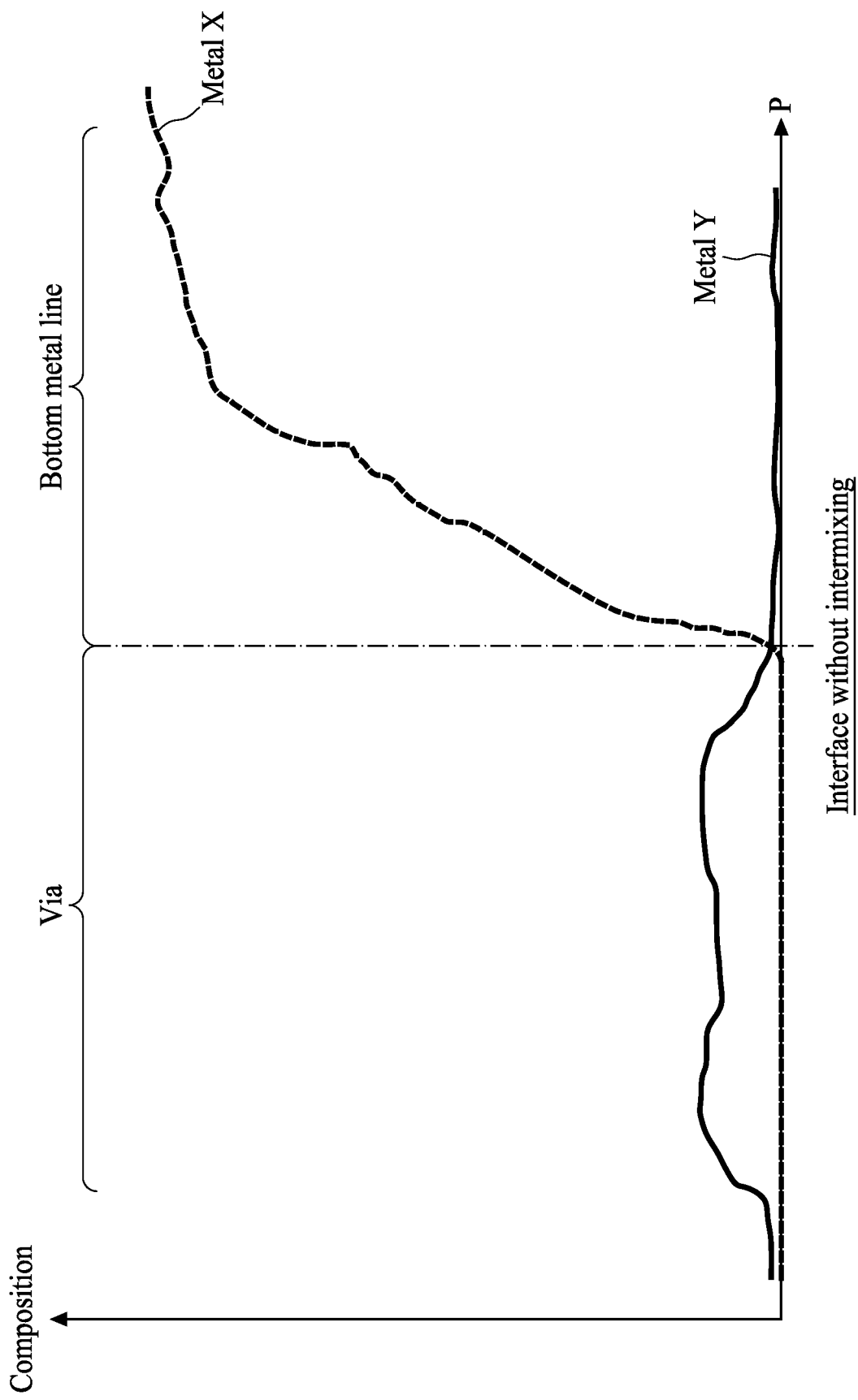
FIG. 2F is a result of composition analysis of metal X and metal Y in a via and a bottom metal line, in accordance with some comparative embodiments of the present disclosure.

Referring to FIG. 2F, FIG. 2F is a result of composition analysis of metal X and metal Y in a via and a bottom metal line, in accordance with some comparative embodiments of the present disclosure. Herein a bottom metal line is made of metal X (for example, cobalt) and a via is made of metal Y (for example, tungsten) having a different primary crystalline structure comparing to metal X. In some of the cases, it may be observed that a composition of metal X in bottom via sharply decreases at a position near the interface between via and bottom metal line, and a composition of metal X in via is relatively low, or in some cases, is negligible. Similarly, a composition of metal Y in via sharply decreases at a position near the interface between via and bottom metal line, and a composition of metal Y in bottom metal line is relatively low, or in some cases, is negligible. FIG. 2F shows an inter-diffusion character of metal X and metal Y at its interface, where metal X do not intermix with metal Y.

Figure 2G:
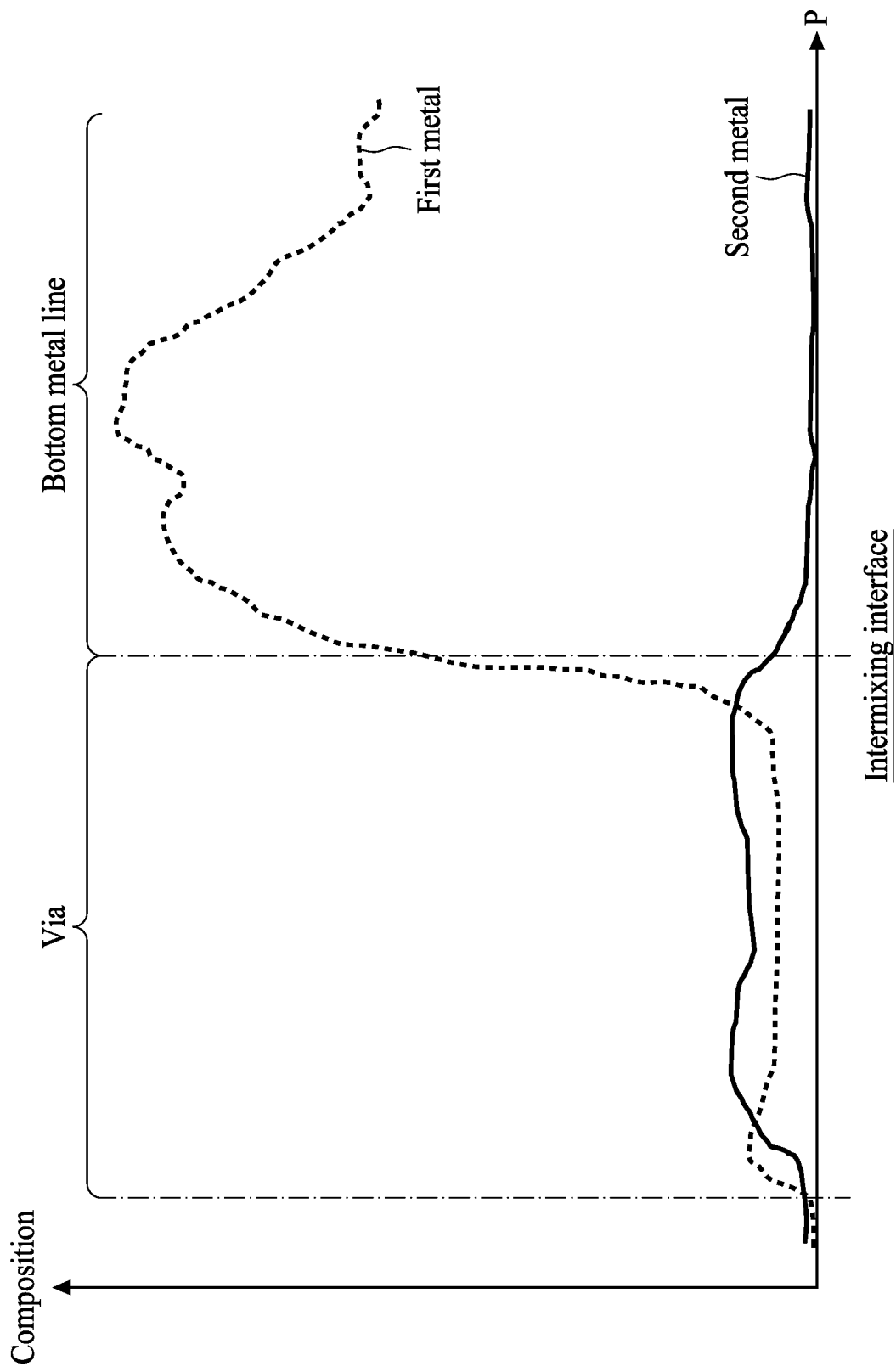
FIG. 2G is a result of composition analysis of first metal and second metal in a via and a bottom metal line, in accordance with some embodiments of the present disclosure.

Referring to FIG. 2G, FIG. 2G is a result of composition analysis of first metal and second metal in a via and a bottom metal line, in accordance with some embodiments of the present disclosure. Herein a bottom metal line includes first metal (for example, Co) and a via includes second metal (for example, Ru), wherein the selection of first metal and second metal can be referred to FIG. 2E). A diffusion length of the first metal is in the second metal is apparently observable when first metal possess lower melting points (such as lower than 1500° C.), or vice versa. In some embodiments, the diffusion length along the diffusion direction depends on the melting points of two contacting metal. In some embodiments, the diffusion length of metal with lower melting points may overlap the entire length of another metal contacting therewith. In some of the alternative embodiments, a grading concentration profile of second metal may be found from the intermixing interface toward the bottom of the bottom metal line. Such diffusion profile may be observed in the device provided in FIG. 4E, FIG. 5E, FIG. 6I, FIG. 7F, FIG. 8G, FIG. 9G, or FIG. 10G. Such intermixing effect can also be found in the via and the top metal line of the embodiments of present disclosure described herein. In some alternative embodiments, the intermixing occurs at grain-level when both metal possess higher melting points (such as greater than 1500° C.), wherein the diffusion of both metals may be less apparent. For example, the combination of Molybdenum and tungsten may have grain-level intermixing instead of apparent inter-diffusion under ordinary annealing temperature.

For an example, cobalt, used as first metal, has lower melting point (lower than 1500° C.) and ruthenium, used as second metal, has greater melting point (greater than 1500° C.), wherein the difference of melting points is greater than 20%. In such case, the diffusion length of cobalt may overlap about 1%~20% of the length of the second metal, e.g., the via V, depending on the annealing temperature.

Figure 3A:
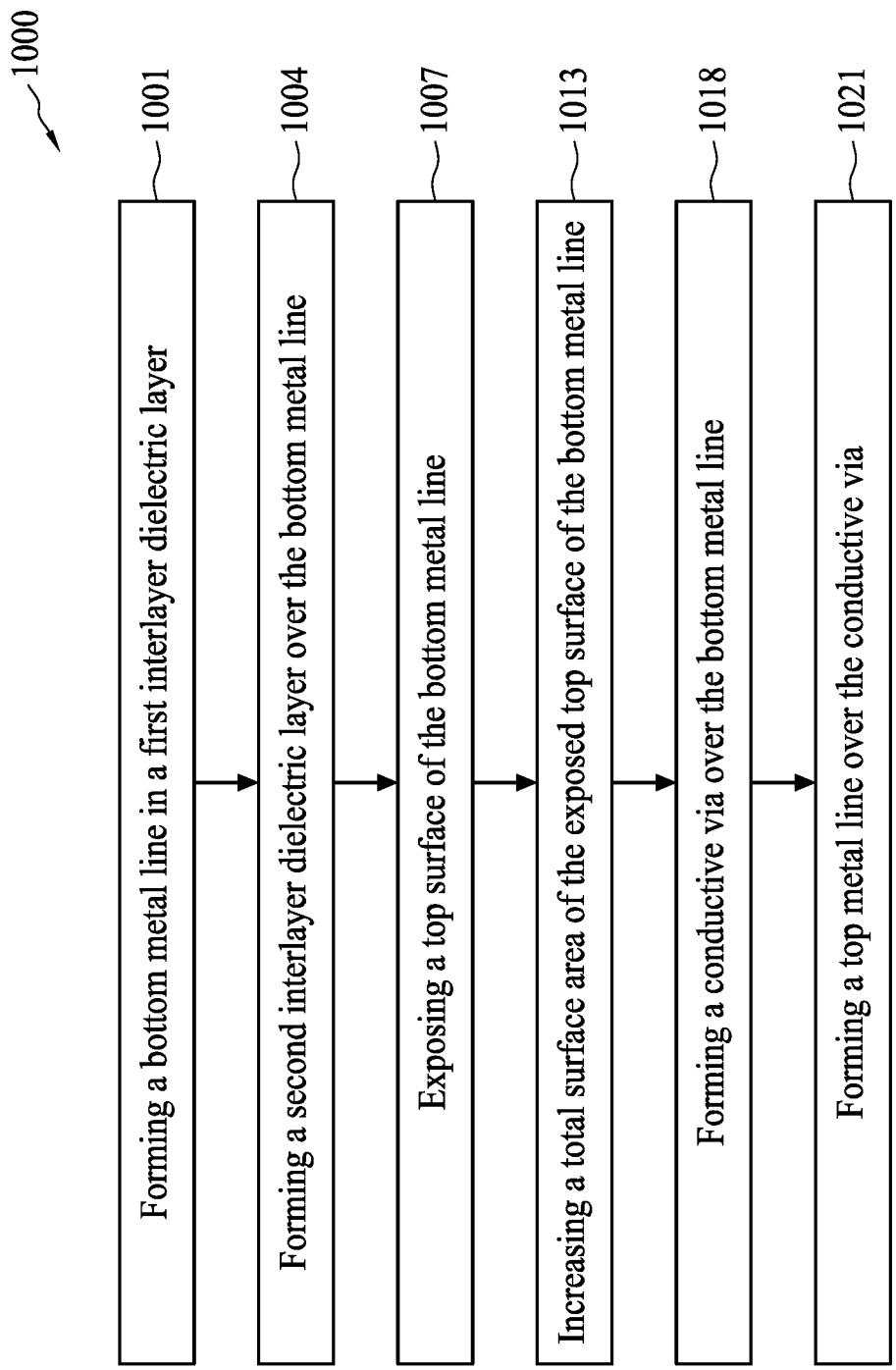
FIG. 3A shows a flow chart representing method of fabricating an interconnect structure, in accordance with some embodiments of the present disclosure.

Referring to FIG. 3A, FIG. 3A shows a flow chart representing method of fabricating an interconnect structure, in accordance with some embodiments of the present disclosure. The method 1000 for fabricating an interconnect structure includes forming a bottom metal line in a first interlayer dielectric layer (operation 1001, which can be referred to FIG. 4A or FIG. 5A), forming a second interlayer dielectric layer over the bottom metal line (operation 1004, which can be referred to FIG. 4A or FIG. 5A), exposing a top surface of the bottom metal line (operation 1007, which can be referred to FIG. 4A or FIG. 5A), increasing a total surface area of the exposed top surface of the bottom metal line (operation 1013, which can be referred to FIG. 4B or FIG. 5B), forming a conductive via over the bottom metal line (operation 1018, which can be referred to FIG. 4C to FIG. 4D or FIG. 5C to FIG. 5D), and forming a top metal line over the conductive via (operation 1021, which can be referred to FIG. 4E or FIG. 5E).

Figure 3B:
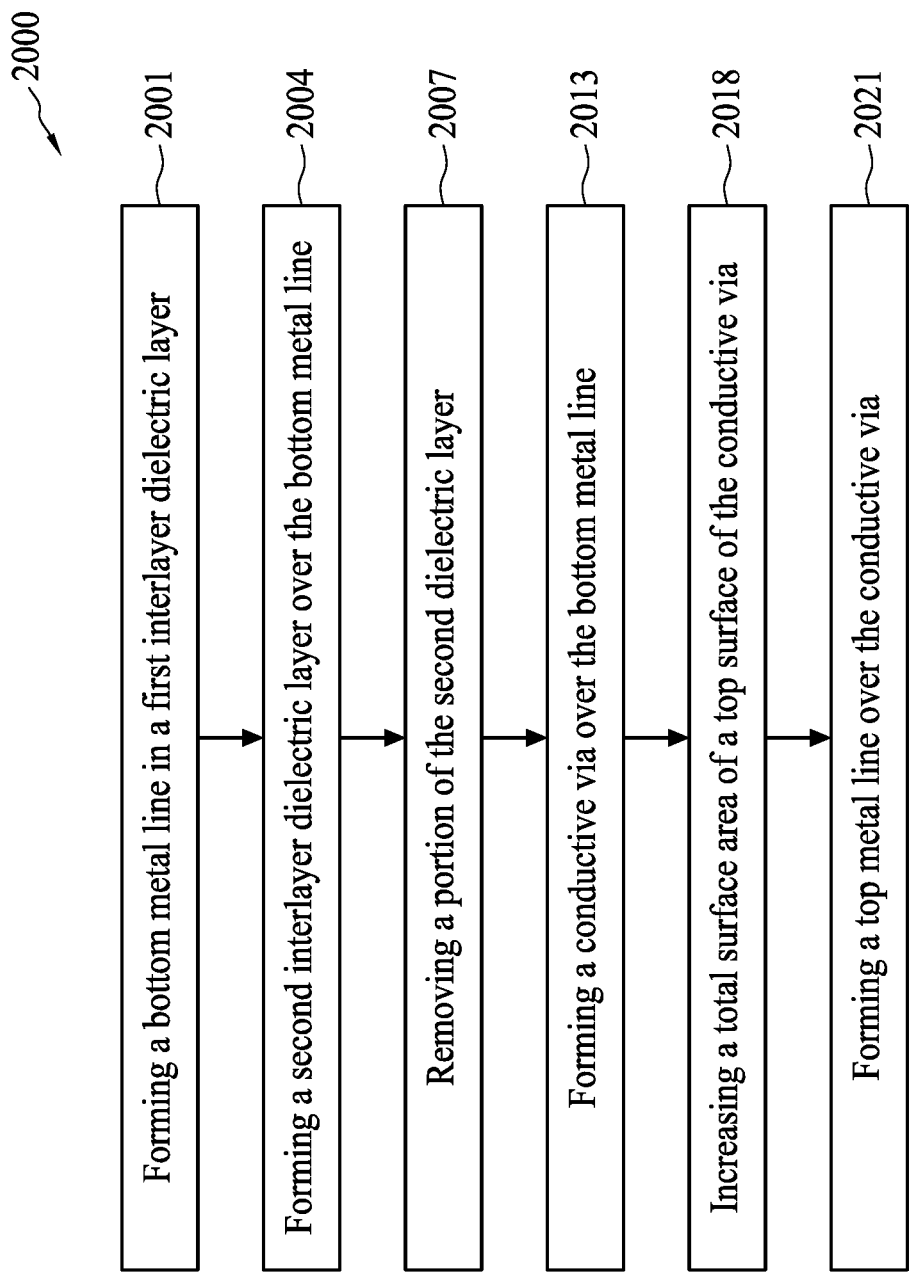
FIG. 3B shows a flow chart representing method of fabricating an interconnect structure, in accordance with some embodiments of the present disclosure.

Referring to FIG. 3B, FIG. 3B shows a flow chart representing method of fabricating an interconnect structure, in accordance with some embodiments of the present disclosure. The method 2000 for fabricating an interconnect structure includes forming a bottom metal line in a first interlayer dielectric layer (operation 2001, which can be referred to FIG. 7A, FIG. 8A, FIG. 9A or FIG. 10A), forming a second interlayer dielectric layer over the bottom metal line (operation 2004, which can be referred to FIG. 7A, FIG. 8A, FIG. 9A or FIG. 10A), removing a portion of the second dielectric layer (operation 2007, which can be referred to FIG. 7A, FIG. 8A, FIG. 9A or FIG. 10A), forming a conductive via over the bottom metal line (operation 2013, which can be referred to FIG. 7B to 7C, FIG. 8B to 8C, FIG. 9B to 9B or FIG. 10B to 10C), increasing a total surface area of a top surface of the conductive via (operation 2018, which can be referred to FIG. 7E, FIG. 8E to 8F, FIG. 9D or FIG. 10F), and forming a top metal line over the conductive via (operation 2021, which can be referred to FIG. 7F, FIG. 8G, FIG. 9G or FIG. 10G).

FIG. 4A to FIG. 6I provides variations with regard to the configuration of the bottom metal line BM and the via V. FIG. 4A to FIG. 4E provides an embodiment of fabricating an interconnect structure 400 including bottom metal line BM1 and the via V1. FIG. 5A to FIG. 5E provides another embodiment of fabricating an interconnect structure 500 including bottom metal line BM2 and the via V2. FIG. 6A to FIG. 6I provides another embodiment of fabricating an interconnect structure 600 including bottom metal line BM3 and the via V3. Identical numerals marked in the present disclosure refer to identical or substantially identical components and these components would not be repeated again for brevity.

Figure 4A:
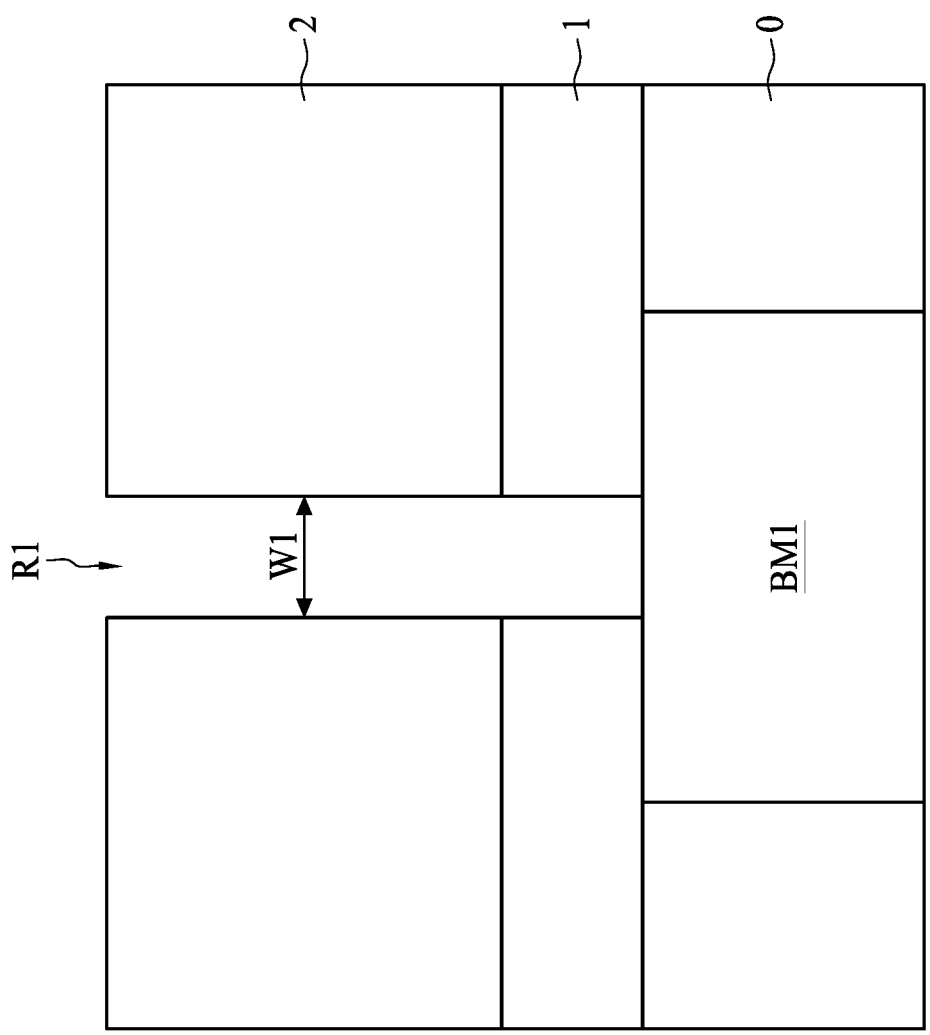
FIG. 4A to FIG. 4E are cross sectional views of an interconnect structure during intermediate stages of manufacturing operations, according to some embodiments of the present disclosure.

Referring to FIG. 4A, FIG. 4A is a cross sectional view of an interconnect structure during intermediate stages of manufacturing operations, according to some embodiments of the present disclosure. A bottom metal line BM1 including a first metal (which can be selected from the candidates discussed in FIG. 2E and the related descriptions above) is formed in a first interlayer dielectric (ILD) layer 0 over a substrate (not shown). As previously discussed, a material of the first metal may have a first type of primary crystalline structure, which can be BCC, HCP, or FCC. A first etch stop layer 1 is formed over the first ILD layer 0, and a second ILD layer 2 is formed over the first etch stop layer 1. A first recess R1 is formed to expose a top surface of the bottom metal line BM1, wherein the first recess has a first width W1. In some embodiments, the first width W1 is less than 18 nm.

Figure 4B:
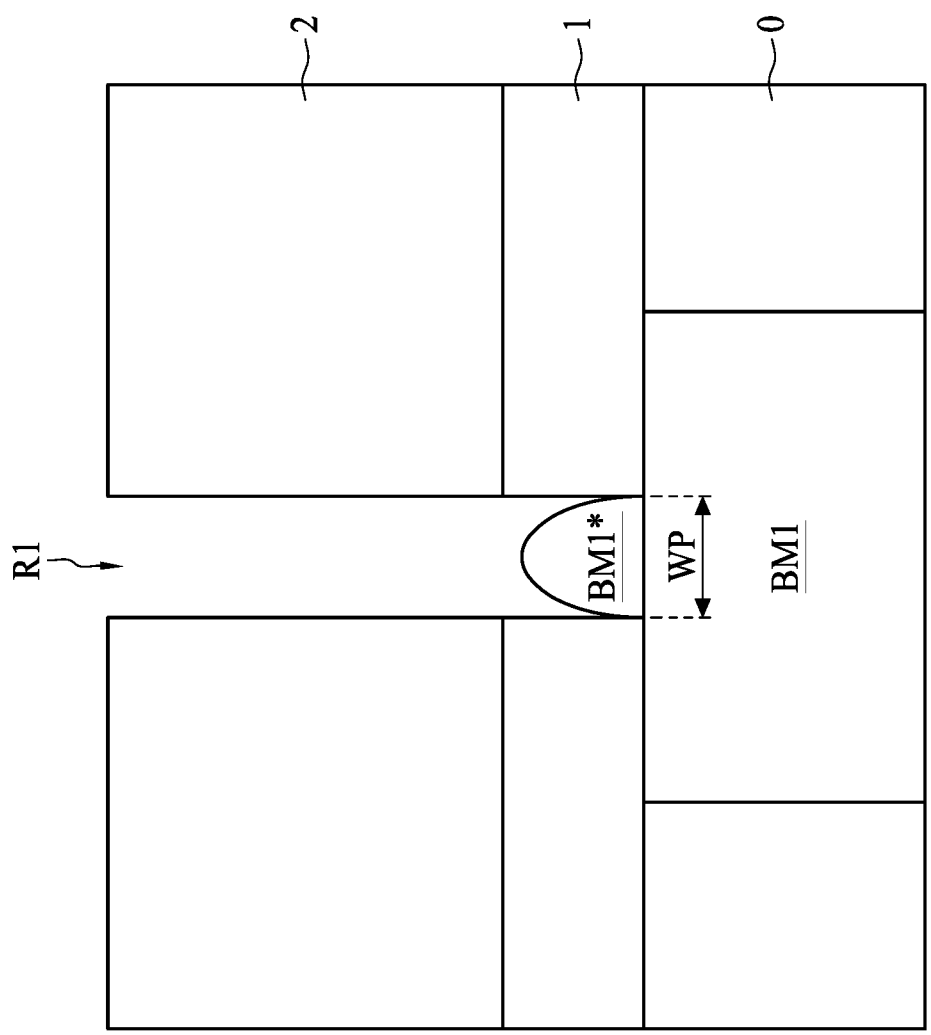

Referring to FIG. 4B, FIG. 4B is a cross sectional view of an interconnect structure during intermediate stages of manufacturing operations, according to some embodiments of the present disclosure. A protruding portion BM1* is formed by depositing a conductive material over the exposed surface of the bottom metal line BM1, wherein the protruding portion BM1* has a profile protruding away from the first ILD layer 0. A bottom width WP of the protruding portion is equal to or less than the first width W1 of the first recess R1. In some embodiments, a material of the protruding portion BM1* is identical with the first metal of the bottom metal line BM1. For example, in the case of the bottom metal line BM1 includes ruthenium (Ru), the protruding portion BM1* can also include ruthenium.

In some alternative embodiments, a material of the protruding portion BM1* is different from the first metal of the bottom metal line BM1 (in this alternative case, the material thereof is denoted as fourth metal). The fourth metal is selected to have the same type of primary crystalline structure with the first metal, thus the electron scattering can be inhibited due to lower lattice mismatch. For example, in the case of the bottom metal line BM1 includes ruthenium (Ru), the protruding portion BM1* can include rhenium (Re), cobalt (Co), or osmium (Os).

Figure 4C:
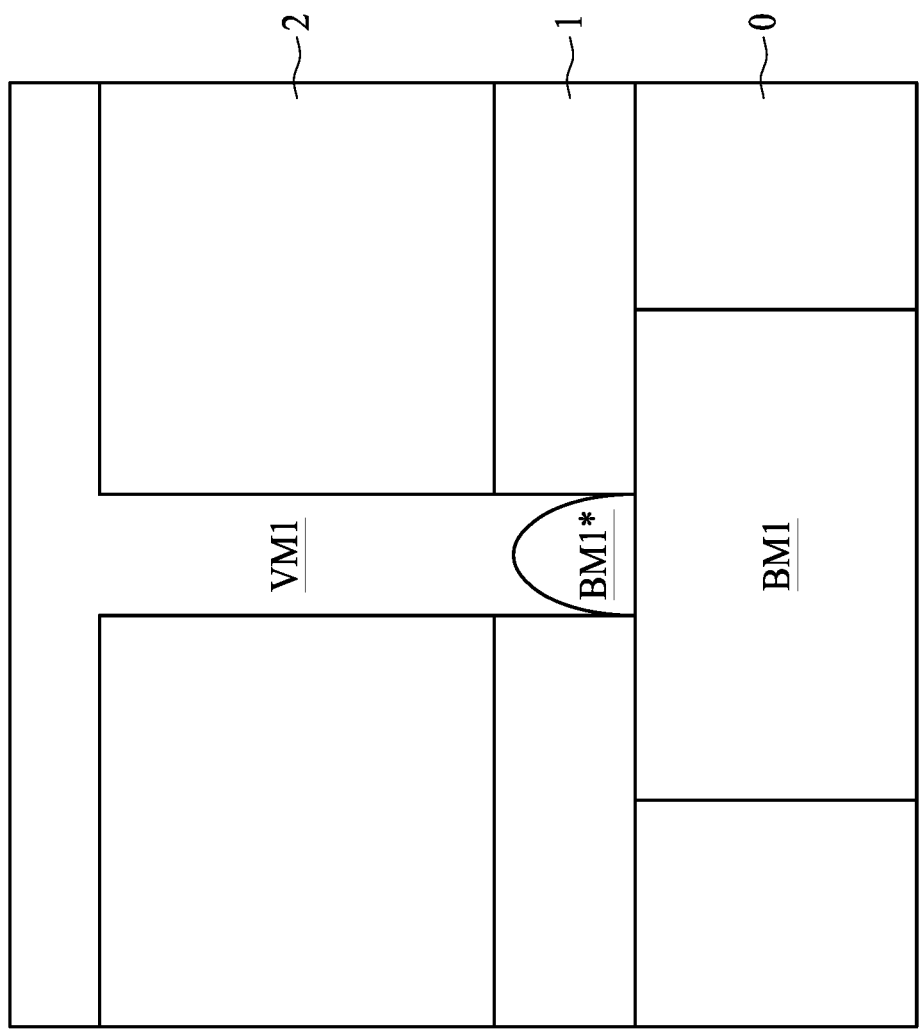

Referring to FIG. 4C, FIG. 4C is a cross sectional view of an interconnect structure during intermediate stages of manufacturing operations, according to some embodiments of the present disclosure. A conductive material layer VM1 including a second metal (which can be selected from the candidates discussed in FIG. 2E and the related descriptions above) is formed over the second ILD layer 2 and in the first recess R1 (shown in FIG. 4B) to cover the protruding portion BM1*. The second metal has the first type of primary crystalline structure. In some embodiments, the second metal is different from the first metal of the bottom metal line BM1. In the case of the fourth metal of the protruding portion BM1* is different from the first metal, the second metal is selected to be different from the first metal and the fourth metal. For one of the examples, the first metal is ruthenium (Ru), the fourth metal is osmium (Os), and the second metal is cobalt (Co). In some other alternative embodiments, the second metal can be identical with the first metal, for example, both of the first metal and the second metal can be cobalt.

Figure 4D:
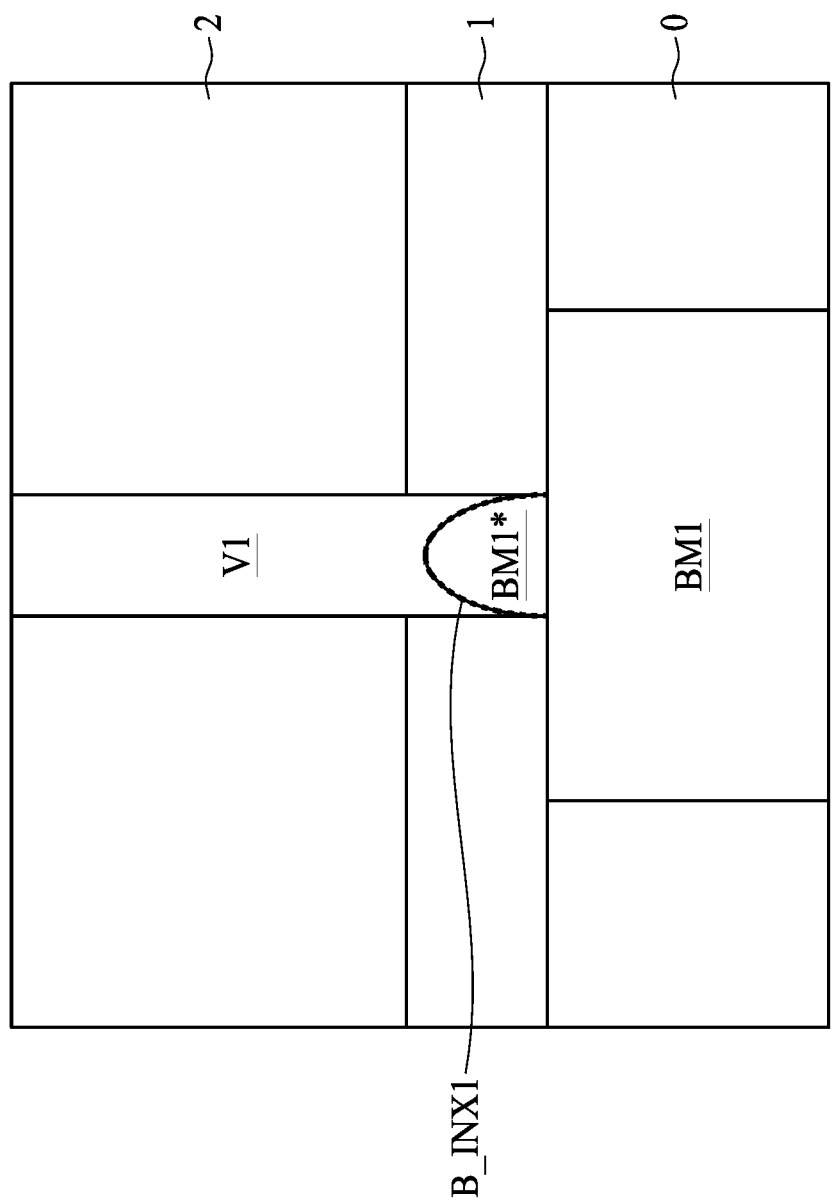

Referring to FIG. 4D, FIG. 4D is a cross sectional view of an interconnect structure during intermediate stages of manufacturing operations, according to some embodiments of the present disclosure. A planarization operation, such as chemical mechanical planarization (CMP), is performed to remove excessive portion of the conductive material layer VM1 over the second ILD layer 2, thereby the via V1 is formed. An intermixing interface B_INX1 is between the via V1 and the protruding portion BM1*. A total surface area of the intermixing interface B_INX1 is greater than a cross sectional surface area of a bottom of the first recess R1 (shown in in FIG. 4A). A bottom surface of the via V1 has a concaved profile which concaves away from the bottom metal line BM1 and the first ILD layer 0.

It should be noted that, as previously discussed in FIG. 2A to FIG. 2G, by specifically selecting the materials of the first metal and the second metal (and/or fourth metal if it presents), the intermixing effect may occur at the interface between the via V1 and the protruding portion BM1*.

Figure 4E:
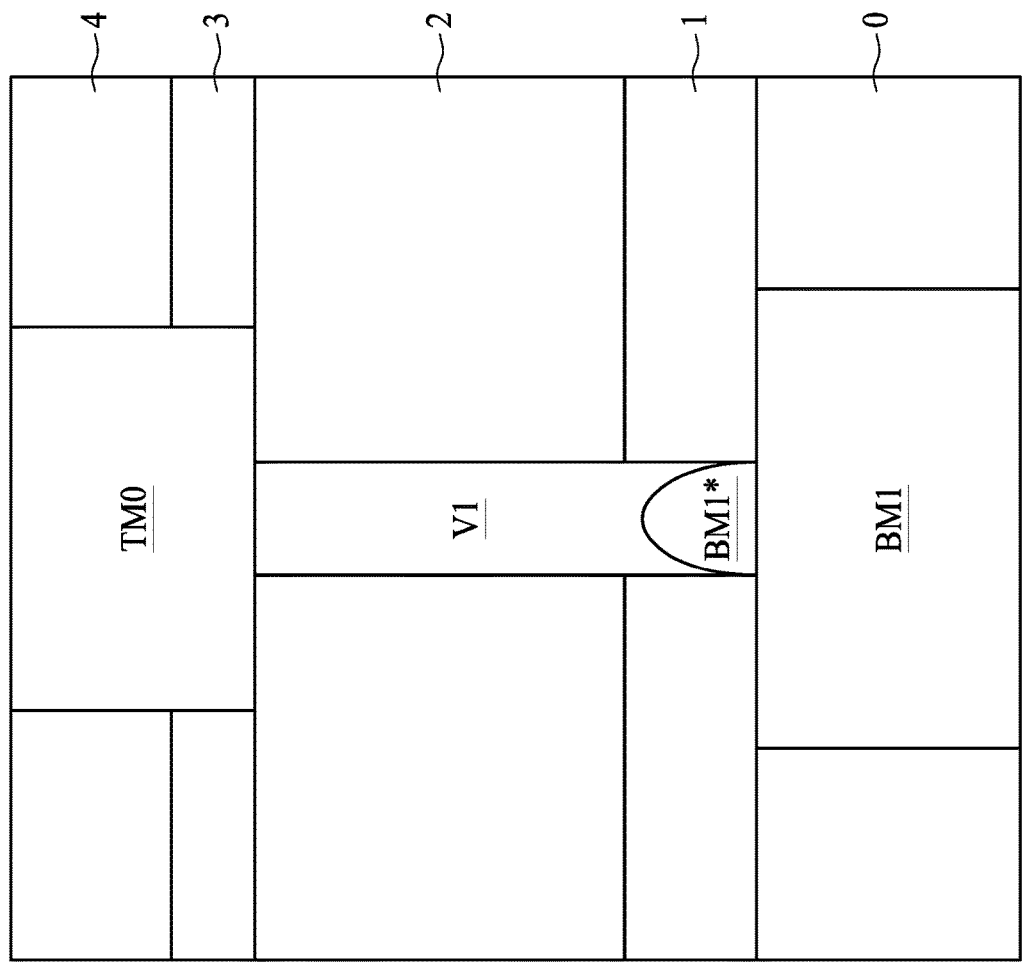

Referring to FIG. 4E, FIG. 4E is a cross sectional view of an interconnect structure during intermediate stages of manufacturing operations, according to some embodiments of the present disclosure. A second etch stop layer 3 is formed over the second ILD layer 2, and a third ILD layer 4 is formed over the second etch stop layer 3. (In some alternative embodiments, referring to FIG. 4A, the second etch stop layer 3 is formed prior to forming the first recess R1.) A portion of the second etch stop layer 3 and the third ILD layer 4 is removed, and a top metal line TM0 is formed over and electrically connected to the via V1 (excessive portion of the top metal line TM0 may be removed by planarization operation), thereby the interconnect structure 400 is formed. The third metal of the top metal line TM0 may be selected to have the first type of primary crystalline structure, wherein the selection can be based on the look up table in FIG. 2E. In some of the embodiments, the first metal and/or the third metal is diffused into the via V1, or the second metal may be diffused into the bottom metal line BM1 and/or top metal line TM0, if one of the first, second, or third metal has lower melting points. Such distribution of material may be observed by analysis techniques, such as Energy-dispersive X-ray spectroscopy (EDX), which may be similar to the result presented in FIG. 2G.

Referring to FIG. 5A, FIG. 5A is a cross sectional view of an interconnect structure during intermediate stages of manufacturing operations, according to some embodiments of the present disclosure. A bottom metal line BM2 including a first metal (which can be selected from the candidates discussed in FIG. 2E and the related descriptions above) is formed in a first interlayer dielectric (ILD) layer 0 over a substrate (not shown). As previously discussed, a material of the first metal may have a first type of primary crystalline structure, which can be BCC, HCP, or FCC. A first etch stop layer 1 is formed over the first ILD layer 0, and a second ILD layer 2 is formed over the first etch stop layer 1. A first recess R2 is formed to expose a top surface of the bottom metal line BM2, wherein the first recess R2 has a first width W2. In some embodiments, the first width W2 is less than 18 nm.

Figure 5B:
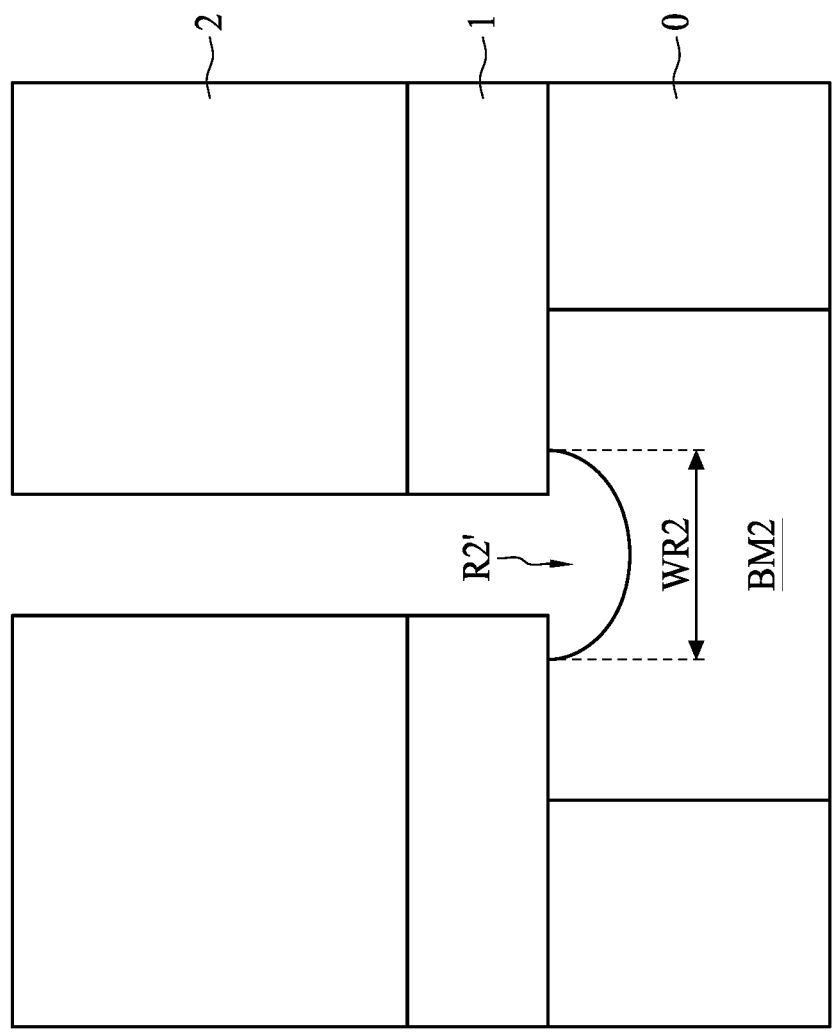

Referring to FIG. 5B, FIG. 5B is a cross sectional view of an interconnect structure during intermediate stages of manufacturing operations, according to some embodiments of the present disclosure. An etching operation is performed to remove a portion of the bottom metal line BM2 from the exposed surface and thereby forming a second recess R2'. In some of the embodiments, a second width WR2 at a top of the second recess R2' is greater than the first width W2.

Figure 5C:
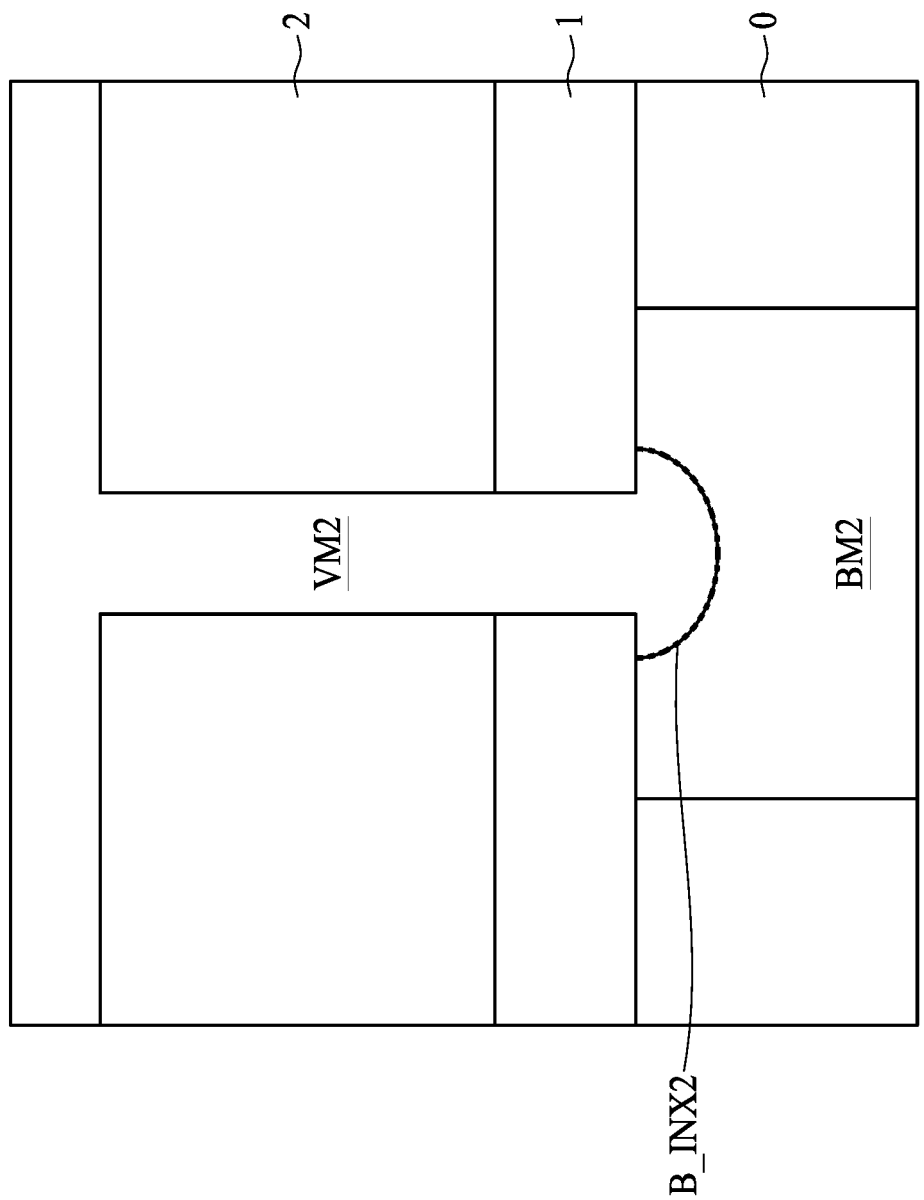

Referring to FIG. 5C, FIG. 5C is a cross sectional view of an interconnect structure during intermediate stages of manufacturing operations, according to some embodiments of the present disclosure. A conductive material layer VM2 including a second metal (which can be selected from the candidates discussed in FIG. 2E and the related descriptions above) is formed over the second ILD layer 2, in the first recess R2 and in the second recess R2' (shown in FIG. 5B). The second metal has the first type of primary crystalline structure. In some of the embodiments, the second metal is different from the first metal of the bottom metal line BM2. For one of the examples, the first metal is ruthenium (Ru), and the second metal is cobalt (Co).

Referring to FIG. 5D, FIG. 5D is a cross sectional view of an interconnect structure during intermediate stages of manufacturing operations, according to some embodiments of the present disclosure. A planarization operation, such as CMP, is performed to remove excessive portion of the conductive material layer VM2 over the second ILD layer 2, thereby the via V2 is formed. An intermixing interface B_INX2 is between the via V2 and the bottom metal line BM2. A total surface area of a top surface of the intermixing interface B_INX2 is greater than a cross sectional surface area of a bottom of the first recess R1 (shown in in FIG. 5A) at the exposed top surface of the bottom metal line BM2. The via V2 has a bottom portion V2* which protrudes toward the bottom metal line BM2. In some of the embodiments, a top surface of the bottom portion V2* may be in contact with a bottom surface of the first etch stop layer 1.

Figure 5E:
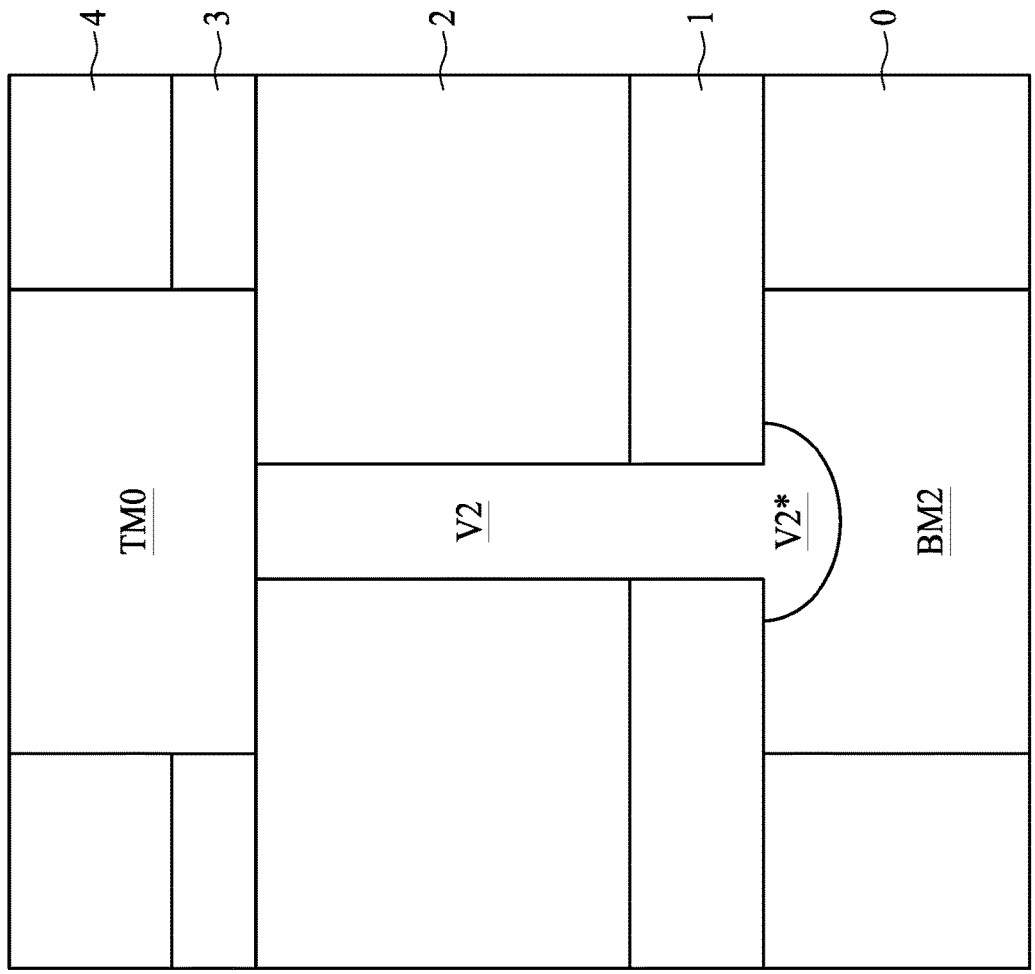

Referring to FIG. 5E, FIG. 5E is a cross sectional view of an interconnect structure during intermediate stages of manufacturing operations, according to some embodiments of the present disclosure. A second etch stop layer 3 is formed over the second ILD layer 2, and a third ILD layer 4 is formed over the second etch stop layer 3. (In some alternative embodiments, referring to FIG. 5A, the second etch stop layer 3 is formed prior to forming the first recess R2.) A portion of the second etch stop layer 3 and the third ILD layer 4 is removed, and a top metal line TM0 is formed over and electrically connected to the via V2 (excessive portion of the top metal line TM0 may be removed by planarization operation), thereby the interconnect structure 500 is formed. The third metal of the top metal line TM0 may be selected to have the first type of primary crystalline structure, wherein the selection can be based on the look up table in FIG. 2E. In some of the embodiments, the first metal and/or the third metal is diffused into the via V2, or the second metal may be diffused into the bottom metal line BM2 and/or top metal line TM0, if one of the first, second, or third metal has lower melting points. Such distribution of material may be observed by analysis techniques, such as Energy-dispersive X-ray spectroscopy (EDX), which may be similar to the result presented in FIG. 2G.

Figure 6A:
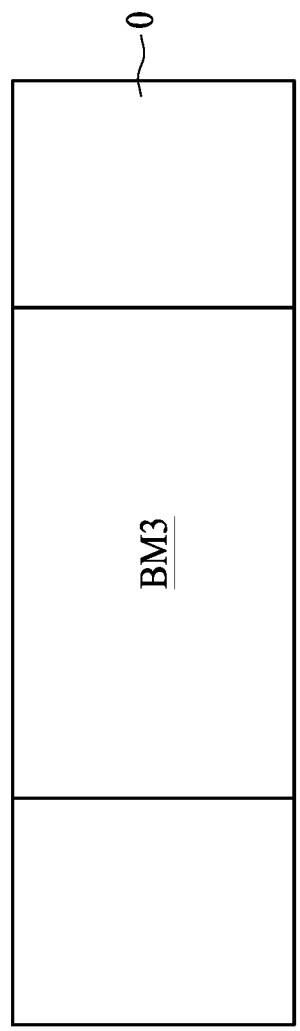
FIG. 6A to FIG. 6I are cross sectional views of an interconnect structure during intermediate stages of manufacturing operations, according to some embodiments of the present disclosure.

Referring to FIG. 6A, FIG. 6A is a cross sectional view of an interconnect structure during intermediate stages of manufacturing operations, according to some embodiments of the present disclosure. A bottom metal line BM3 including a first metal (which can be selected from the candidates discussed in FIG. 2E and the related descriptions above) is formed in a first ILD layer 0 over a substrate (not shown). As previously discussed, a material of the first metal may have a first type of primary crystalline structure, which can be BCC, HCP, or FCC.

Figure 6B:
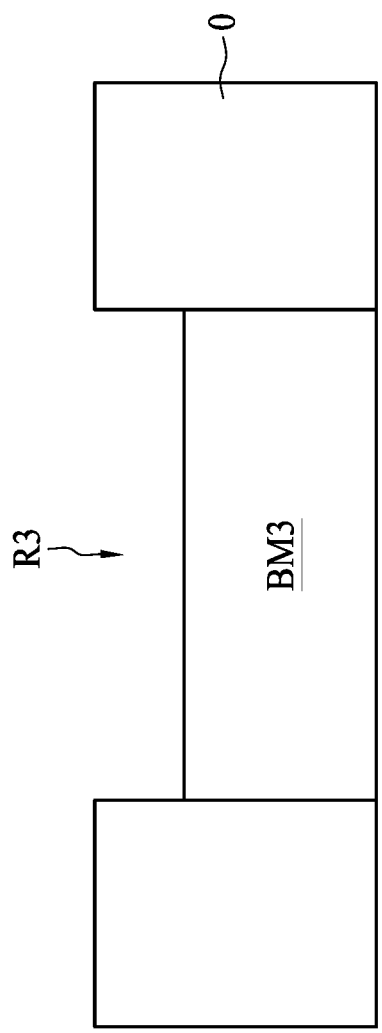

Referring to FIG. 6B, FIG. 6B is a cross sectional view of an interconnect structure during intermediate stages of manufacturing operations, according to some embodiments of the present disclosure. A top portion of the bottom metal line BM3 is recessed back to form a first recess R3. In some embodiments, a sidewall of the first ILD layer 0 is exposed.

Figure 6C:
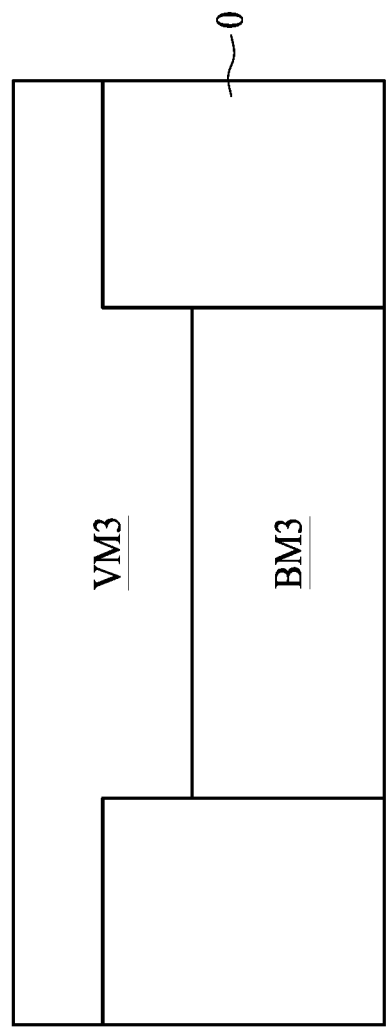

Referring to FIG. 6C, FIG. 6C is a cross sectional view of an interconnect structure during intermediate stages of manufacturing operations, according to some embodiments of the present disclosure. A conductive material layer VM3 including a second metal (which can be selected from the candidates discussed in FIG. 2E and the related descriptions above) is formed over the first ILD layer 0 and in the first recess R3 to cover the exposed top surface of the bottom metal line BM3.

Figure 6D:
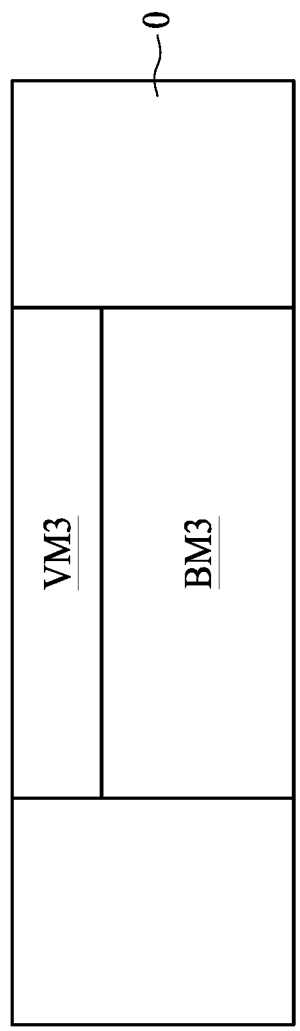

Referring to FIG. 6D, FIG. 6D is a cross sectional view of an interconnect structure during intermediate stages of manufacturing operations, according to some embodiments of the present disclosure. A planarization operation, such as CMP, is performed to remove excessive portion of the conductive material layer VM3 over the first ILD layer 0. A top surface of the remaining conductive material layer VM3 is coplanar with a top surface of the remaining first ILD layer 0.

Figure 6E:
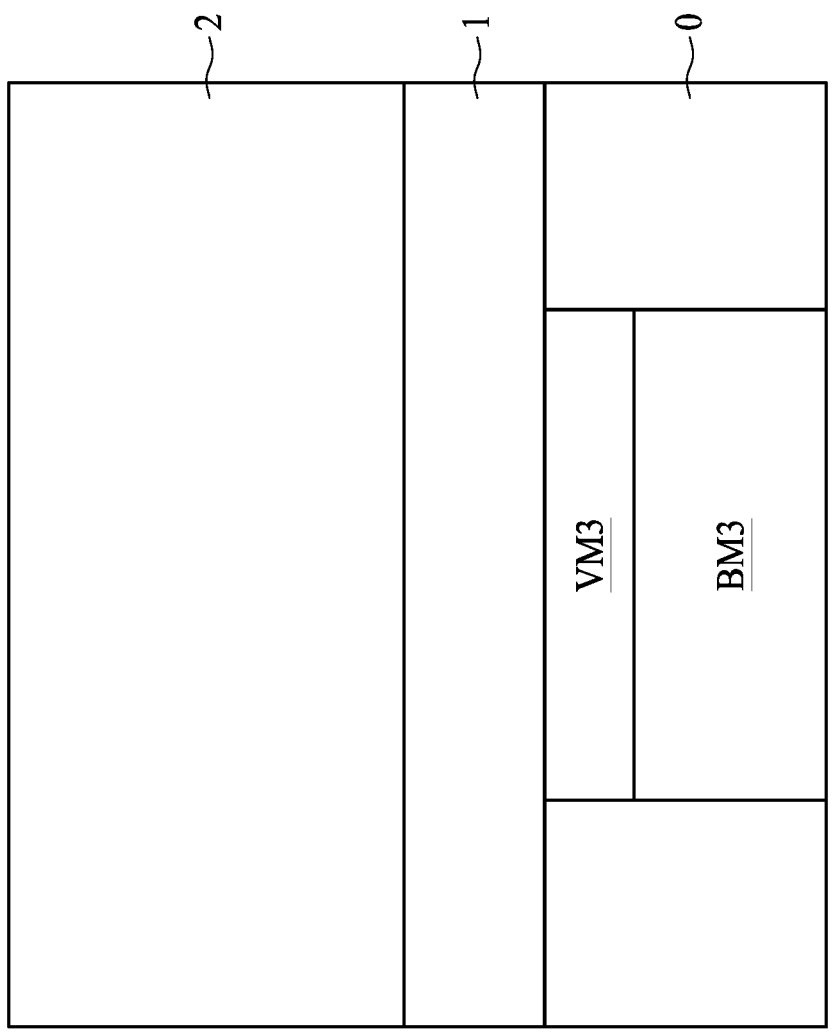
Figure 6F:
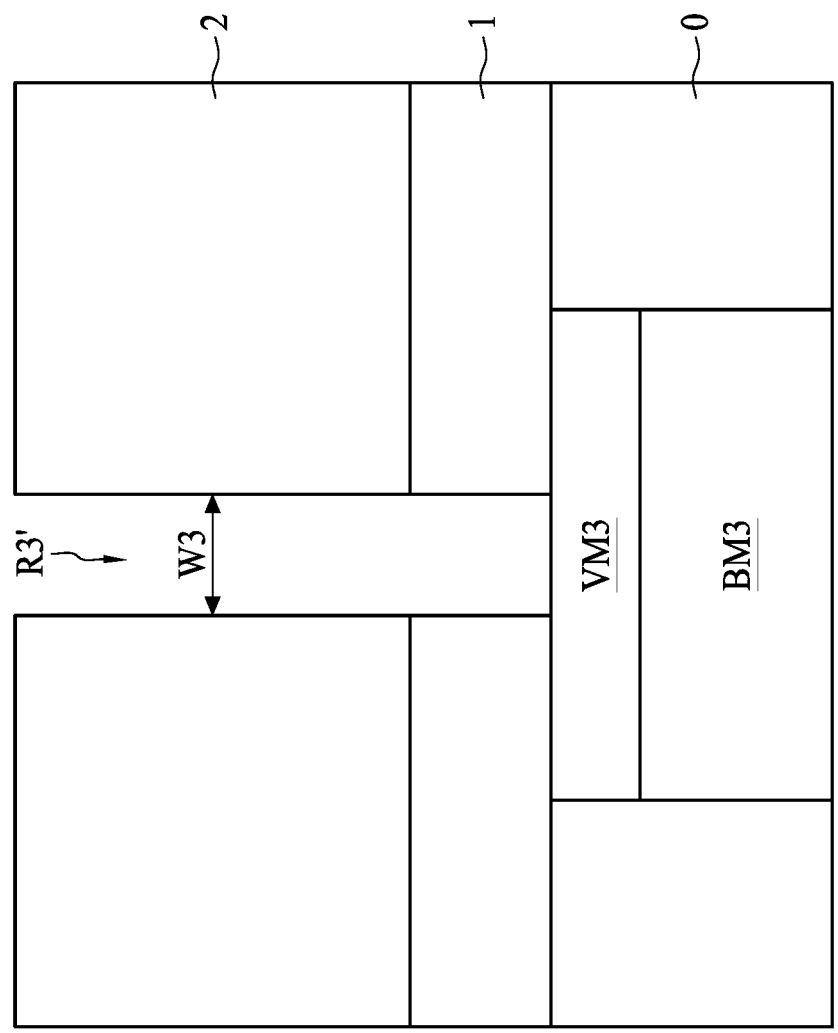

Referring to FIG. 6E, FIG. 6E is a cross sectional view of an interconnect structure during intermediate stages of manufacturing operations, according to some embodiments of the present disclosure. A first etch stop layer 1 is formed over the first ILD layer 0 and the remaining conductive material layer VM3, and a second ILD layer 2 is formed over the first etch stop layer 1. Referring to FIG. 6F, FIG. 6F is a cross sectional view of an interconnect structure during intermediate stages of manufacturing operations, according to some embodiments of the present disclosure. A second recess R3' is formed to expose a top surface of the bottom metal line BM3, wherein the second recess R3' has a first width W3. In some embodiments, the first width W3 is less than 18 nm.

Figure 6G:
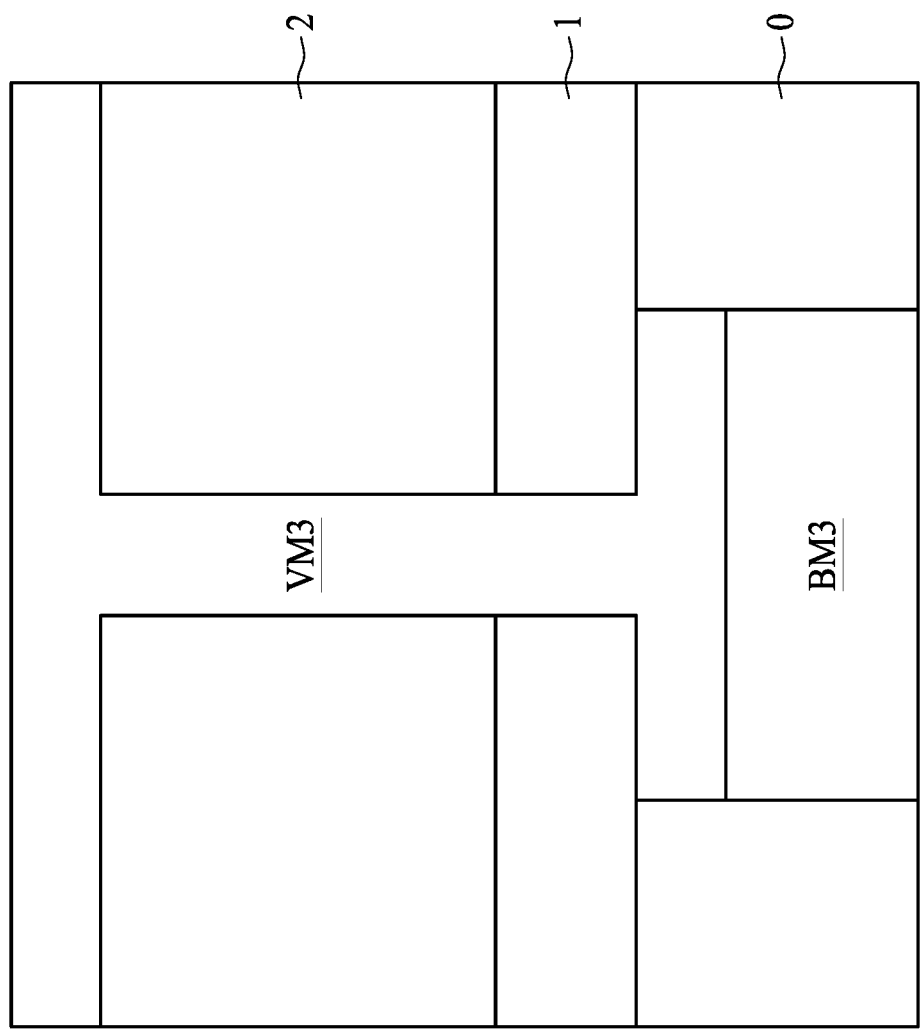

Referring to FIG. 6G, FIG. 6G is a cross sectional view of an interconnect structure during intermediate stages of manufacturing operations, according to some embodiments of the present disclosure. The conductive material layer VM3 is formed over the second ILD layer 2 and in the second recess R3' (shown in FIG. 6F).

Figure 6H:
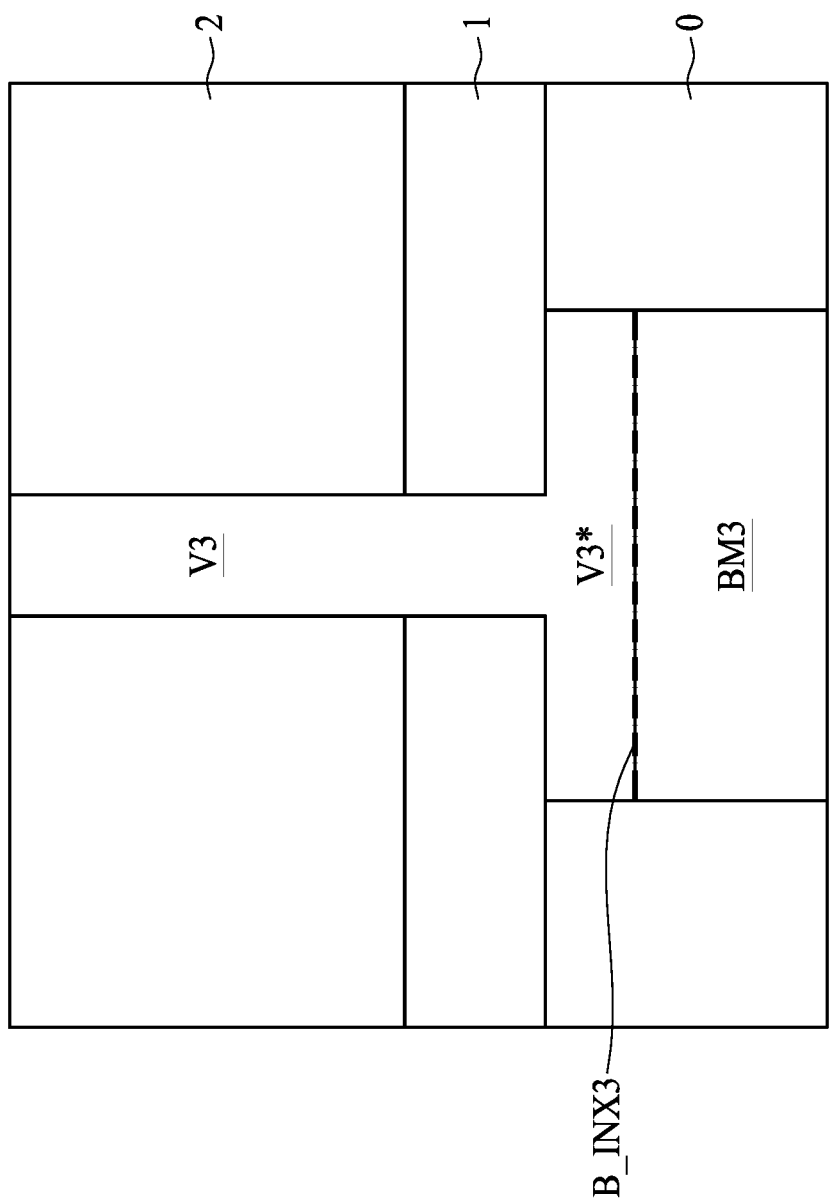

Referring to FIG. 6H, FIG. 6H is a cross sectional view of an interconnect structure during intermediate stages of manufacturing operations, according to some embodiments of the present disclosure. A planarization operation, such as CMP, is performed to remove excessive portion of the conductive material layer VM3 over the second ILD layer 2, thereby the via V3 is formed. The via V3 has a bottom portion V3* extending under a bottom surface of the first etch stop layer 1. In some of the embodiments, a top surface of the bottom portion V3* may be in contact with a bottom surface of the first etch stop layer 1. An intermixing interface B_INX3 is between the bottom portion V3* of the via V3 and the bottom metal line BM3. The intermixing interface B_INX3 is below a top surface of the first ILD layer 0. A total surface area of the intermixing interface B_INX3 is greater than a cross sectional surface area of a bottom of the second recess R3' (shown in in FIG. 6F).

Figure 6I:
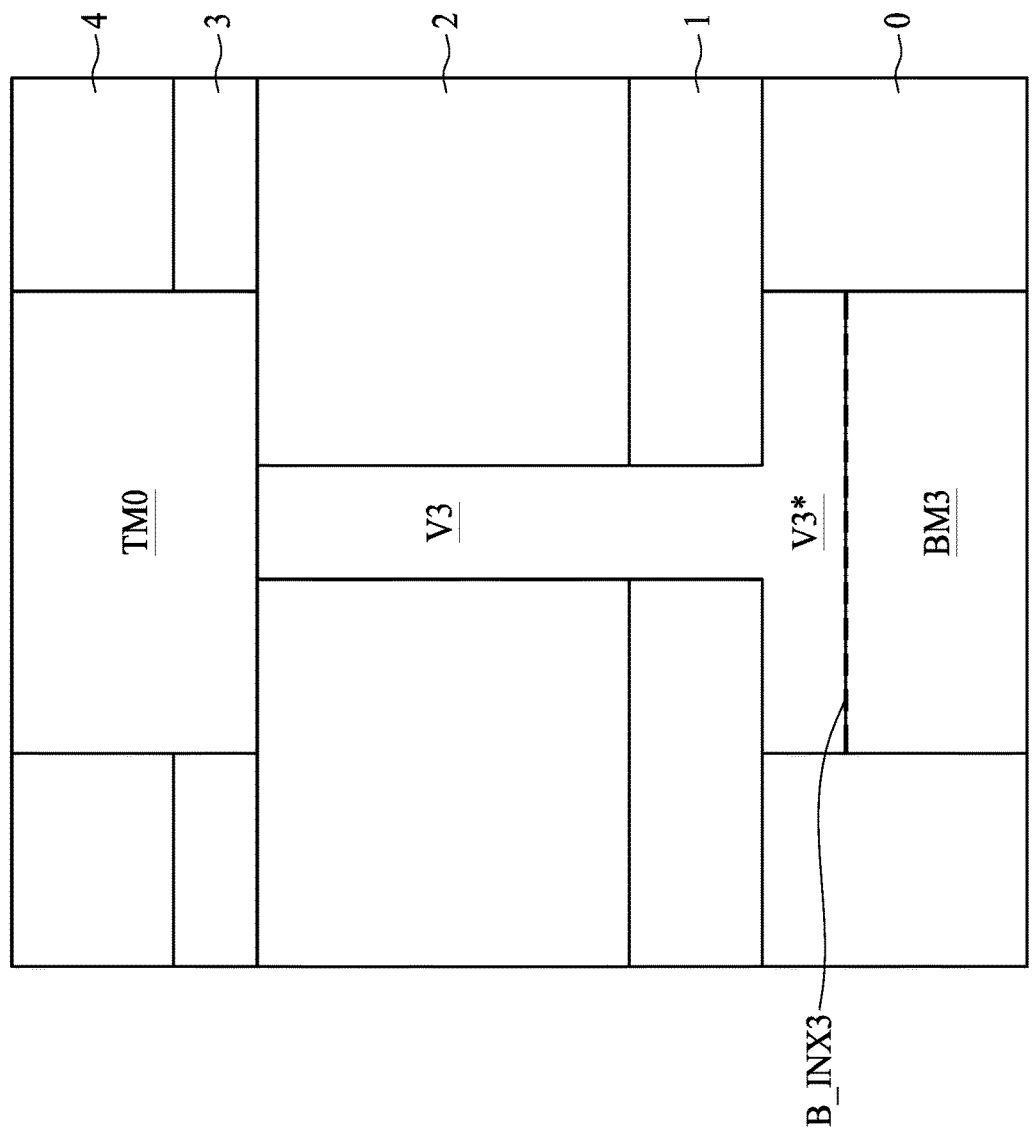

Referring to FIG. 6I, FIG. 6I is a cross sectional view of an interconnect structure during intermediate stages of manufacturing operations, according to some embodiments of the present disclosure. A second etch stop layer 3 is formed over the second ILD layer 2, and a third ILD layer 4 is formed over the second etch stop layer 3. (In some alternative embodiments, referring to FIG. 6E to FIG. 6F, the second etch stop layer 3 is formed prior to forming the first recess R3'.) A portion of the second etch stop layer 3 and the third ILD layer 4 is removed, and a top metal line TM0 is formed over and electrically connected to the via V3 (excessive portion of the top metal line TM0 may be removed by planarization operation), thereby the interconnect structure 600 is formed. The third metal of the top metal line TM0 may be selected to have the first type of primary crystalline structure, wherein the selection can be based on the look up table in FIG. 2E.

In some of the embodiments, the first metal and/or the third metal is diffused into the via V3, or the second metal may be diffused into the bottom metal line BM3 and/or top metal line TM0, if one of the first, second, or third metal has lower melting points. Such distribution of material may be observed by analysis techniques, such as Energy-dispersive X-ray spectroscopy (EDX), which may be similar to the result presented in FIG. 2G.

FIG. 7A to FIG. 10G provides variations with regard to the configuration of the via V and the top metal line TM. FIG. 7A to FIG. 7F provides an embodiment of fabricating an interconnect structure 700 including the via V4 and the top metal line TM4. FIG. 8A to FIG. 8G provides an embodiment of fabricating an interconnect structure 800 including the via V5 and the top metal line TM5. FIG. 9A to FIG. 9G provides an embodiment of fabricating an interconnect structure 900 including the via V6 and the top metal line TM6. FIG. 10A to FIG. 10G provides an embodiment of fabricating an interconnect structure 990 including the via V7 and the top metal line TM7. Identical numerals marked in the present disclosure refer to identical or substantially identical components and these components would not be repeated again for brevity.

Figure 7A:
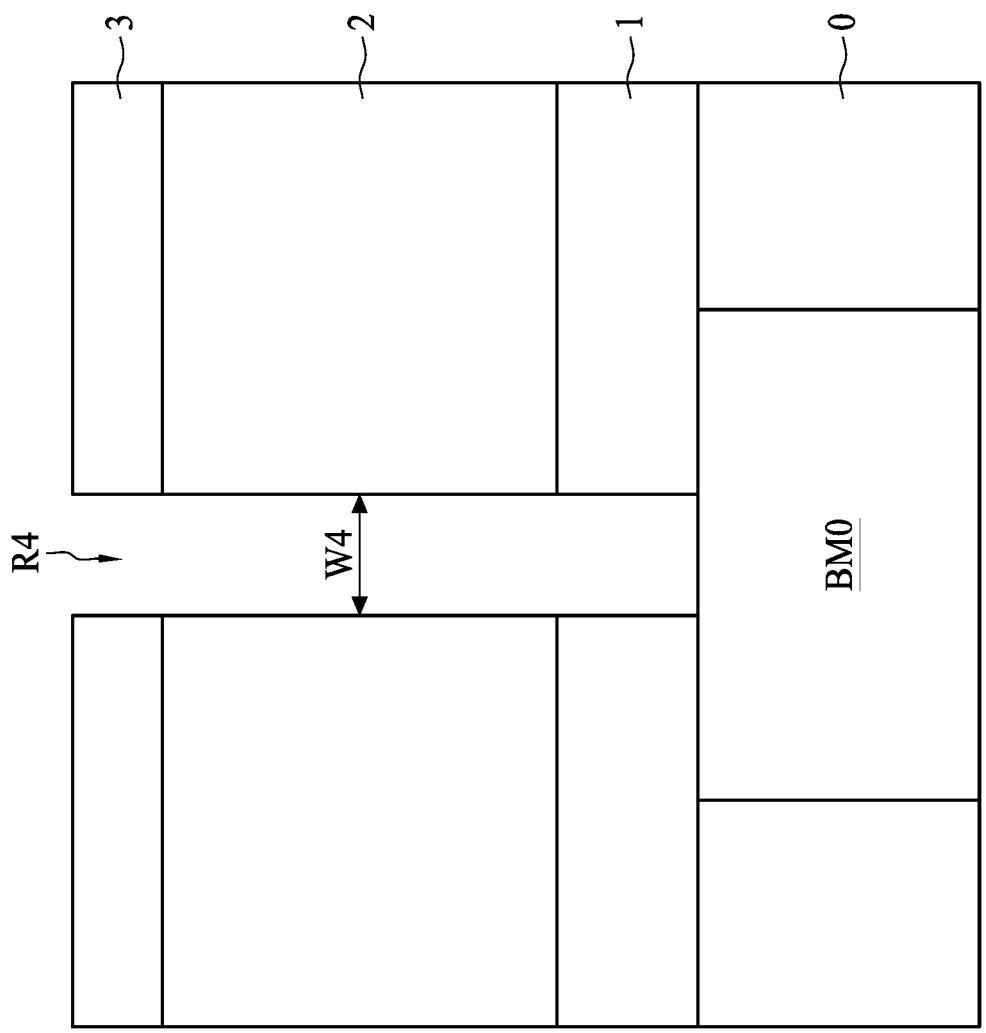
FIG. 7A to FIG. 7F are cross sectional views of an interconnect structure during intermediate stages of manufacturing operations, according to some embodiments of the present disclosure.

Referring to FIG. 7A, FIG. 7A is a cross sectional view of an interconnect structure during intermediate stages of manufacturing operations, according to some embodiments of the present disclosure. A bottom metal line BM0 including a first metal (which can be selected from the candidates discussed in FIG. 2E and the related descriptions above) is formed in a first interlayer dielectric (ILD) layer 0 over a substrate (not shown). As previously discussed, a material of the first metal may have a first type of primary crystalline structure, which can be BCC, HCP, or FCC. A first etch stop layer 1 is formed over the first ILD layer 0, a second ILD layer 2 is formed over the first etch stop layer 1, and a second etch stop layer 3 is formed over the second ILD layer 2. A first recess R4 is formed to expose a top surface of the bottom metal line BM0, wherein the first recess has a first width W4. In some embodiments, the first width W4 is less than 18 nm.

Figure 7B:
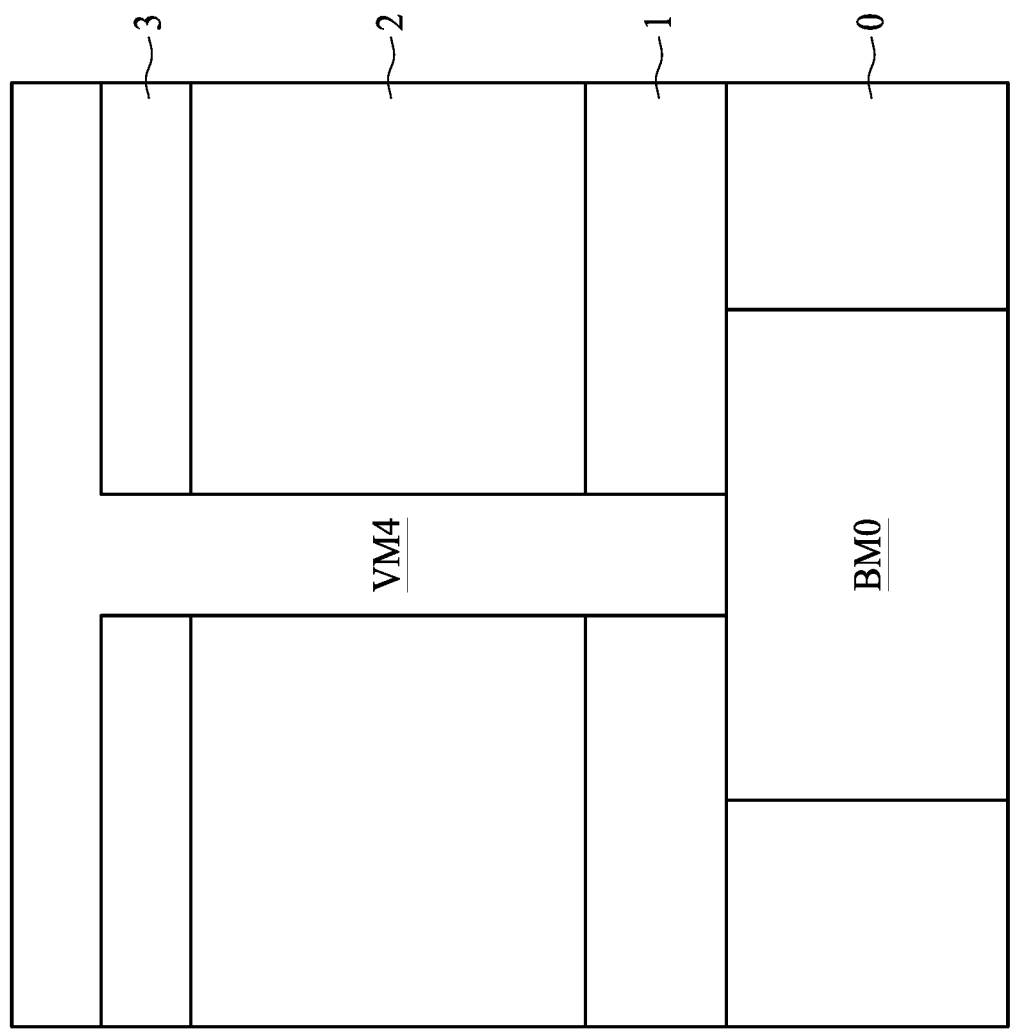
Figure 7C:
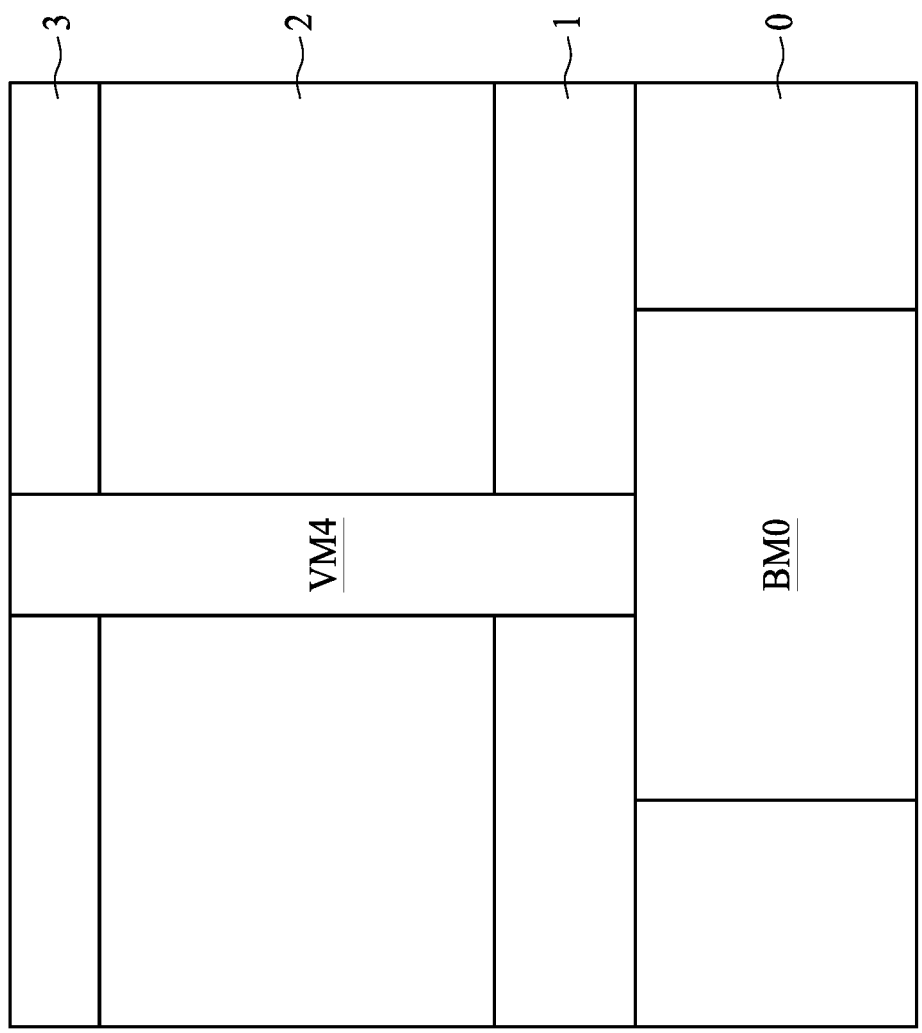
Figure 7D:
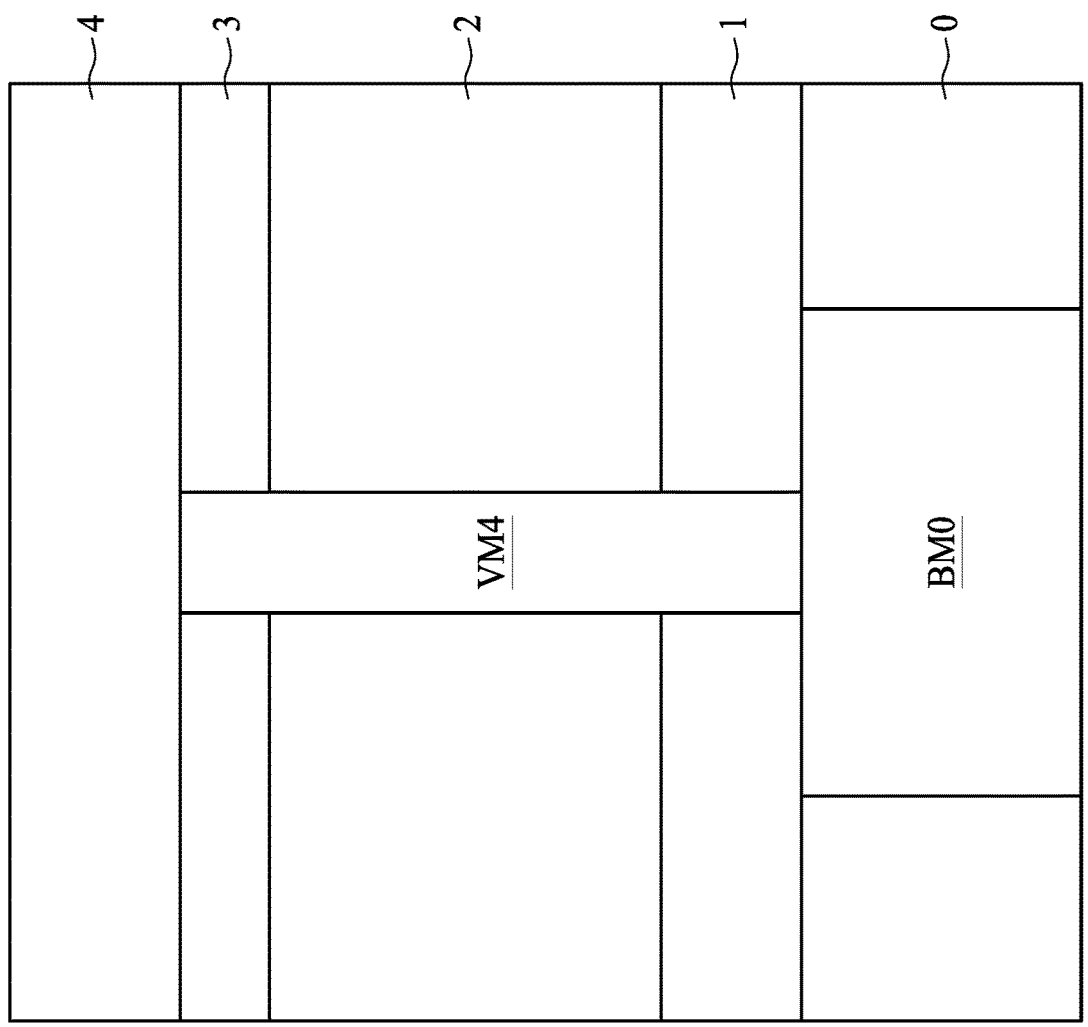

Referring to FIG. 7B, FIG. 7B is a cross sectional view of an interconnect structure during intermediate stages of manufacturing operations, according to some embodiments of the present disclosure. A conductive material layer VM4 including a second metal (which can be selected from the candidates discussed in FIG. 2E and the related descriptions above) is formed in the first recess R4 (shown in FIG. 7A) and over the second etch stop layer 3. Referring to FIG. 7C, FIG. 7C is a cross sectional view of an interconnect structure during intermediate stages of manufacturing operations, according to some embodiments of the present disclosure. A planarization operation, such as CMP, is performed to remove excessive portion of the conductive material layer VM4 over the second etch stop layer 3. A top surface of the remaining conductive material layer VM4 is coplanar with a top surface of the remaining second etch stop layer 3. Referring to FIG. 7D, FIG. 7D is a cross sectional view of an interconnect structure during intermediate stages of manufacturing operations, according to some embodiments of the present disclosure. A third ILD layer 4 is formed over the second etch stop layer 3.

Figure 7E:
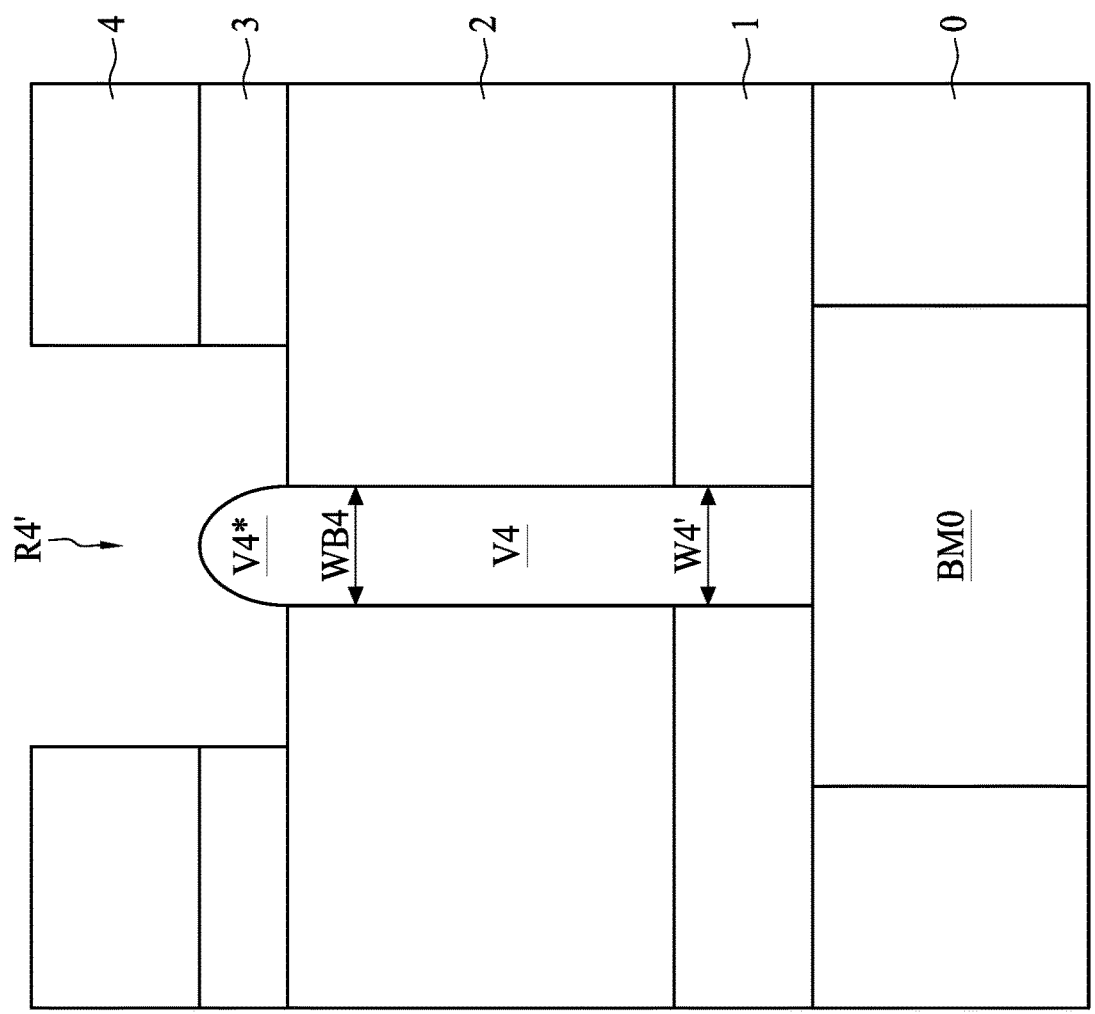

Referring to FIG. 7E, FIG. 7E is a cross sectional view of an interconnect structure during intermediate stages of manufacturing operations, according to some embodiments of the present disclosure. An etching operation is performed to remove a portion of the third ILD layer 4, a portion of the second etch stop layer 3 and a top portion of the remaining conductive material layer VM4 to form a second recess R4', and thereby forming a via V4, which includes a top portion V4* tapering away from bottom metal line BM0, wherein the top portion V4* is exposed from the second etch stop layer 3. A bottom width WB4 of the top portion V4* is identical with or less than a width W4' of the via V4.

Figure 7F:
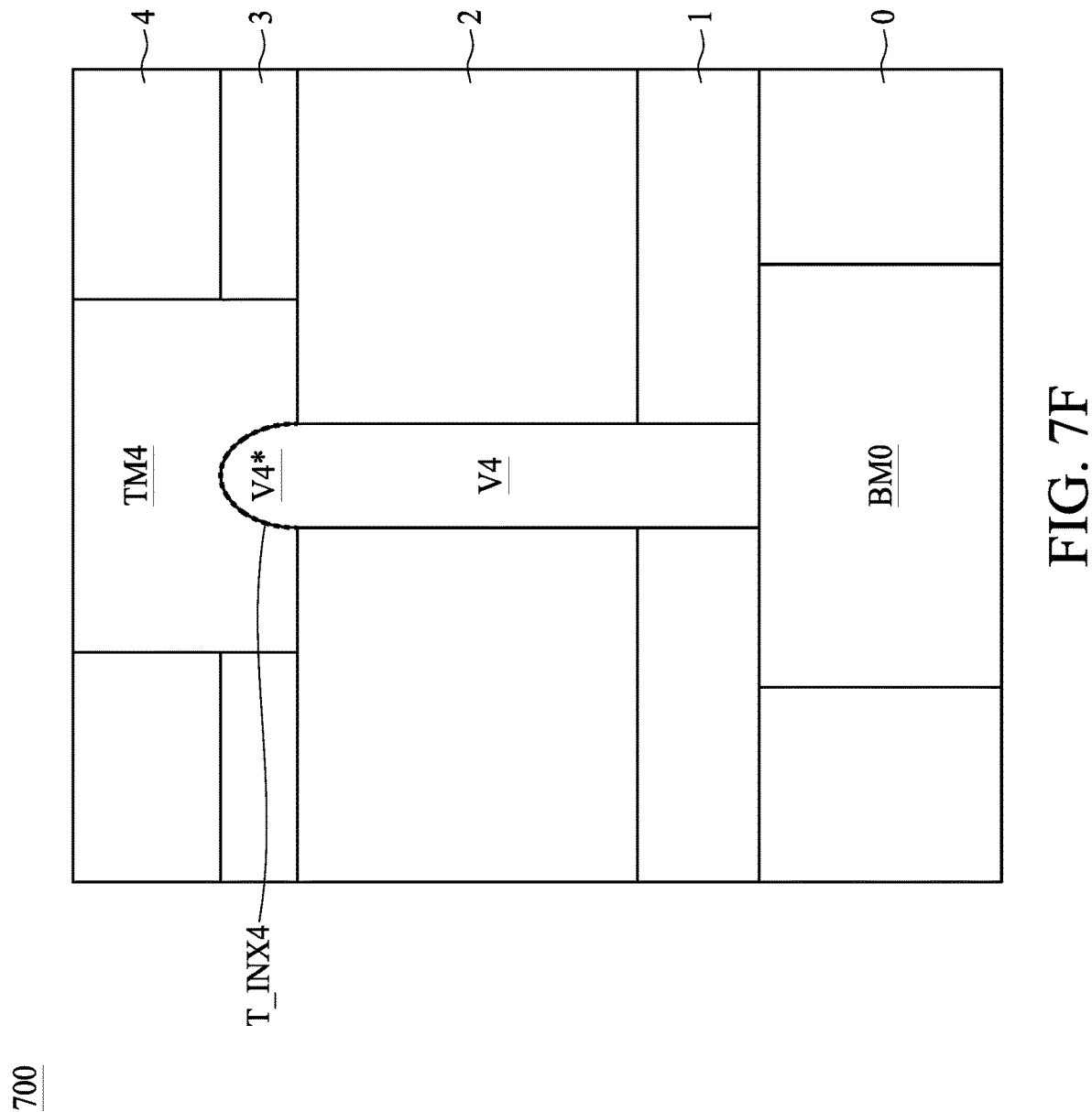

Referring to FIG. 7F, FIG. 7F is a cross sectional view of an interconnect structure during intermediate stages of manufacturing operations, according to some embodiments of the present disclosure. A top metal line TM4 is formed over and electrically connected to the via V4 (excessive portion of the top metal line TM4 may be removed by planarization operation), thereby the interconnect structure 700 is formed. An intermixing interface T_INX4 is between the top portion V4* of the via V4 and the top metal line TM4. A bottom surface of the top metal line TM4 concaves away from the bottom metal line BM0. A total surface area of a top surface of the intermixing interface T_INX4 is greater than a cross sectional surface area of a bottom of the first recess R4 (shown in in FIG. 7A) at the exposed top surface of the bottom metal line BM0. The third metal of the top metal line TM4 may be selected to have the first type of primary crystalline structure, wherein the selection can be based on the look up table in FIG. 2E. In some of the embodiments, the first metal and/or the third metal is diffused into the via V4, or the second metal may be diffused into the bottom metal line BM0 and/or top metal line TM4, if one of the first, second, or third metal has lower melting points. Such distribution of material may be observed by analysis techniques, such as Energy-dispersive X-ray spectroscopy (EDX), which may be similar to the result presented in FIG. 2G.

Figure 8A:
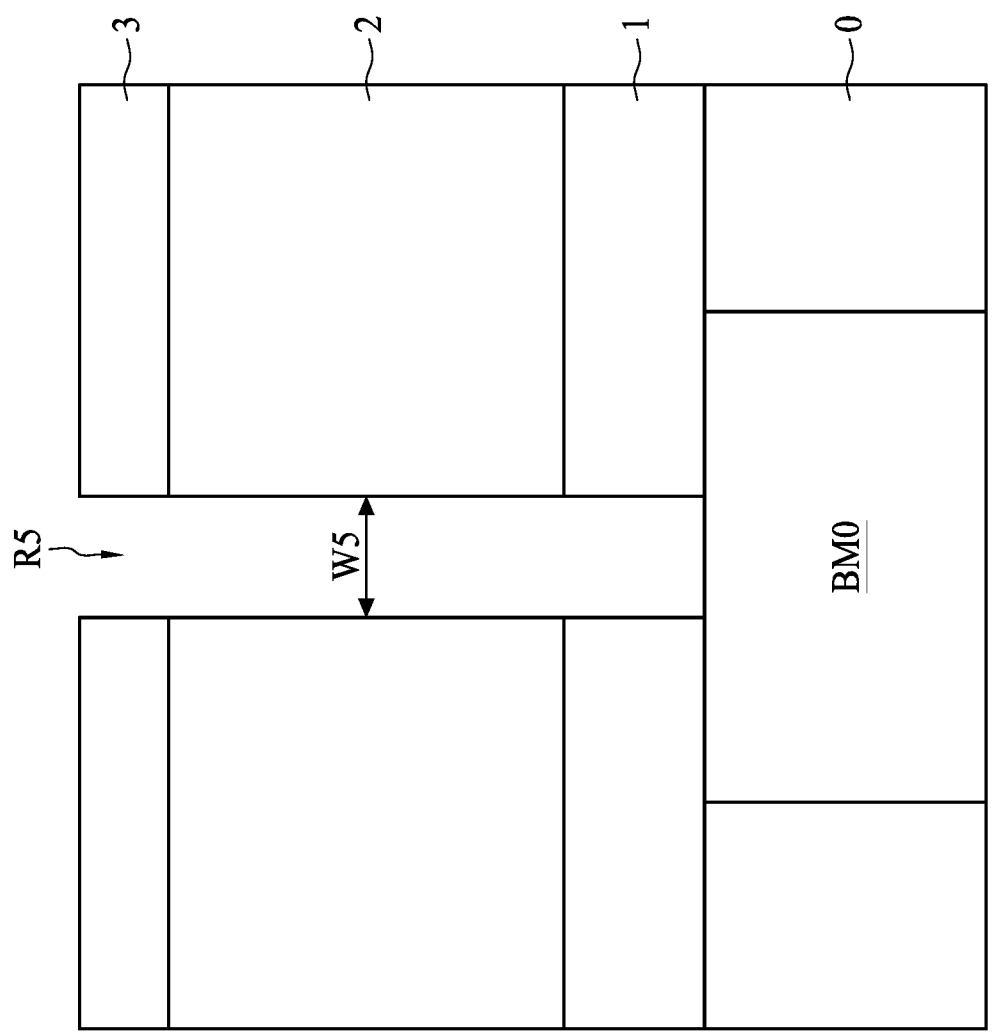
FIG. 8A to FIG. 8G are cross sectional views of an interconnect structure during intermediate stages of manufacturing operations, according to some embodiments of the present disclosure.

Referring to FIG. 8A, FIG. 8A is a cross sectional view of an interconnect structure during intermediate stages of manufacturing operations, according to some embodiments of the present disclosure. A bottom metal line BM0 including a first metal (which can be selected from the candidates discussed in FIG. 2E and the related descriptions above) is formed in a first interlayer dielectric (ILD) layer 0 over a substrate (not shown). As previously discussed, a material of the first metal may have a first type of primary crystalline structure, which can be BCC, HCP, or FCC. A first etch stop layer 1 is formed over the first ILD layer 0, a second ILD layer 2 is formed over the first etch stop layer 1, and a second etch stop layer 3 is formed over the second ILD layer 2. A first recess R5 is formed to expose a top surface of the bottom metal line BM0, wherein the first recess has a first width W5. In some embodiments, the first width W5 is less than 18 nm.

Figure 8B:
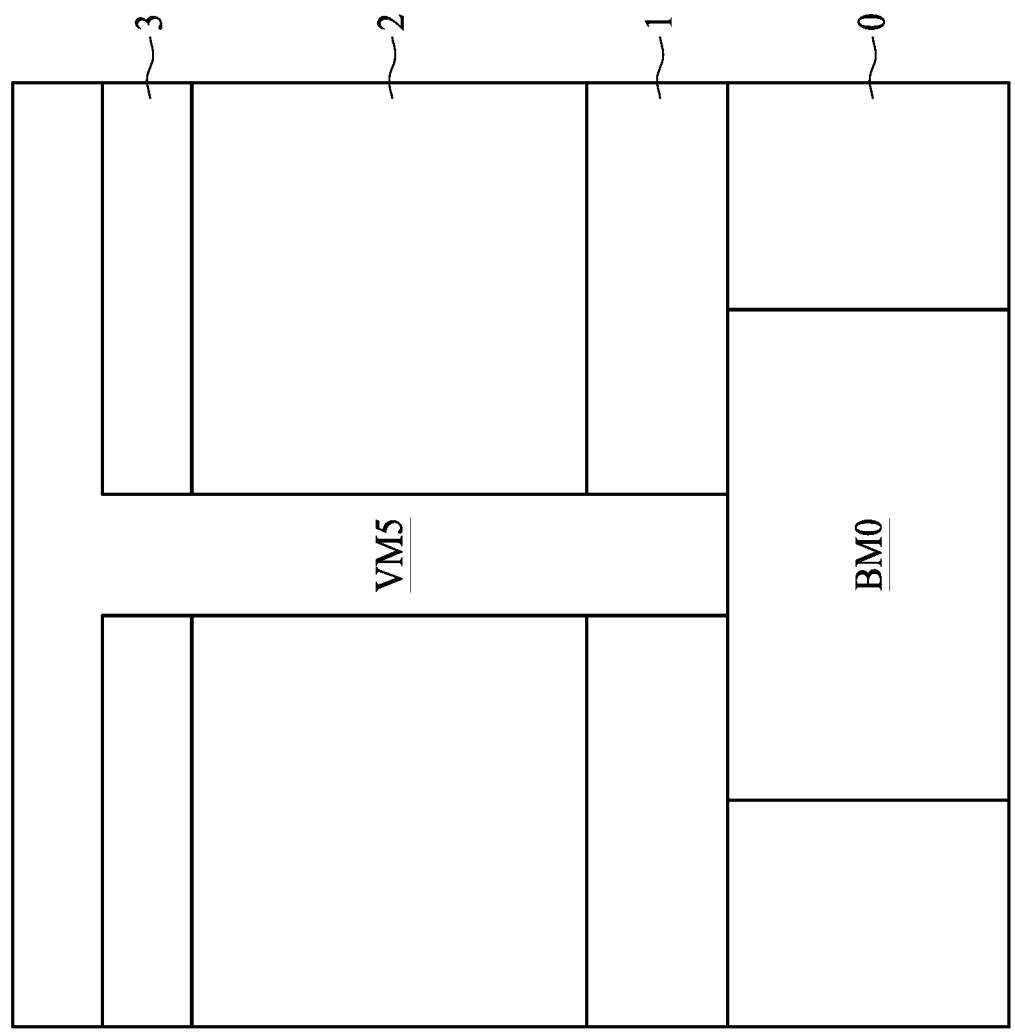
Figure 8C:
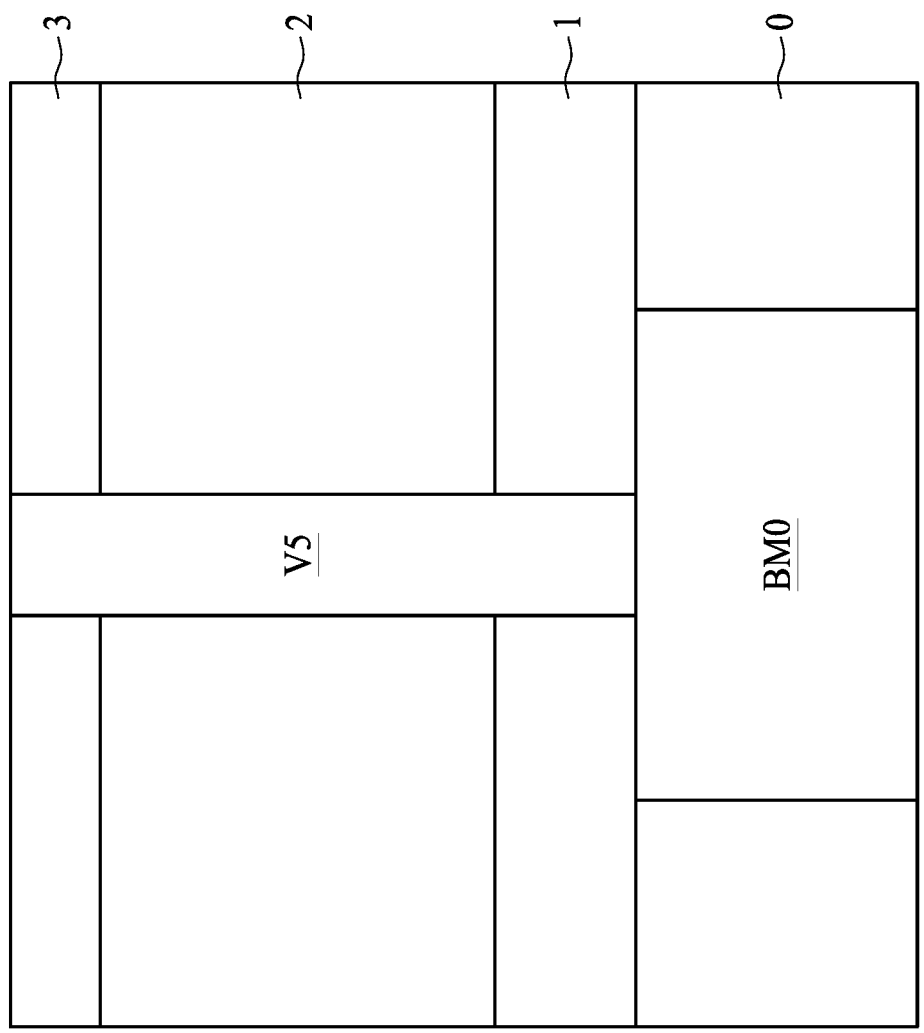
Figure 8D:
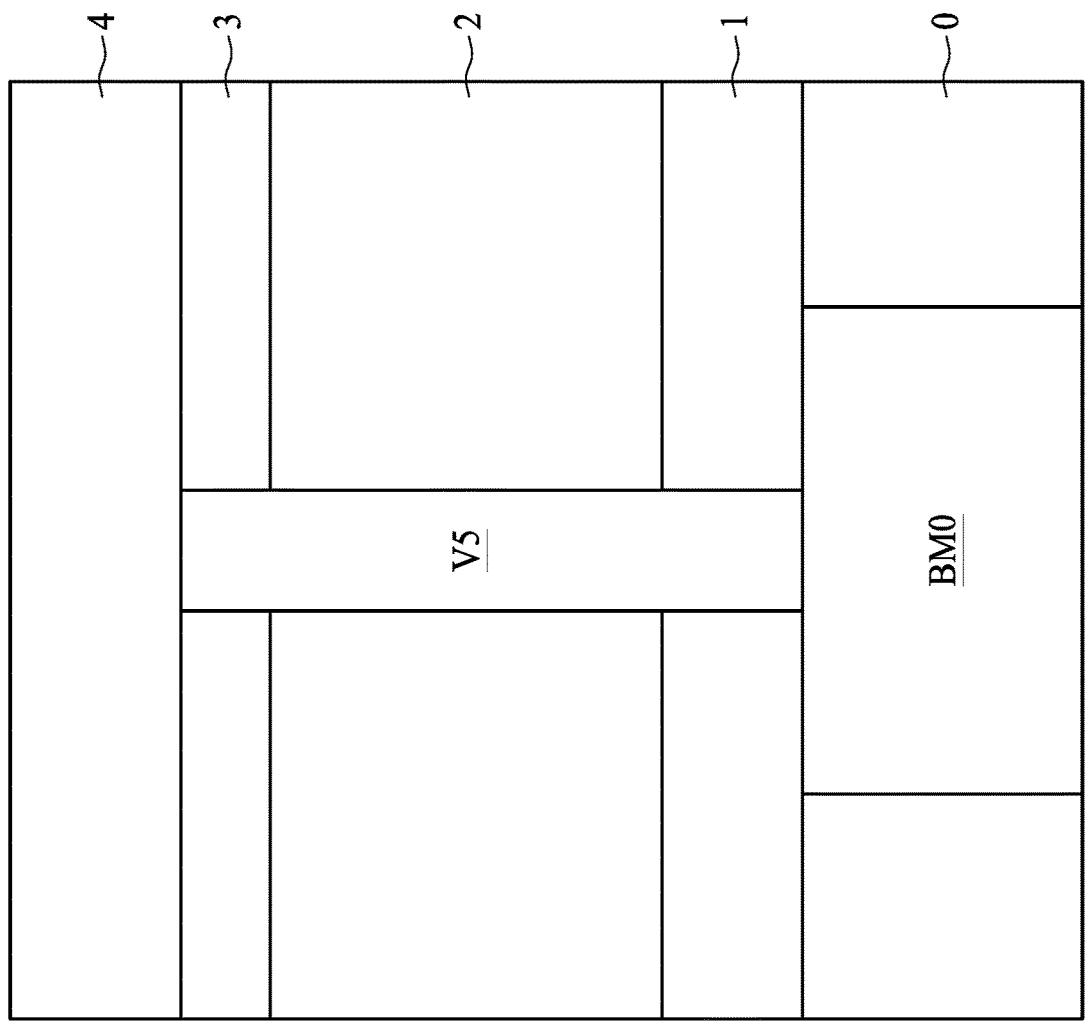

Referring to FIG. 8B, FIG. 8B is a cross sectional view of an interconnect structure during intermediate stages of manufacturing operations, according to some embodiments of the present disclosure. A conductive material layer VM5 including a second metal (which can be selected from the candidates discussed in FIG. 2E and the related descriptions above) is formed in the first recess R5 (shown in FIG. 8A) and over the second etch stop layer 3. Referring to FIG. 8C, FIG. 8C is a cross sectional view of an interconnect structure during intermediate stages of manufacturing operations, according to some embodiments of the present disclosure. A planarization operation, such as CMP, is performed to remove excessive portion of the conductive material layer VM5 over the second etch stop layer 3. A top surface of the remaining conductive material layer VM5 is coplanar with a top surface of the remaining second etch stop layer 3. Referring to FIG. 8D, FIG. 8D is a cross sectional view of an interconnect structure during intermediate stages of manufacturing operations, according to some embodiments of the present disclosure. A third ILD layer 4 is formed over the second etch stop layer 3.

Figure 8E:
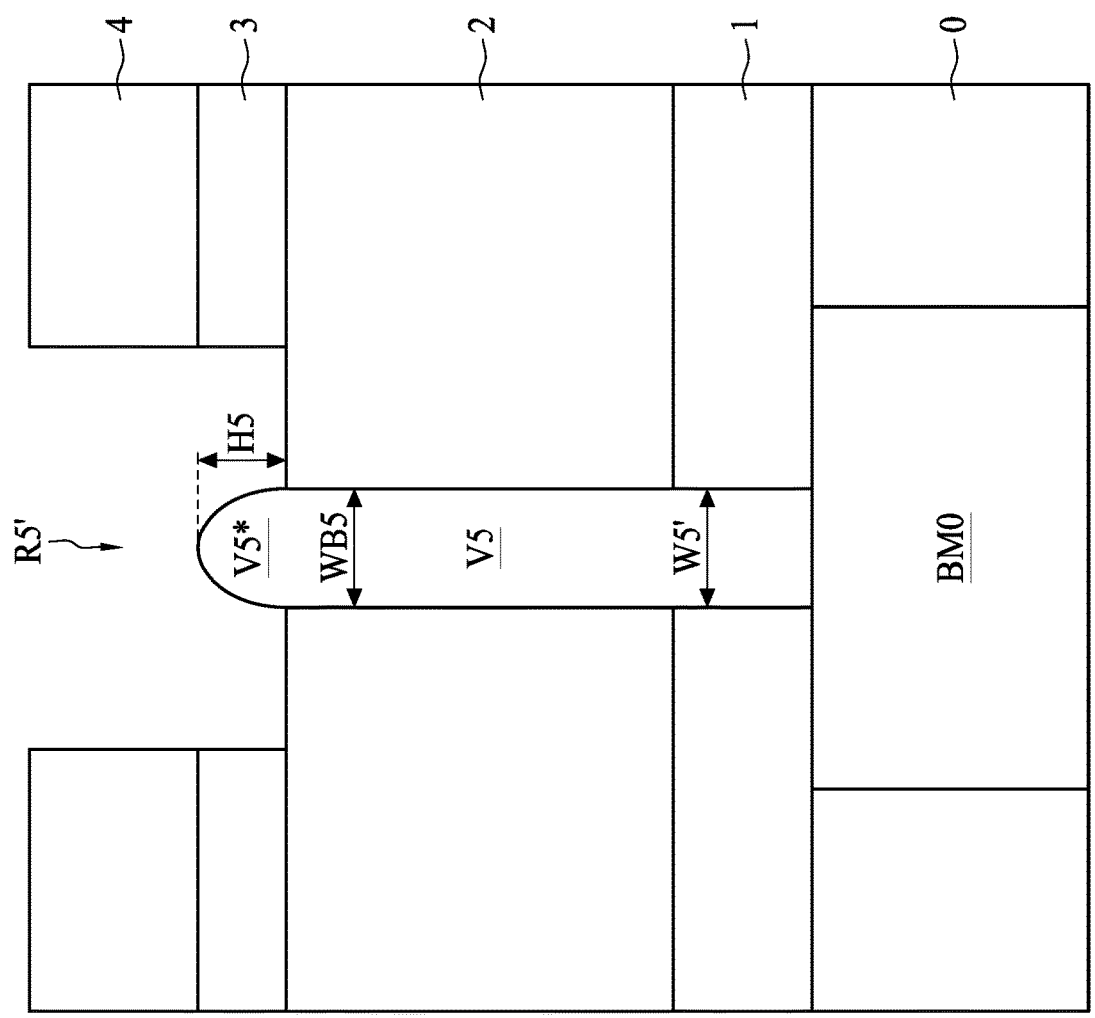

Referring to FIG. 8E, FIG. 8E is a cross sectional view of an interconnect structure during intermediate stages of manufacturing operations, according to some embodiments of the present disclosure. An etching operation is performed to remove a portion of the third ILD layer 4, a portion of the second etch stop layer 3 and a top portion of the remaining conductive material layer VM5 to form a second recess R5', and thereby forming a via V5, which includes a protruding portion V5* tapering away from bottom metal line BM0, wherein the protruding portion V5* is exposed from the second etch stop layer 3. A bottom width WB5 of the protruding portion V5* is identical with or less than a width W5' of the via V5. The protruding portion V5* has a height H5, which is calculated from the top of the protruding portion V5* to a bottom surface of the second recess R5'.

Figure 8F:
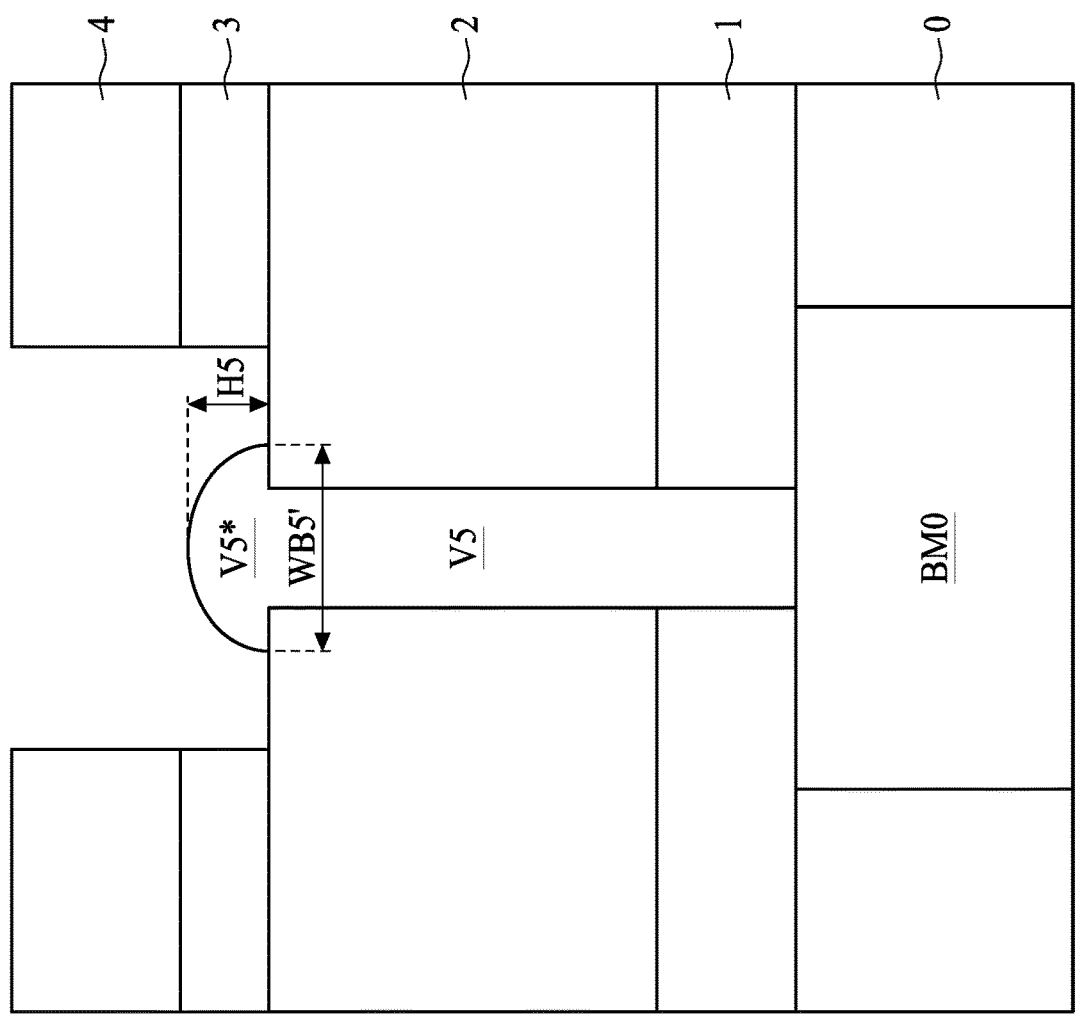

Referring to FIG. 8F, FIG. 8F is a cross sectional view of an interconnect structure during intermediate stages of manufacturing operations, according to some embodiments of the present disclosure. A selective deposition operation for depositing second metal is performed over the protruding portion V5*, so that a width and/or a height of the protruding portion V5* is increased. For example, a bottom width of the protruding portion V5* increases from WB5 to WB5', a height of the protruding portion V5* increases from H5 to H5'.

Figure 8G:
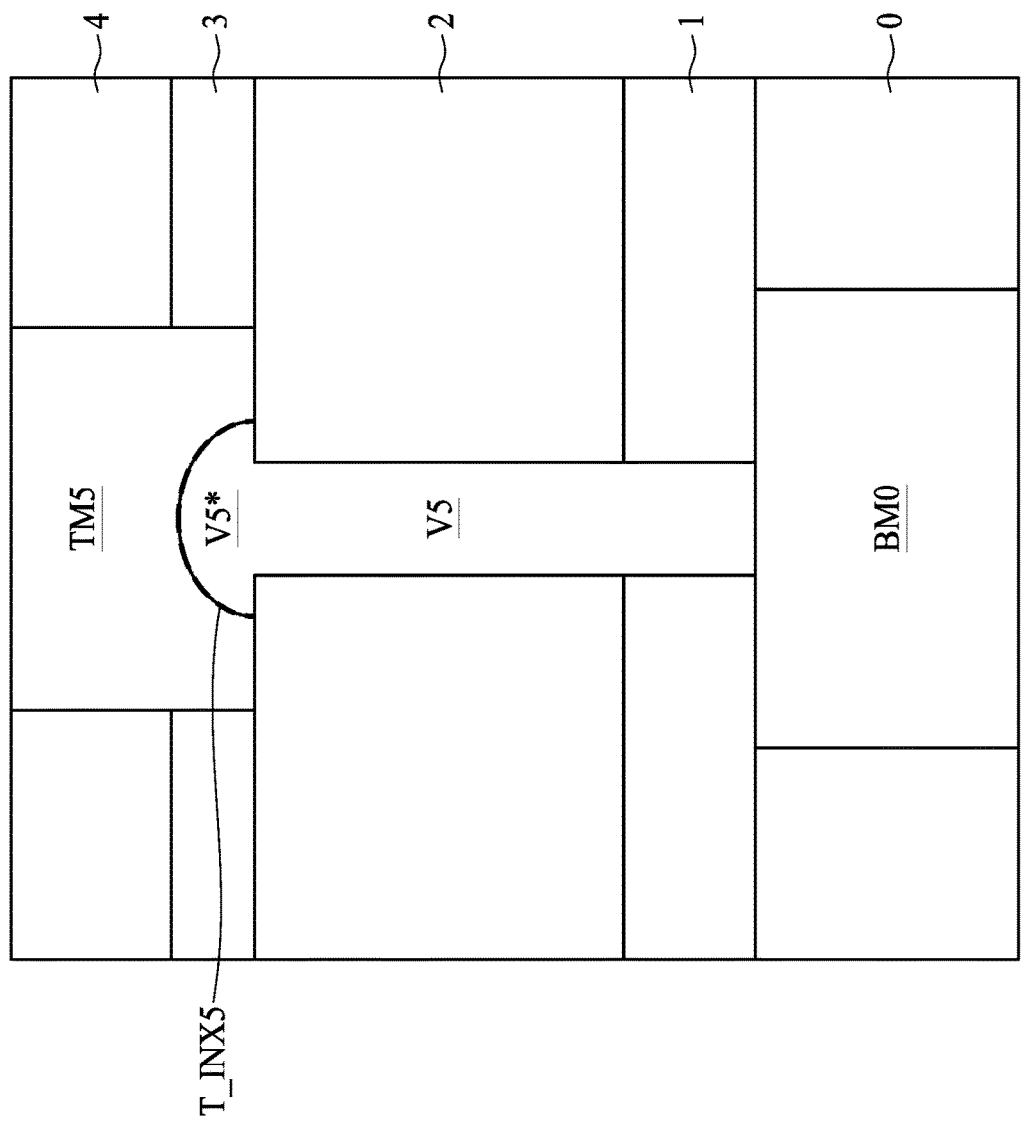

Referring to FIG. 8G, FIG. 8G is a cross sectional view of an interconnect structure during intermediate stages of manufacturing operations, according to some embodiments of the present disclosure. A top metal line TM5 is formed over and electrically connected to the via V5 (excessive portion of the top metal line TM5 may be removed by planarization operation), thereby the interconnect structure 800 is formed. An intermixing interface T_INX5 is between the protruding portion V5* of the via V5 and the top metal line TM5. A bottom surface of the top metal line TM5 concaves away from the bottom metal line BM0. A total surface area of a top surface of the intermixing interface T_INX5 is greater than a cross sectional surface area of a bottom of the first recess R5 (shown in in FIG. 8A) at the exposed top surface of the bottom metal line BM0. Comparing to the interconnect structure 700 discussed in FIG. 7G, the fabrication of the interconnect structure 800 requires an additional deposition operation, but creates a greater intermixing area to decrease interfacial resistance and allow a greater extent of intermixing.

The third metal of the top metal line TM5 may be selected to have the first type of primary crystalline structure, wherein the selection can be based on the look up table in FIG. 2E. In some of the embodiments, the first metal and/or the third metal is diffused into the via V5, or the second metal may be diffused into the bottom metal line BM0 and/or top metal line TM5, if one of the first, second, or third metal has lower melting points. Such distribution of material may be observed by analysis techniques, such as Energy-dispersive X-ray spectroscopy (EDX), which may be similar to the result presented in FIG. 2G.

Figure 9A:
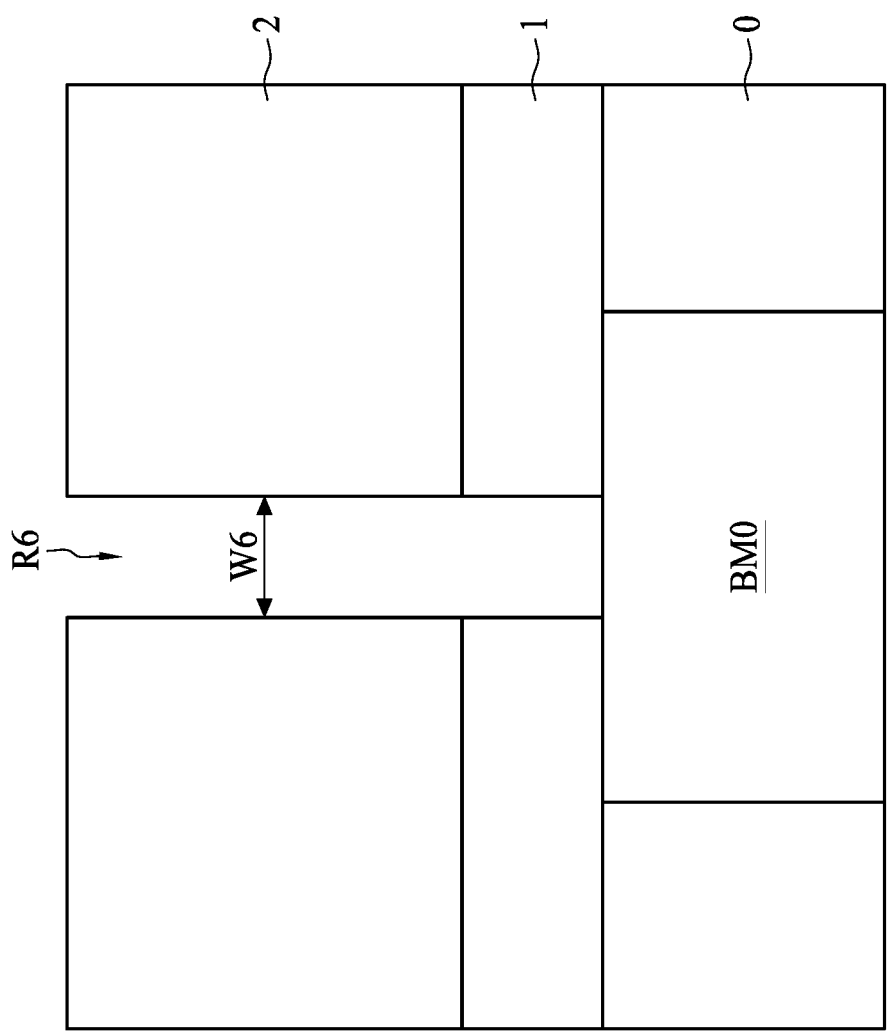

Referring to FIG. 9A, FIG. 9A is a cross sectional view of an interconnect structure during intermediate stages of manufacturing operations, according to some embodiments of the present disclosure. A bottom metal line BM0 including a first metal (which can be selected from the candidates discussed in FIG. 2E and the related descriptions above) is formed in a first interlayer dielectric (ILD) layer 0 over a substrate (not shown). As previously discussed, a material of the first metal may have a first type of primary crystalline structure, which can be BCC, HCP, or FCC. A first etch stop layer 1 is formed over the first ILD layer 0 and a second ILD layer 2 is formed over the first etch stop layer 1. A first recess R6 is formed to expose a top surface of the bottom metal line BM0, wherein the first recess has a first width W6. In some embodiments, the first width W6 is less than 18 nm.

Figure 9B:
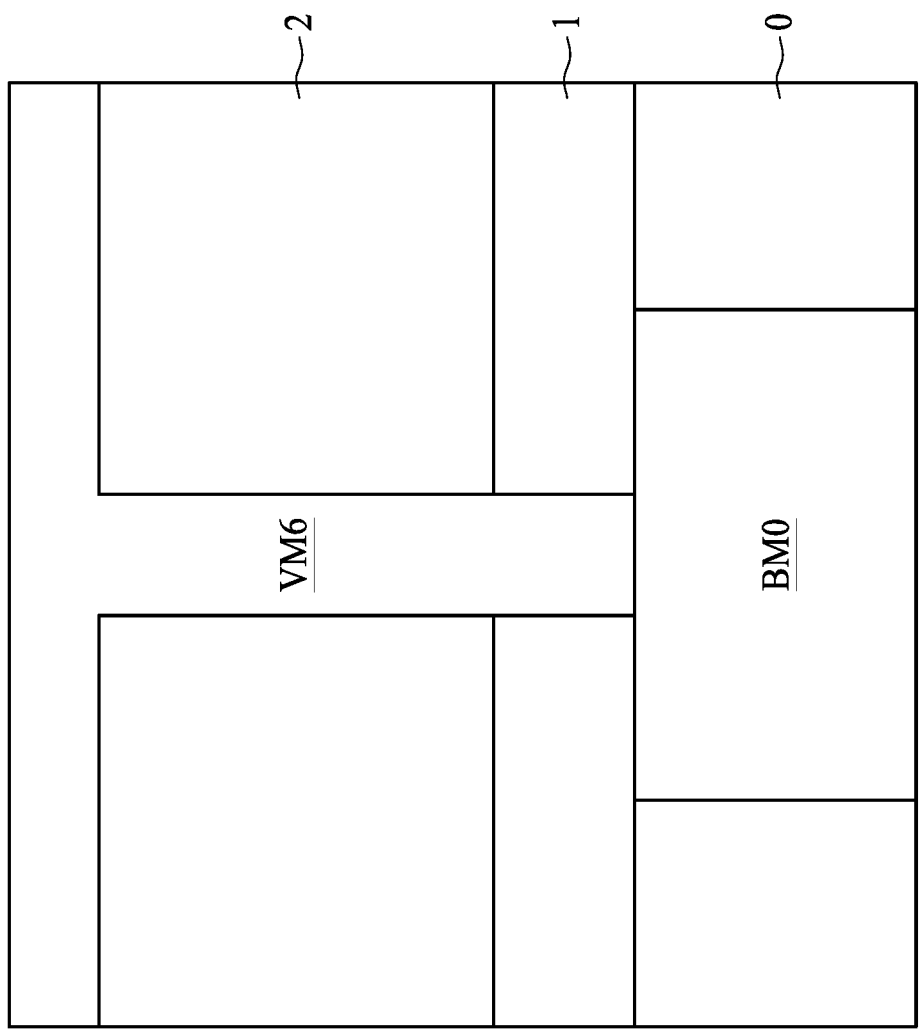
Figure 9C:
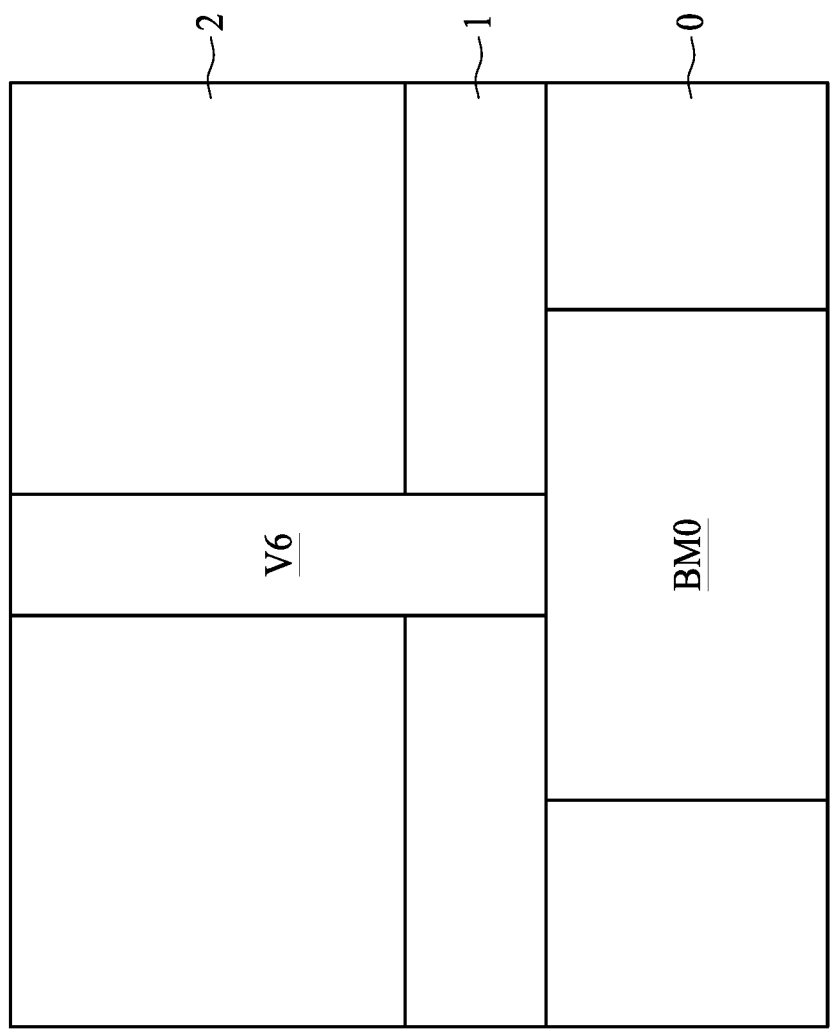

Referring to FIG. 9B, FIG. 9B is a cross sectional view of an interconnect structure during intermediate stages of manufacturing operations, according to some embodiments of the present disclosure. A conductive material layer VM6 including a second metal (which can be selected from the candidates discussed in FIG. 2E and the related descriptions above) is formed in the first recess R6 (shown in FIG. 9A) and over the second ILD layer 2. Referring to FIG. 9C, FIG. 9C is a cross sectional view of an interconnect structure during intermediate stages of manufacturing operations, according to some embodiments of the present disclosure. A planarization operation, such as CMP, is performed to remove excessive portion of the conductive material layer VM6 over the second ILD layer 2. A top surface of the remaining conductive material layer VM6 is coplanar with a top surface of the remaining second ILD layer 2.

Figure 9E:
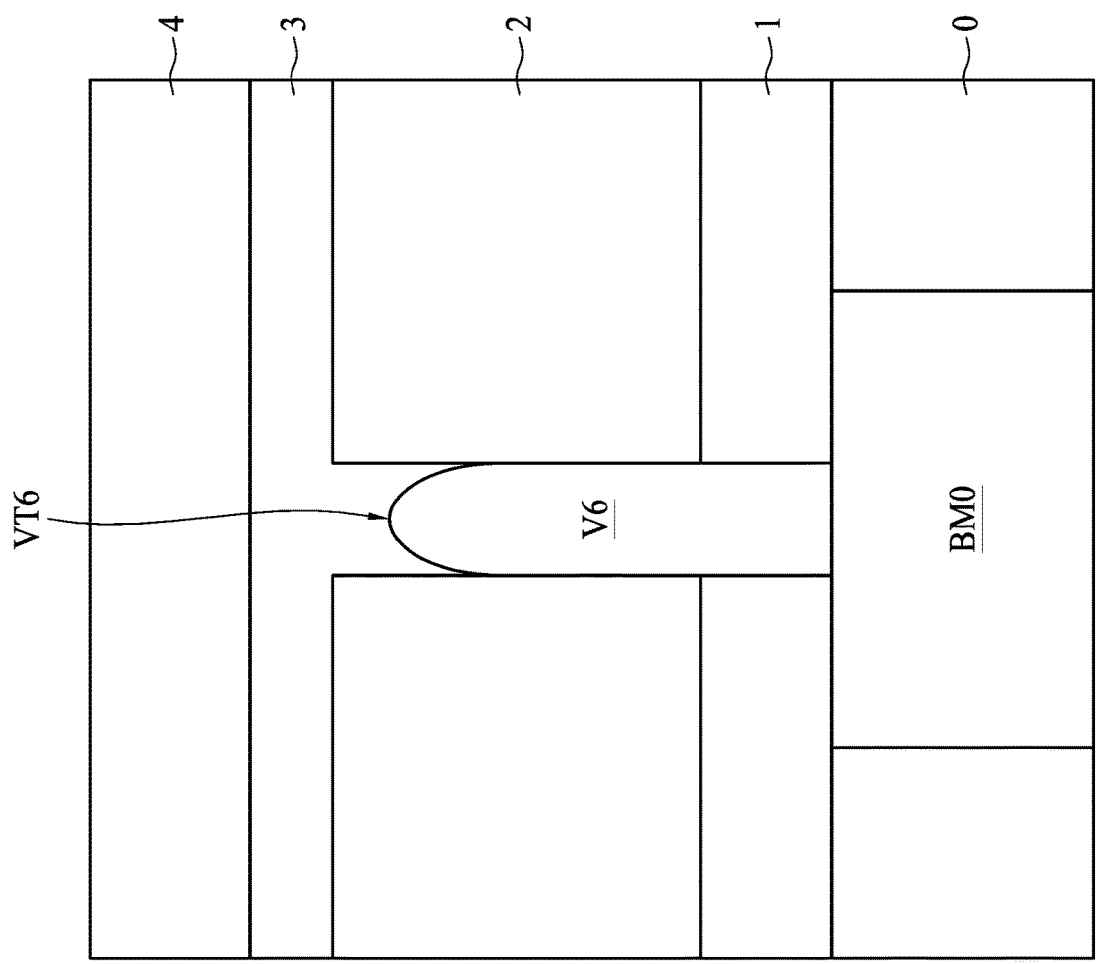

Referring to FIG. 9D, FIG. 9D is a cross sectional view of an interconnect structure during intermediate stages of manufacturing operations, according to some embodiments of the present disclosure. An etching operation is performed to remove a top portion of the conductive material layer VM6, thereby a via V6 having a tapered top surface VT6 is formed. The tapered top surface VT6 of the via V6 is lower than a top surface of the remaining second ILD layer 2. Referring to FIG. 9E, FIG. 9E is a cross sectional view of an interconnect structure during intermediate stages of manufacturing operations, according to some embodiments of the present disclosure. A second etch stop layer 3 is formed over the tapered top surface VT6 of the via V6 and a top surface of the remaining second ILD layer 2. A third ILD layer 4 is further formed over the second etch stop layer 3.

Figure 9F:
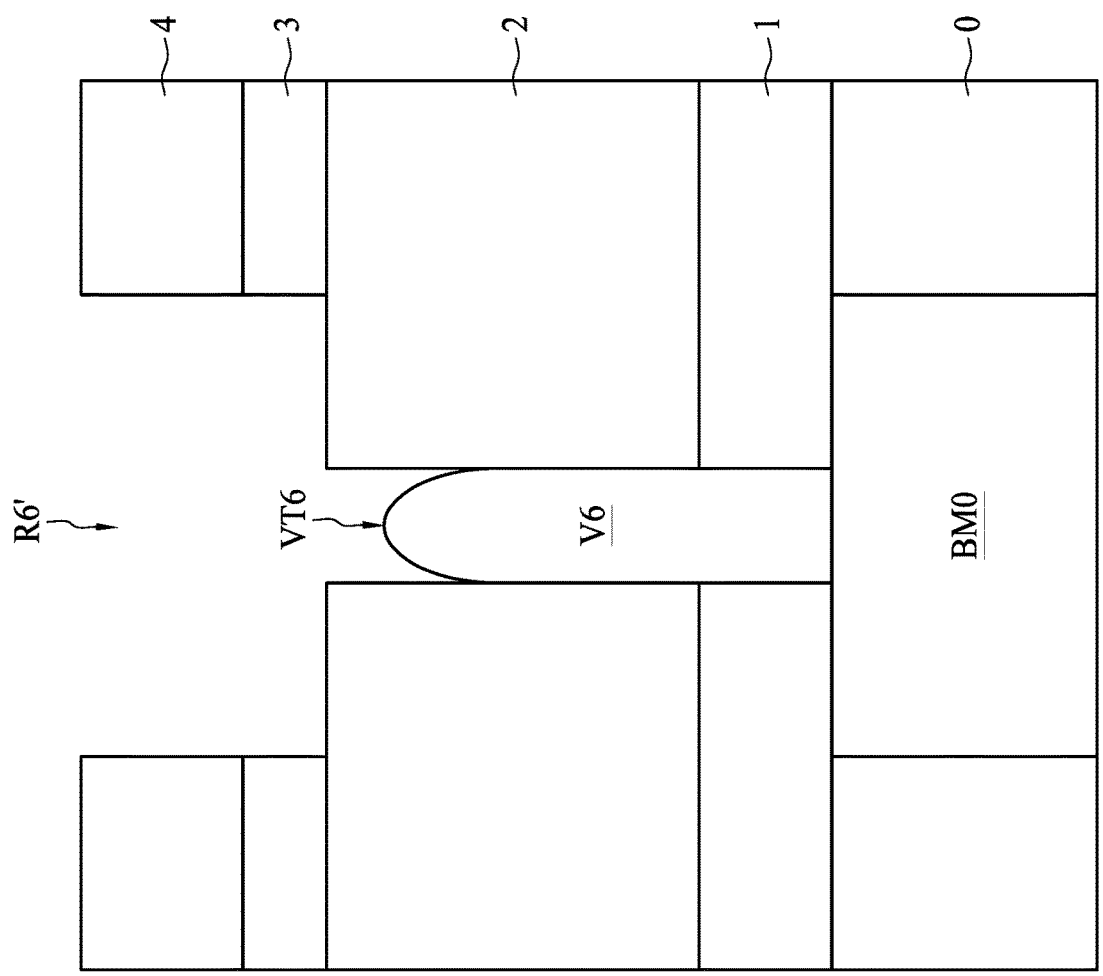

Referring to FIG. 9F, FIG. 9F is a cross sectional view of an interconnect structure during intermediate stages of manufacturing operations, according to some embodiments of the present disclosure. An etching operation is performed to remove a portion of the third ILD layer 4 and a portion of the second etch stop layer 3 to form a second recess R6'. The tapered top surface VT6 of the via V6 is exposed from the second recess R6'.

Figure 9G:
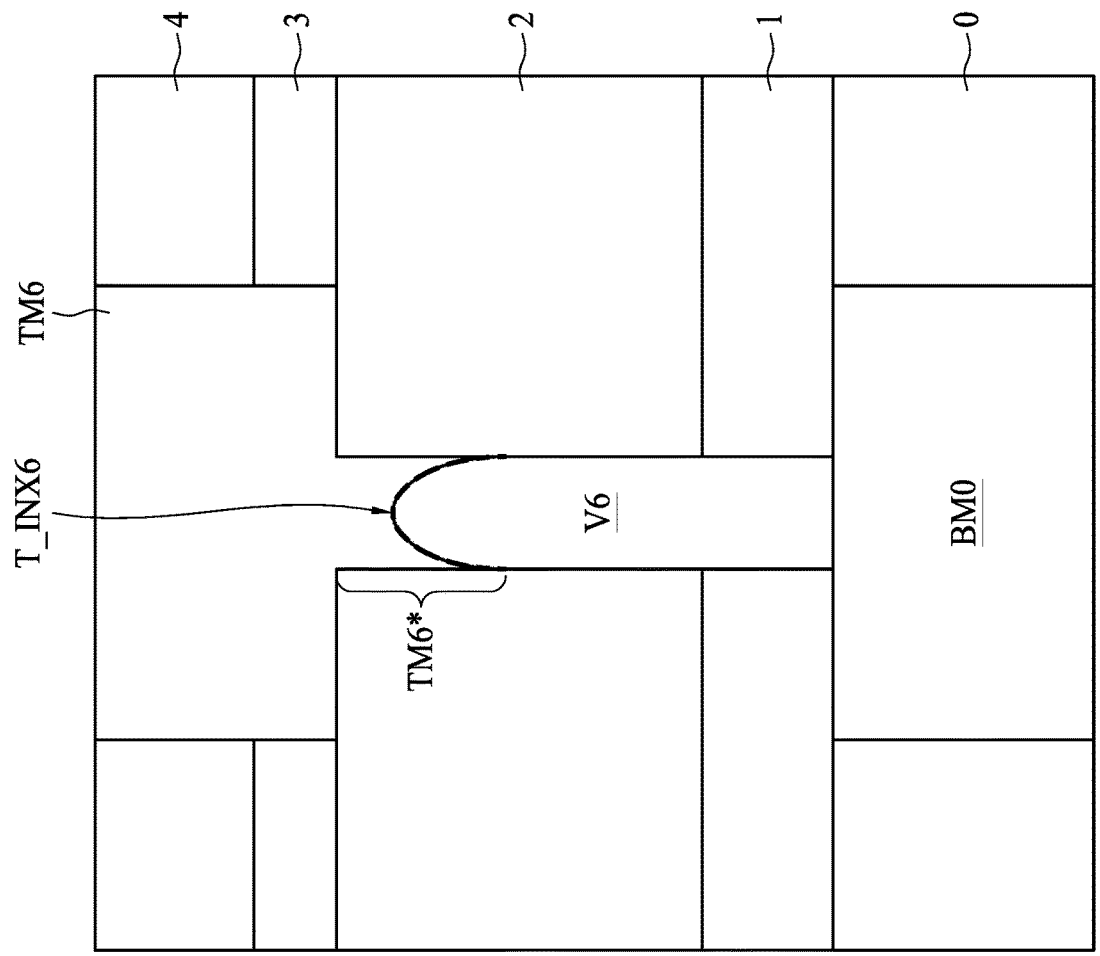

Referring to FIG. 9G, FIG. 9G is a cross sectional view of an interconnect structure during intermediate stages of manufacturing operations, according to some embodiments of the present disclosure. A top metal line TM6 is formed over and electrically connected to the via V6 (excessive portion of the top metal line TM6 may be removed by planarization operation), thereby the interconnect structure 900 is formed. The top metal line TM6 has a bottom portion TM6* laterally surrounded by the second ILD layer 2. A bottom surface of the bottom portion TM6* concaves away from the bottom metal line BM0. An intermixing interface T_INX6 is between the via V6 and the bottom portion TM6* of the top metal line TM6. A total surface area of a top surface of the intermixing interface T_INX6 is greater than a cross sectional surface area of a bottom of the first recess R6 (shown in in FIG. 9A) at the exposed top surface of the bottom metal line BM0. The third metal of the top metal line TM6 may be selected to have the first type of primary crystalline structure, wherein the selection can be based on the look up table in FIG. 2E. In some of the embodiments, the first metal and/or the third metal is diffused into the via V6, or the second metal may be diffused into the bottom metal line BM0 and/or top metal line TM6, if one of the first, second, or third metal has lower melting points. Such distribution of material may be observed by analysis techniques, such as Energy-dispersive X-ray spectroscopy (EDX), which may be similar to the result presented in FIG. 2G.

Figure 10A:
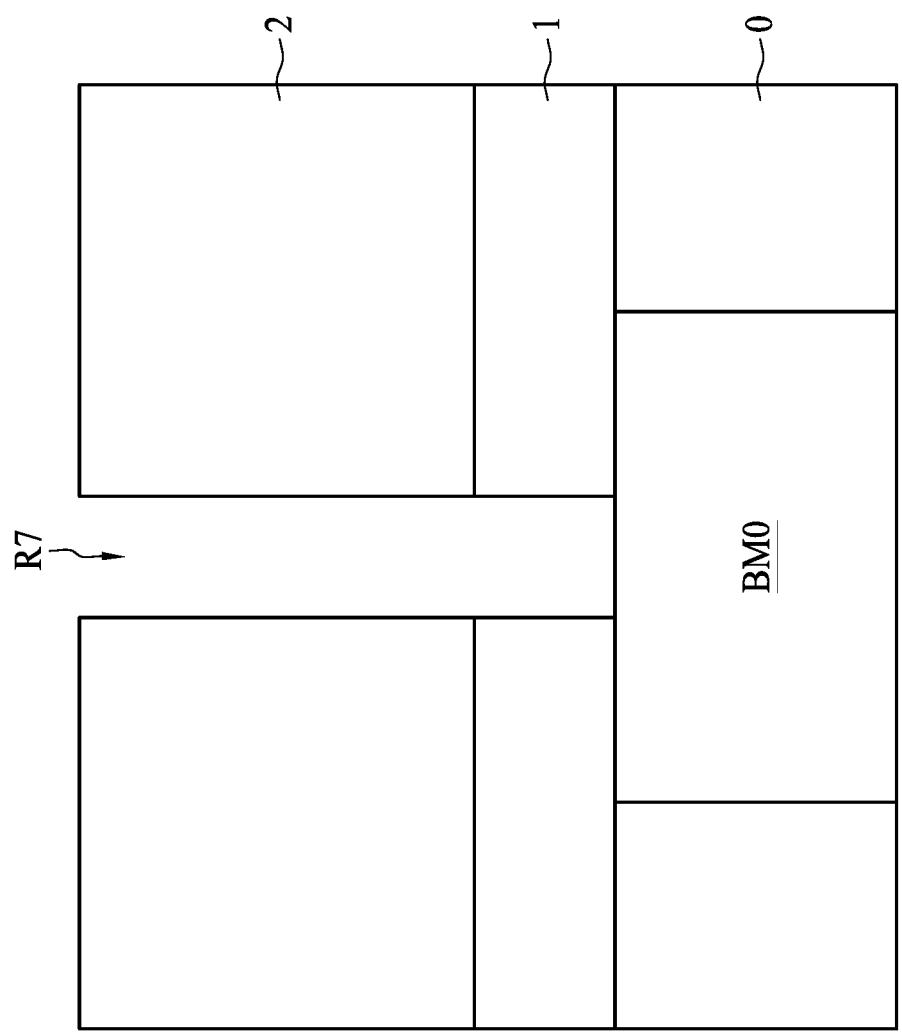
FIG. 10A to FIG. 10G are cross sectional views of an interconnect structure during intermediate stages of manufacturing operations, according to some embodiments of the present disclosure.

Referring to FIG. 10A, FIG. 10A is a cross sectional view of an interconnect structure during intermediate stages of manufacturing operations, according to some embodiments of the present disclosure. A bottom metal line BM0 including a first metal (which can be selected from the candidates discussed in FIG. 2E and the related descriptions above) is formed in a first interlayer dielectric (ILD) layer 0 over a substrate (not shown). As previously discussed, a material of the first metal may have a first type of primary crystalline structure, which can be BCC, HCP, or FCC. A first etch stop layer 1 is formed over the first ILD layer 0 and a second ILD layer 2 is formed over the first etch stop layer 1. A first recess R7 is formed to expose a top surface of the bottom metal line BM0, wherein the first recess has a first width W7. In some embodiments, the first width W7 is less than 18 nm.

Figure 10B:
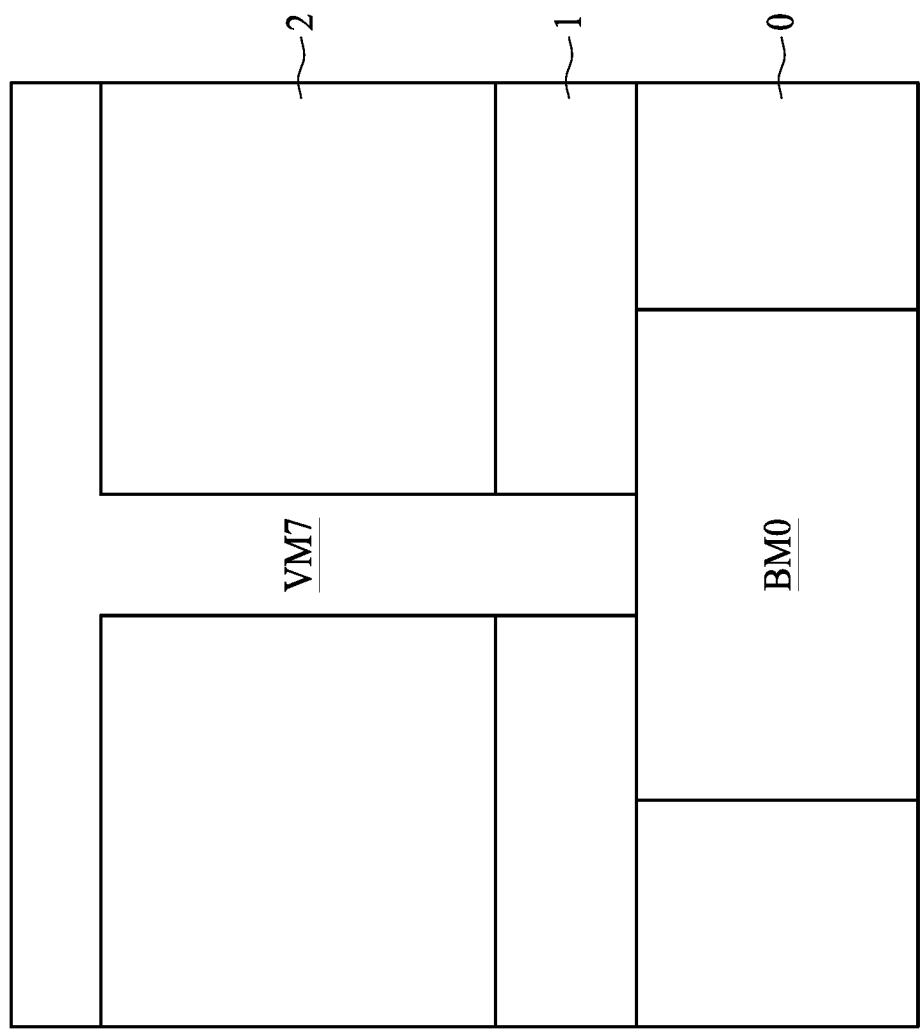
Figure 10C:
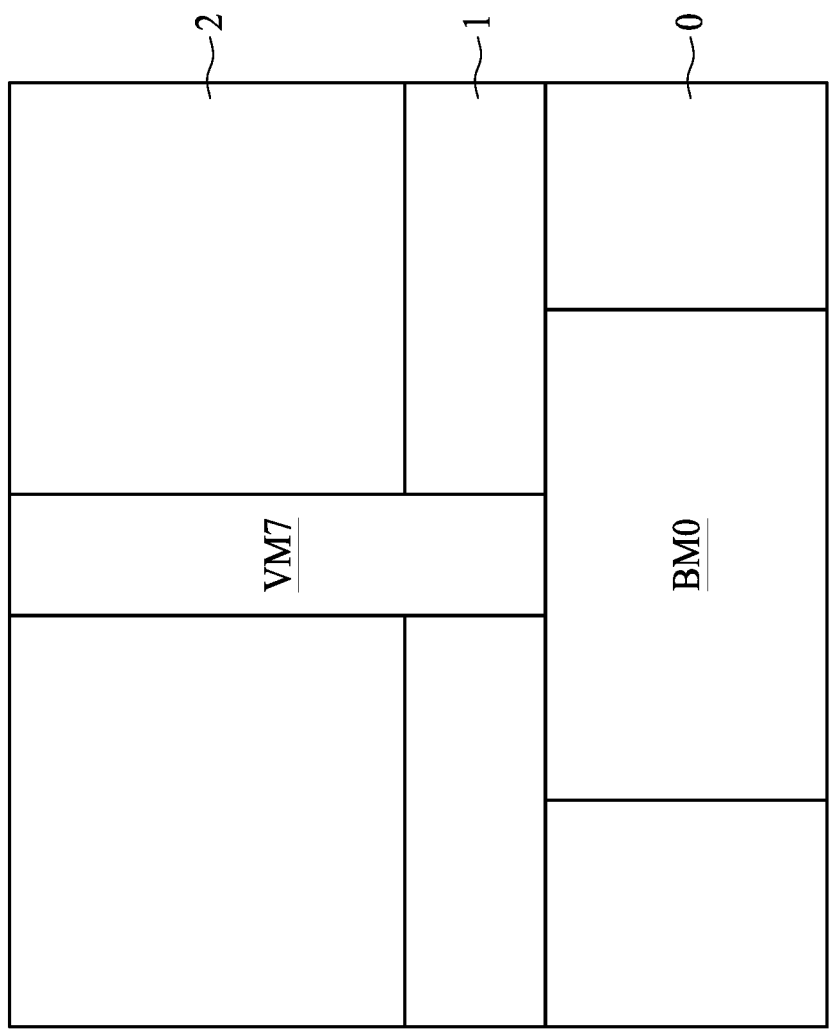
Figure 10D:
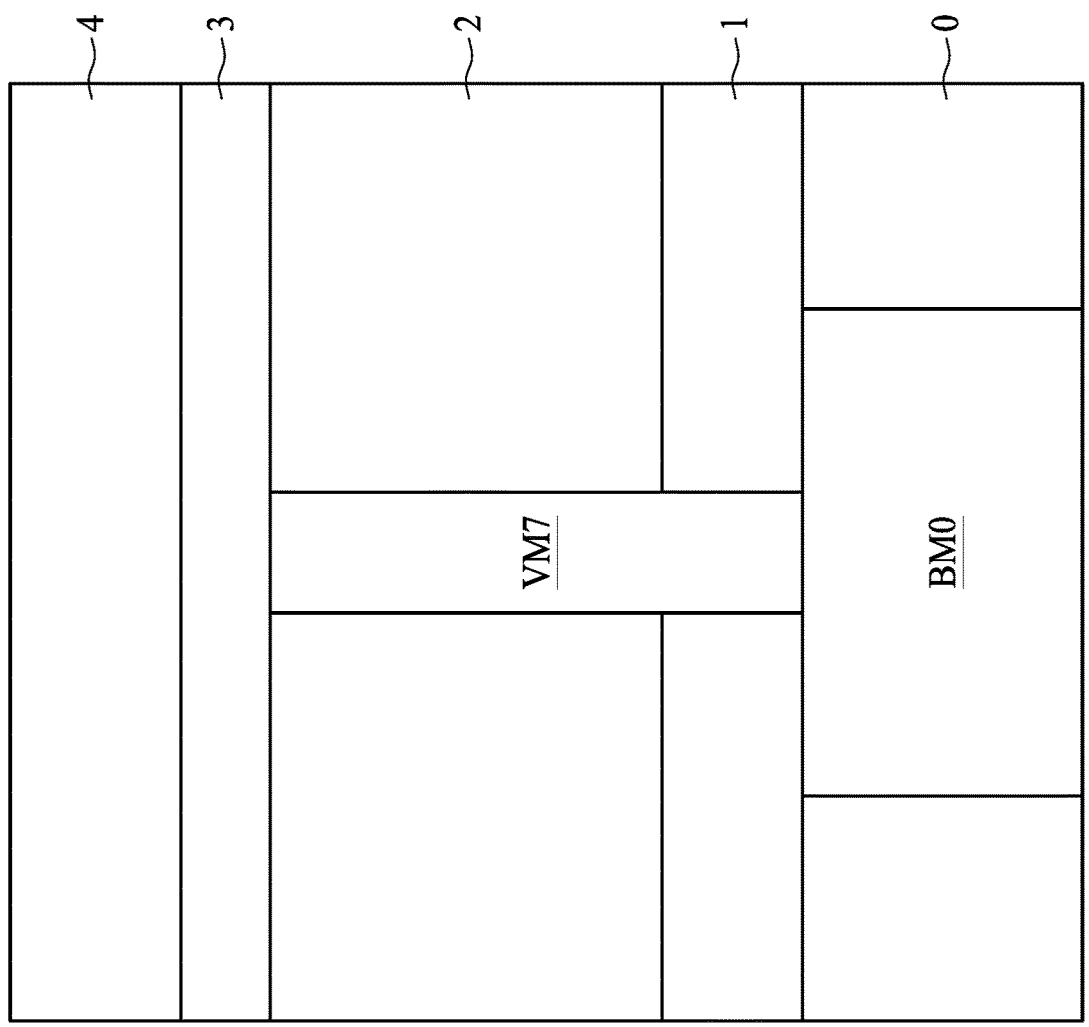

Referring to FIG. 10B, FIG. 10B is a cross sectional view of an interconnect structure during intermediate stages of manufacturing operations, according to some embodiments of the present disclosure. A conductive material layer VM7 including a second metal (which can be selected from the candidates discussed in FIG. 2E and the related descriptions above) is formed in the first recess R7 (shown in FIG. 7A) and over the second ILD layer 2. Referring to FIG. 10C, FIG. 10C is a cross sectional view of an interconnect structure during intermediate stages of manufacturing operations, according to some embodiments of the present disclosure. A planarization operation, such as CMP, is performed to remove excessive portion of the conductive material layer VM7 over the second ILD layer 2. A top surface of the remaining conductive material layer VM7 is coplanar with a top surface of the remaining second ILD layer 2. Referring to FIG. 10D, FIG. 10D is a cross sectional view of an interconnect structure during intermediate stages of manufacturing operations, according to some embodiments of the present disclosure. A second etch stop layer 3 is formed over the top surface of the second ILD layer 2, and a third ILD layer 4 is further formed over the second etch stop layer 3.

Figure 10E:
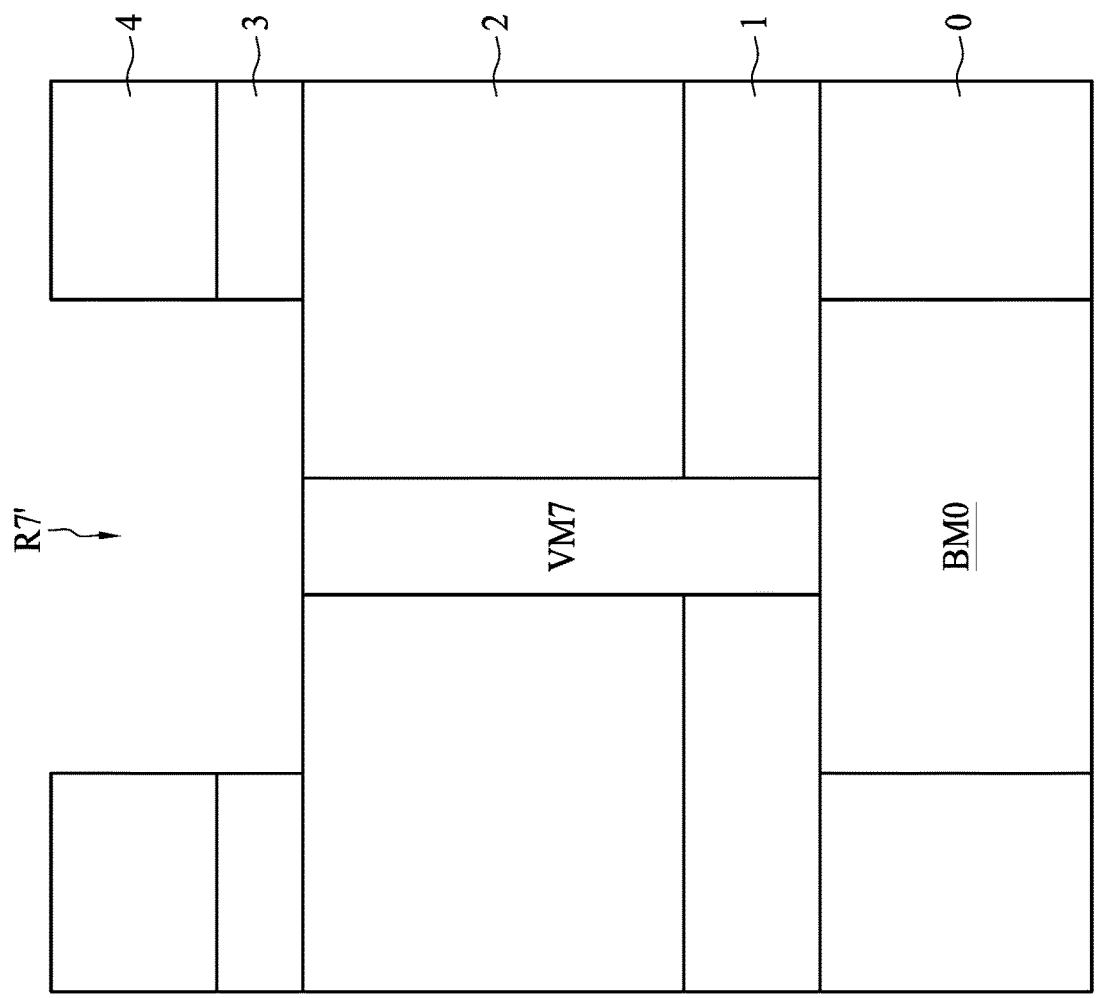

Referring to FIG. 10E, FIG. 10E is a cross sectional view of an interconnect structure during intermediate stages of manufacturing operations, according to some embodiments of the present disclosure. An etching operation is performed to remove a portion of the third ILD layer 4 and a portion of the second etch stop layer 3 to form a second recess R7'. A top surface of the remaining conductive material layer VM7 is exposed from the second recess R7'.

Figure 10F:
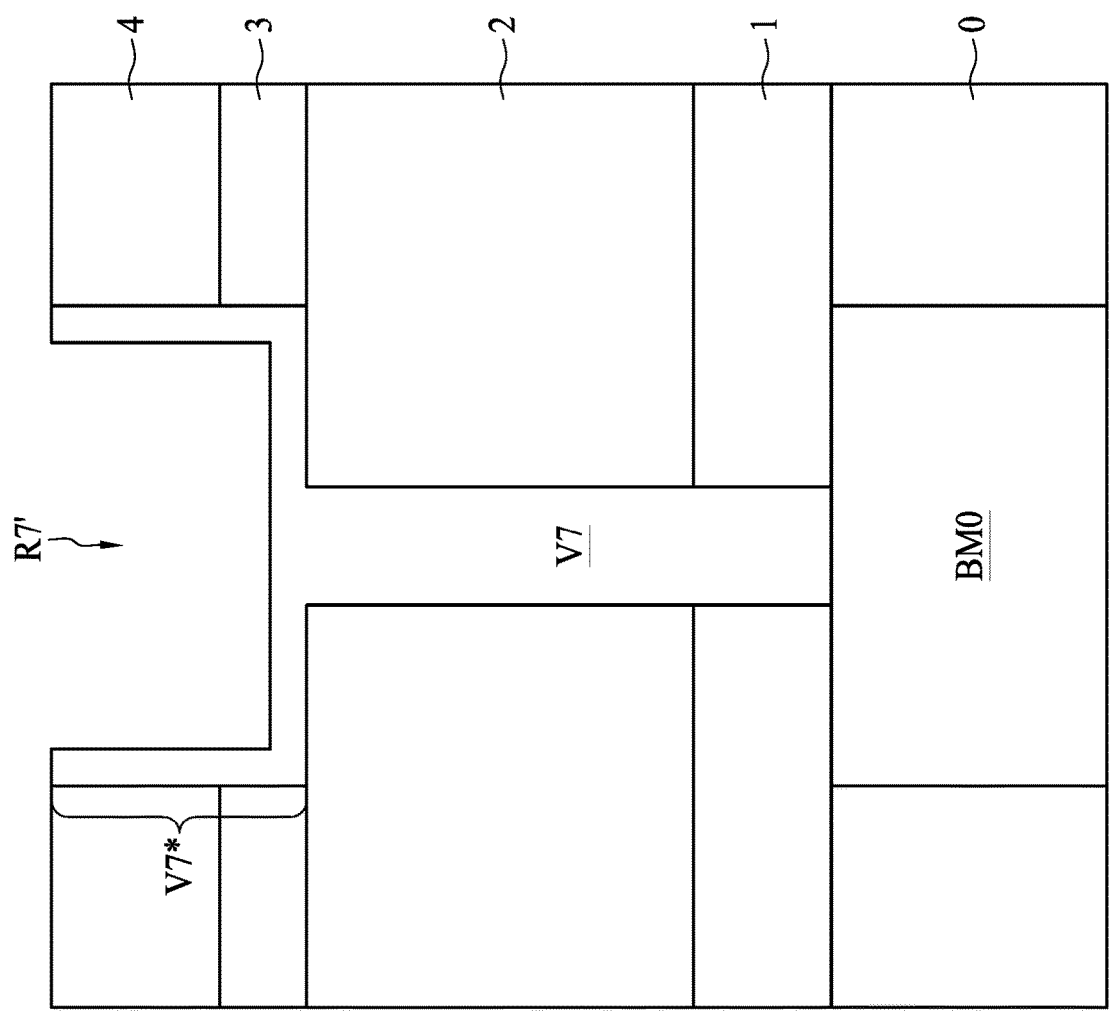

Referring to FIG. 10F, FIG. 10F is a cross sectional view of an interconnect structure during intermediate stages of manufacturing operations, according to some embodiments of the present disclosure. An additional layer of conductive material layer VM7 is conformably deposited over a bottom surface and a sidewall of the second recess R7', thereby a via V7 is formed. (Herein the portion of the via V7 over the bottom surface and the sidewall of the second recess R7' are denoted as top portion V7*.)

Figure 10G:
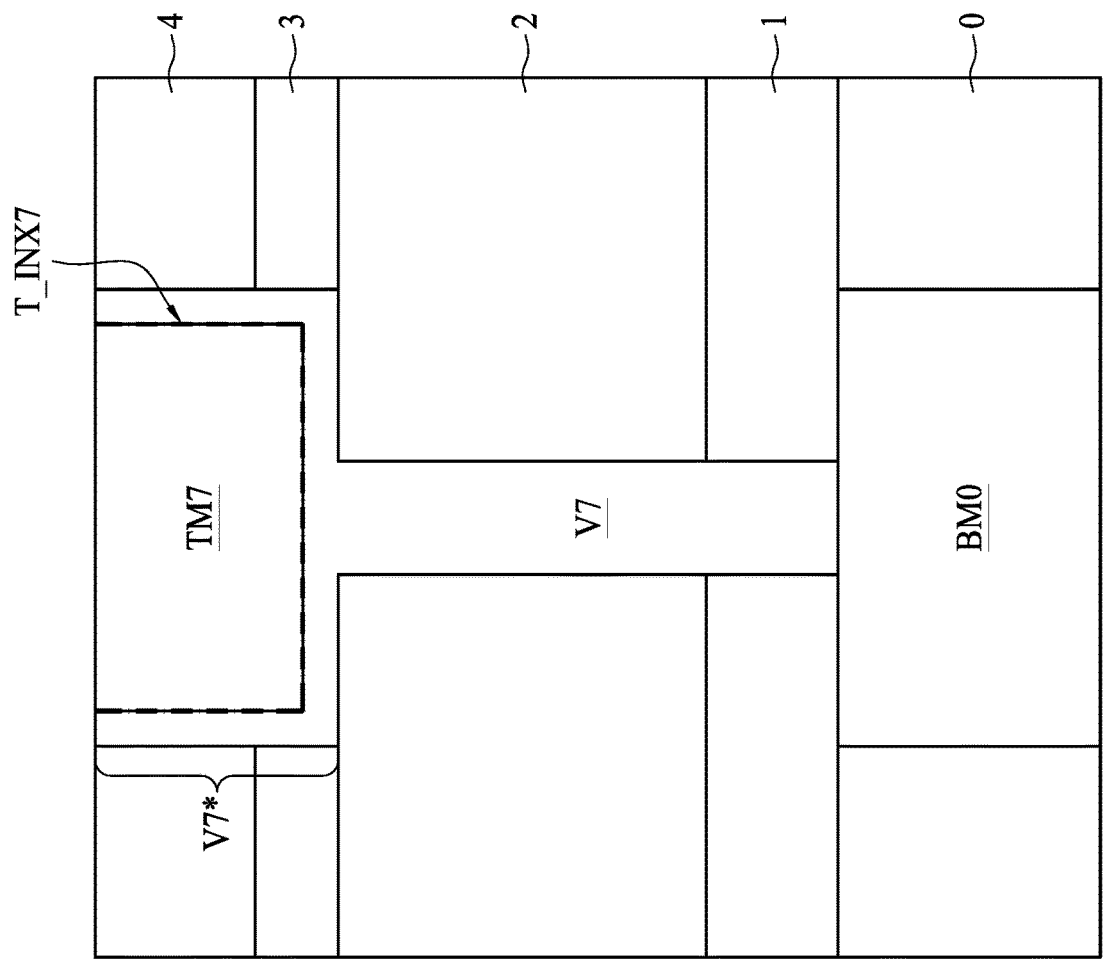

Referring to FIG. 10G, FIG. 10G is a cross sectional view of an interconnect structure during intermediate stages of manufacturing operations, according to some embodiments of the present disclosure. A top metal line TM7 is formed in the second recess R7', over and electrically connected to the via V7 (excessive portion of the top metal line TM7 may be removed by planarization operation), thereby the interconnect structure 990 is formed. The top metal line TM7 is spaced away from the third ILD layer 4 by the top portion V7* of the via V7. An intermixing interface T_INX7 is between the top portion V7* of the via V7 and the top metal line TM7. A total surface area of a top surface of the intermixing interface T_INX7 is greater than a cross sectional surface area of a bottom of the first recess R7 (shown in in FIG. 10A) at the exposed top surface of the bottom metal line BM0. The third metal of the top metal line TM7 may be selected to have the first type of primary crystalline structure, wherein the selection can be based on the look up table in FIG. 2E. In some of the embodiments, the first metal and/or the third metal is diffused into the via V7, or the second metal may be diffused into the bottom metal line BM0 and/or top metal line TM7, if one of the first, second, or third metal has lower melting points. Such distribution of material may be observed by analysis techniques, such as Energy-dispersive X-ray spectroscopy (EDX), which may be similar to the result presented in FIG. 2G.

Figure 11A:
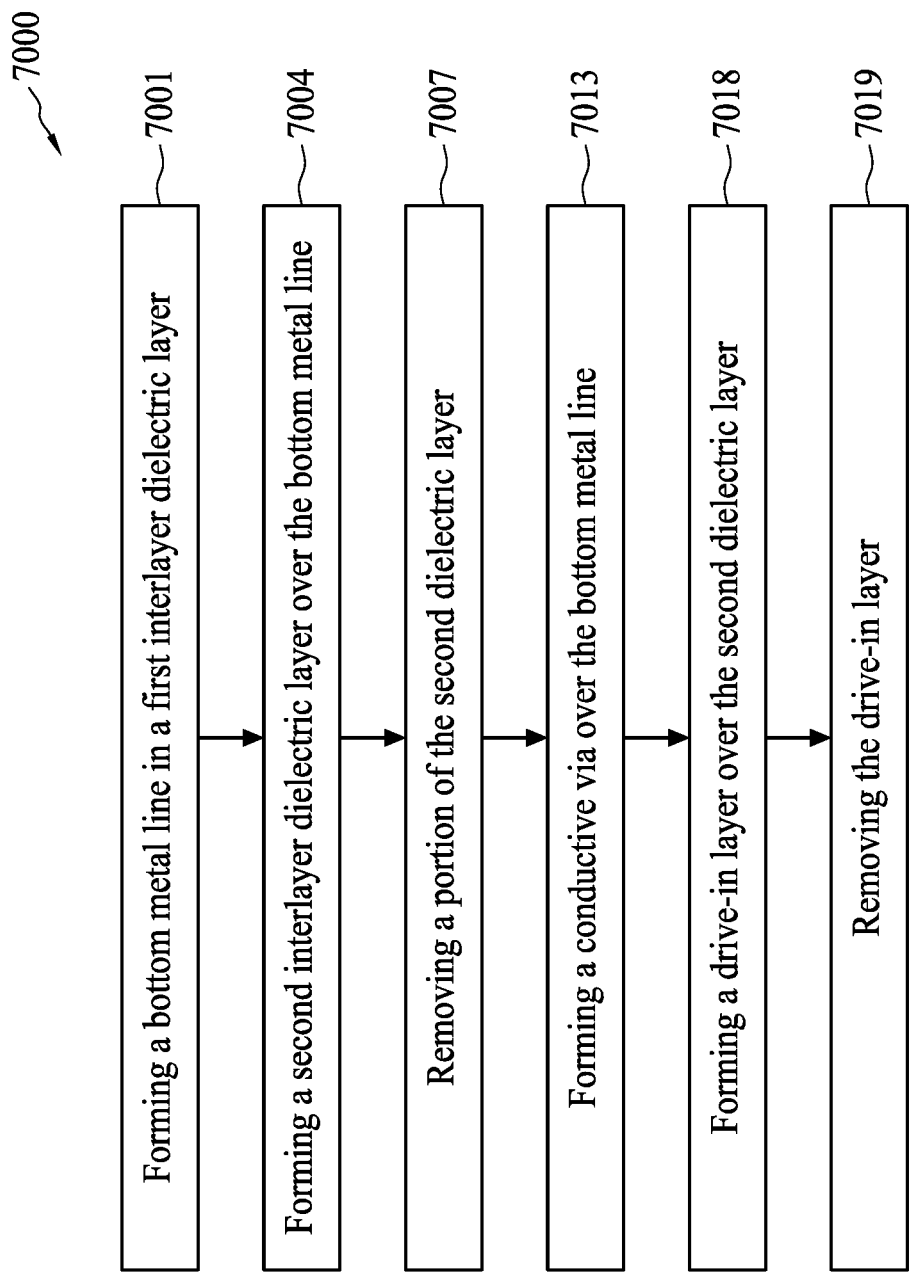
FIG. 11A shows a flow chart representing method of fabricating an interconnect structure, in accordance with some embodiments of the present disclosure.
Figure 11B:
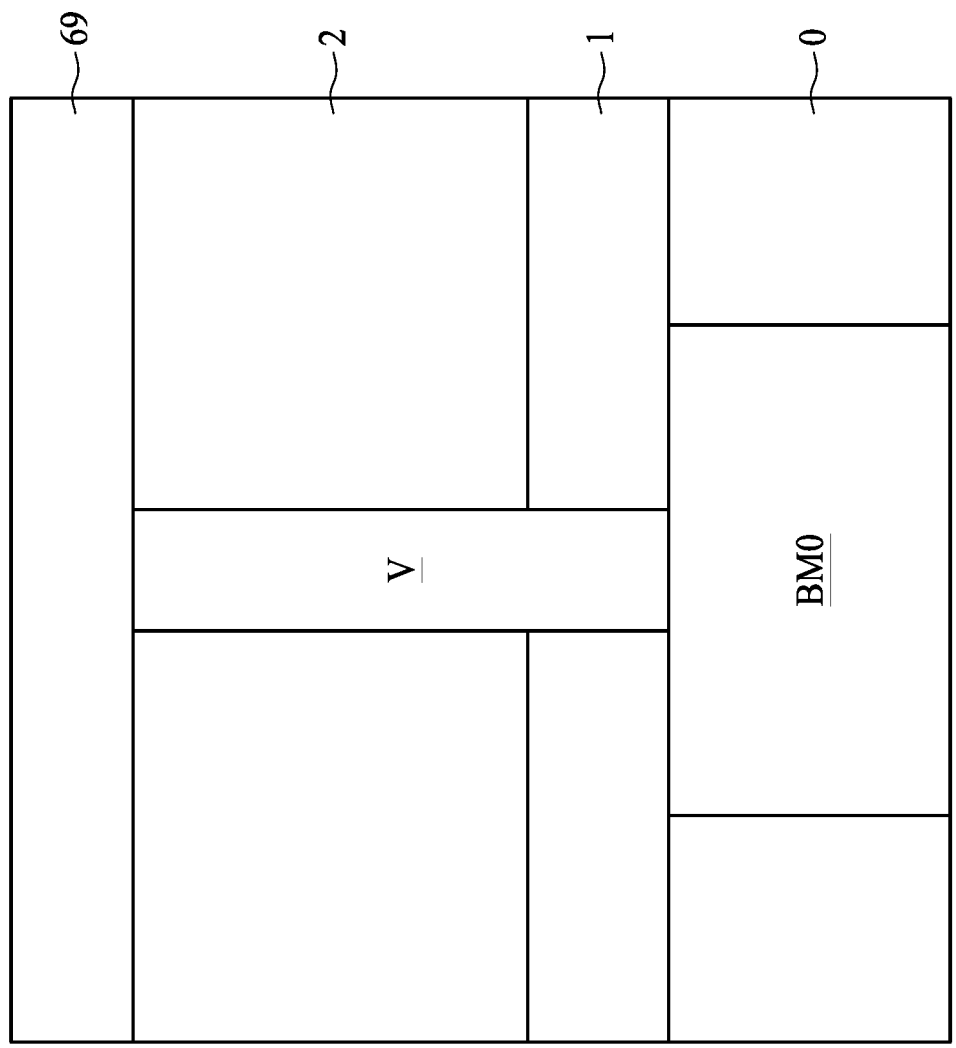
FIG. 11B to FIG. 11C are cross sectional views of an interconnect structure during intermediate stages of manufacturing operations, according to some embodiments of the present disclosure.
Figure 11C:
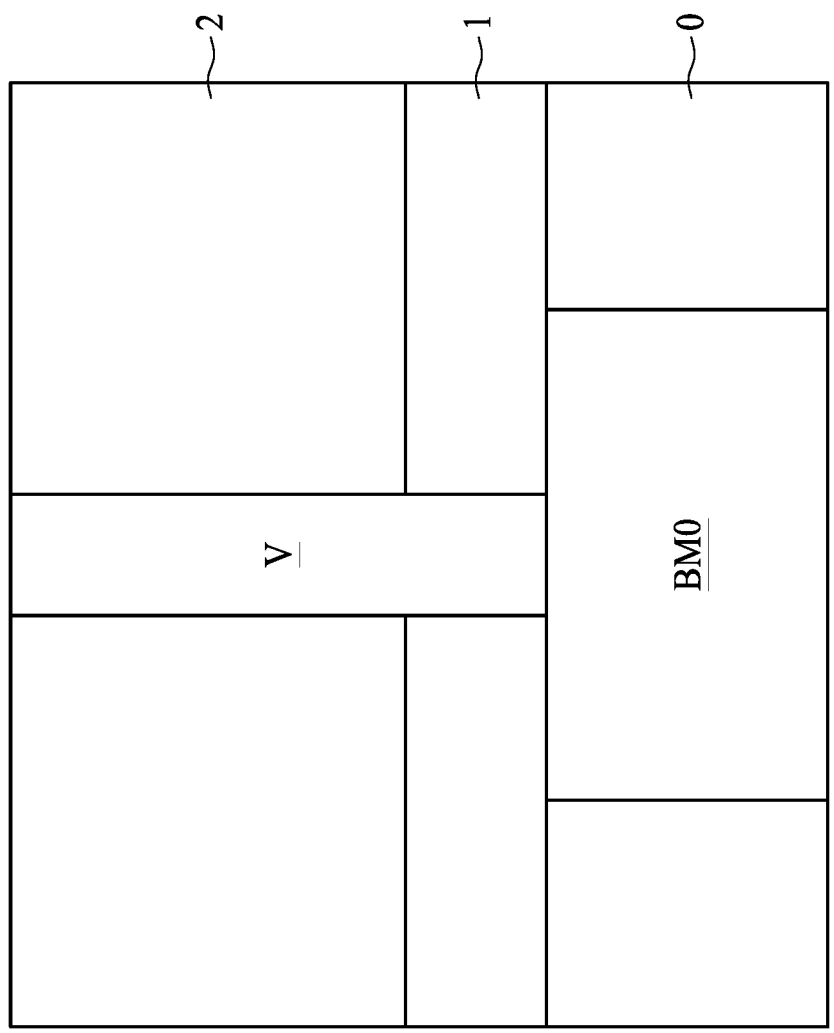
Figure 12:
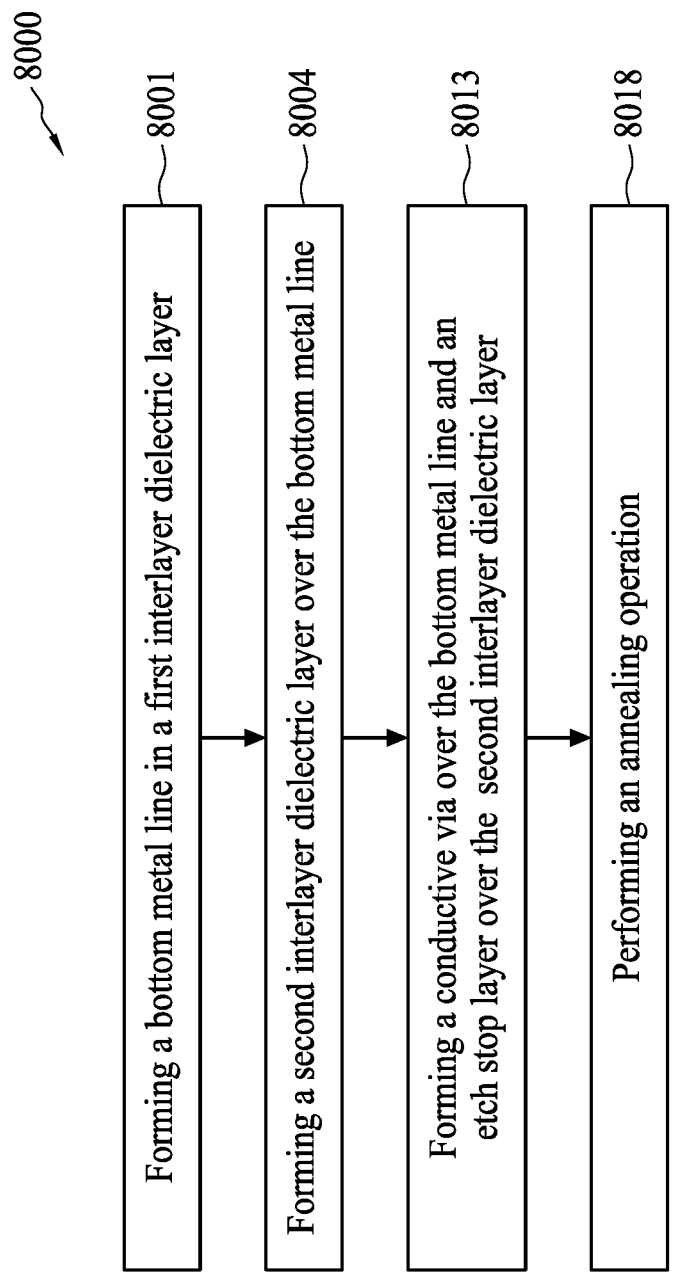
FIG. 12 shows a flow chart representing method of fabricating an interconnect structure, in accordance with some embodiments of the present disclosure.
Figure 13:
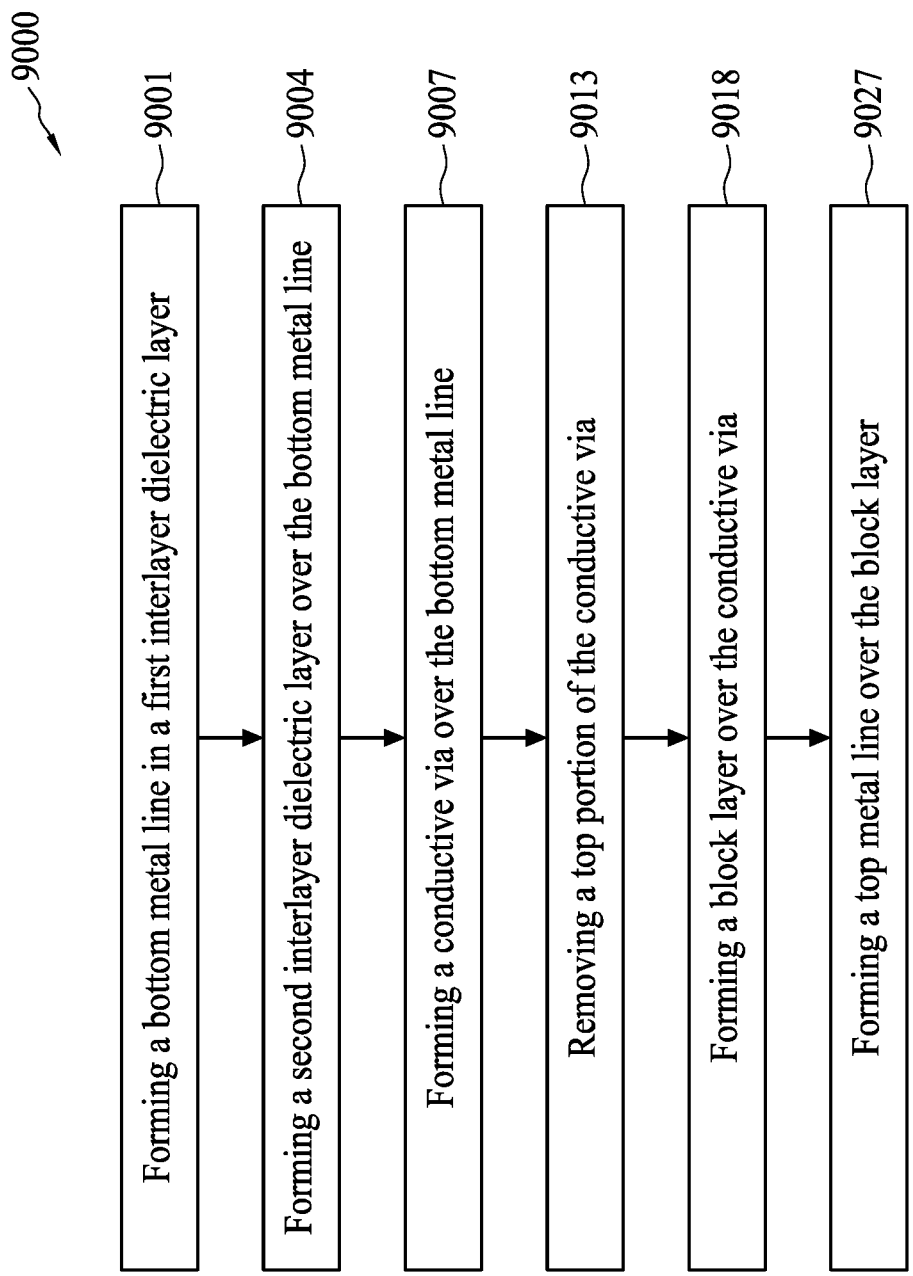
FIG. 13 shows a flow chart representing method of fabricating an interconnect structure, in accordance with some embodiments of the present disclosure.
Figure 13A:
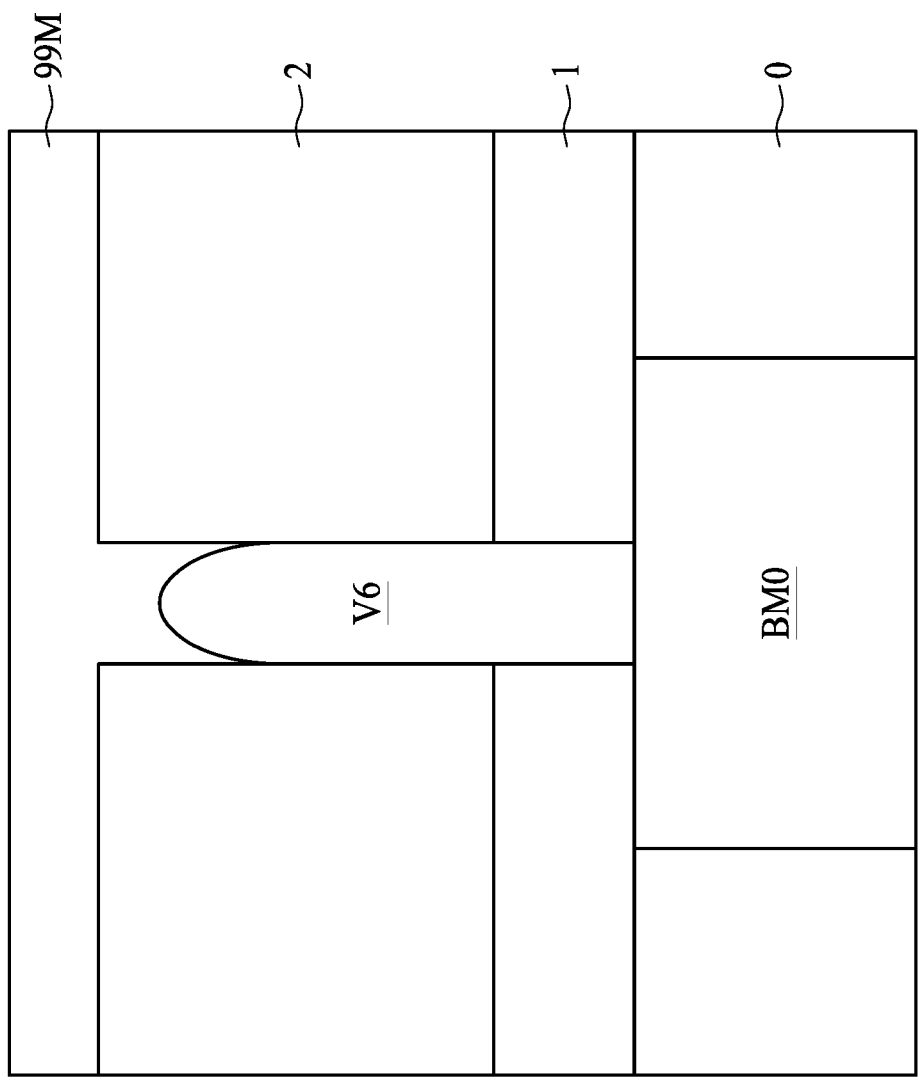
FIG. 13A to FIG. 13C are cross sectional views of an interconnect structure during intermediate stages of manufacturing operations, according to some embodiments of the present disclosure.
Figure 13B:
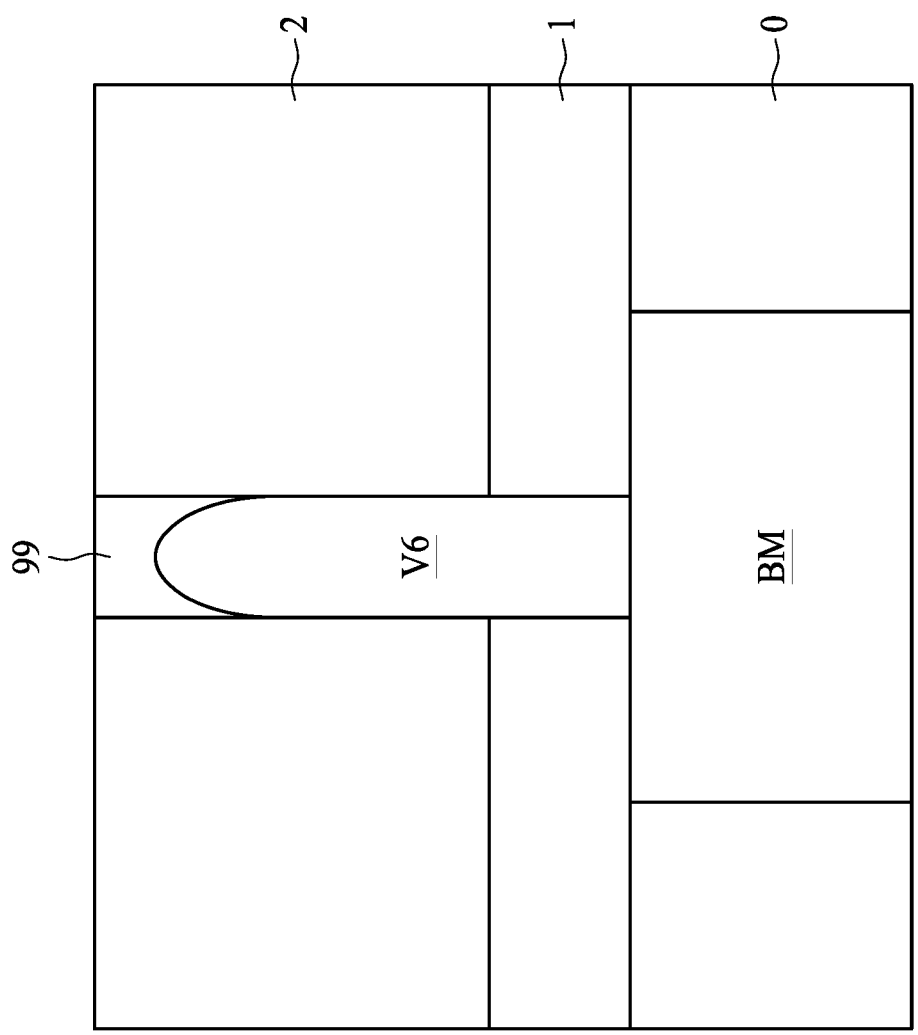

FIG. 11A to FIG. 11C, FIG. 12, FIG. 13A to FIG. 13C, FIG. 13A' to FIG. 13B', FIG. 13A" to FIG. 13B", and FIG. 13A''' to FIG. 13B''' provide additional treatment for alleviating migration and/or material loss, and can be implemented to the aforesaid fabrication operations.

Referring to FIG. 11A, FIG. 11A shows a flow chart representing method of fabricating an interconnect structure, in accordance with some embodiments of the present disclosure. Referring to FIG. 11A, FIG. 11A shows a flow chart representing method of fabricating an interconnect structure, in accordance with some embodiments of the present disclosure. The method 7000 for fabricating an interconnect structure includes forming a bottom metal line in a first interlayer dielectric layer (operation 7001, which can be referred to FIG. 4A, FIG. 5A, FIG. 6A, FIG. 7A, FIG. 8A, FIG. 9A, or FIG. 10A), forming a second interlayer dielectric layer over the bottom metal line (operation 7004, which can be referred to FIG. 4A, FIG. 5A, FIG. 6E, FIG. 7A, FIG. 8A, FIG. 9A, or FIG. 10A), removing a portion of the second dielectric layer (operation 7007, which can be referred to FIG. 4A, FIG. 5A, FIG. 6F, FIG. 7A, FIG. 8A, FIG. 9A, or FIG. 10A), forming a conductive via over the bottom metal line (operation 7013, which can be referred to FIG. 4C to FIG. 4D, FIG. 5C to FIG. 5D, FIG. 6G to FIG. 6H, FIG. 7B to FIG. 7C, FIG. 8B to FIG. 8C, FIG. 9B to FIG. 9B or FIG. 10B to FIG. 10C), forming a drive-in layer over the second dielectric layer (operation 7018, which can be referred to FIG. 11B), removing the drive-in layer (operation 7019, which can be referred to FIG. 11C) and forming a top metal line over the conductive via (operation 7021, which can be referred to FIG. 11C).

Referring to FIG. 11B, FIG. 11B is a cross sectional view of an interconnect structure during intermediate stages of manufacturing operations, according to some embodiments of the present disclosure. In some embodiments, the diffusion of the first metal from the bottom metal line BM (such as BM1 in FIG. 4A to FIG. 4E, BM2 in FIG. 5A to FIG. 5E, BM3 in FIG. 6A to FIG. 6I, BM0 in FIG. 7A to FIG. 10G) into via V (V1 to V7 discussed in FIG. 4A to FIG. 10G) would cause the material loss of the bottom metal line. Furthermore, in some embodiments, some voids or cracks may be formed in the via. Such material loss, voids or cracks may deteriorate device performance and reliability. Therefore, a drive-in layer 69 including the first metal is formed over the second ILD layer 2 to drive in first metal into the voids or cracks in the bottom metal line or via.

The aforesaid drive-in operation can be performed prior to forming the top metal line, for example, (1) subsequent to planarization operation to remove excessive second metal and prior to forming the second etch stop layer 3 (referring to FIG. 4D and FIG. 4E, FIG. 5D and FIG. 5E, FIG. 6H to FIG. 6I, or FIG. 10C to FIG. 10D); (2) subsequent to planarization operation to remove excessive second metal and prior to forming the third ILD layer 4 (referring to FIG. 7C to FIG. 7D, or, FIG. 8C to FIG. 8D); or, (3) subsequent to planarization operation to remove excessive second metal and prior to etching operation for removing a top portion of the conductive material layer VM6 (referring to FIG. 9C to FIG. 9D).

Referring to FIG. 11C, FIG. 11C is a cross sectional view of an interconnect structure during intermediate stages of manufacturing operations, according to some embodiments of the present disclosure. In some embodiments, the drive-in layer 69 may be removed after the drive-in operation. In some embodiments, the removal operation is by utilizing CMP. A second etch stop layer 3 is formed over the second ILD layer 2, and a third ILD layer 4 is formed over the second etch stop layer 3. (A top metal line is subsequently formed over the via V, which can be referred to aforementioned corresponding descriptions.)

Referring to FIG. 12, FIG. 12 shows a flow chart representing method of fabricating an interconnect structure, in accordance with some embodiments of the present disclosure. The method 8000 for fabricating an interconnect structure includes forming a bottom metal line in a first interlayer dielectric layer (operation 8001, which can be referred to FIG. 4A, FIG. 5A, FIG. 6A, FIG. 9A, or FIG. 10A), forming a second interlayer dielectric layer over the bottom metal line (operation 8004, which can be referred to FIG. 4A or FIG. 5A, FIG. 6E, FIG. 9A, or FIG. 10A), forming a conductive via over the bottom metal line and an etch stop layer over the second interlayer dielectric layer (operation 8013, which can be referred to FIG. 4C to FIG. 4D, FIG. 5C to FIG. 5D, FIG. 6G to FIG. 6H, FIG. 9B to FIG. 9B or FIG. 10B to FIG. 10C), and performing an annealing operation (operation 8018).

Referring to FIG. 12, alternatively, the material loss issue for bottom metal line (such as BM1 in FIG. 4A to FIG. 4E, BM2 in FIG. 5A to FIG. 5E, BM3 in FIG. 6A to FIG. 6I, BM0 in FIG. 7A to FIG. 10G) may be alleviated by performing cycle(s) of annealing operation after forming the second etch stop layer 3. The presence of second etch stop layer 3 may alleviate the loss of the first material from the bottom metal line BM through the via V. A temperature of the annealing operation is related to the characteristic of the first metal and the second metal, thus the diffusion length may be controlled. Such technique may alleviate migration and improve reliability since one or more of the first metal, second metal, and/or third metal may possess lower melting point, for example, nickel (1453° C.) or copper (1085° C.), cobalt (1495° C.), or the like. In some embodiments, the annealing temperature is less than 700° C., or less than 25% of the melting point (denoted in ° C.) to avoid serious migration.

Referring to FIG. 13, FIG. 13 shows a flow chart representing method of fabricating an interconnect structure, in accordance with some embodiments of the present disclosure. The method 9000 for fabricating an interconnect structure includes forming a bottom metal line in a first interlayer dielectric layer (operation 9001, which can be referred to FIG. 9A), forming a second interlayer dielectric layer over the bottom metal line (operation 9004, which can be referred to FIG. 9A), forming a conductive via over the bottom metal line (operation 9007, which can be referred to FIG. 9B to FIG. 9C), removing a top portion of the conductive via (operation 9013, which can be referred to FIG. 9D), forming a block layer over the conductive via (operation 9018, which can be referred to FIG. 13A to FIG. 13B, FIG. 13A' or FIG. 13A"), and forming a top metal line over the block layer (operation 9027, which can be referred to FIG. 13C, FIG. 13B', FIG. 13B", or FIG. 13B''').

In some alternative embodiments, a block layer 99 (in FIG. 13A to FIG. 13C), 99' (in FIG. 13A' to FIG. 13B'), 99" (in FIG. 13A" to FIG. 13B"), or 99'''(in FIG. 13A''' to FIG. 13B''') can be formed over the via V to alleviate migration and improve reliability since one or more of the first metal, second metal, and/or third metal may possess lower melting point, for example, nickel (1453° C.) or copper (1085° C.), cobalt (1495° C.), or the like. Herein the operations discussed in each group of the FIG. 13A to FIG. 13C, FIG. 13A' to FIG. 13B' are performed after the operation discussed in FIG. 9D, FIG. 13A" to FIG. 13B" are performed after the operation discussed in FIG. 9F, and FIG. 13A''' to FIG. 13B''' are performed after the operation discussed in FIG. 7E or FIG. 8F as examples, but similar technique may also be implemented in other embodiments.

Figure 13C:
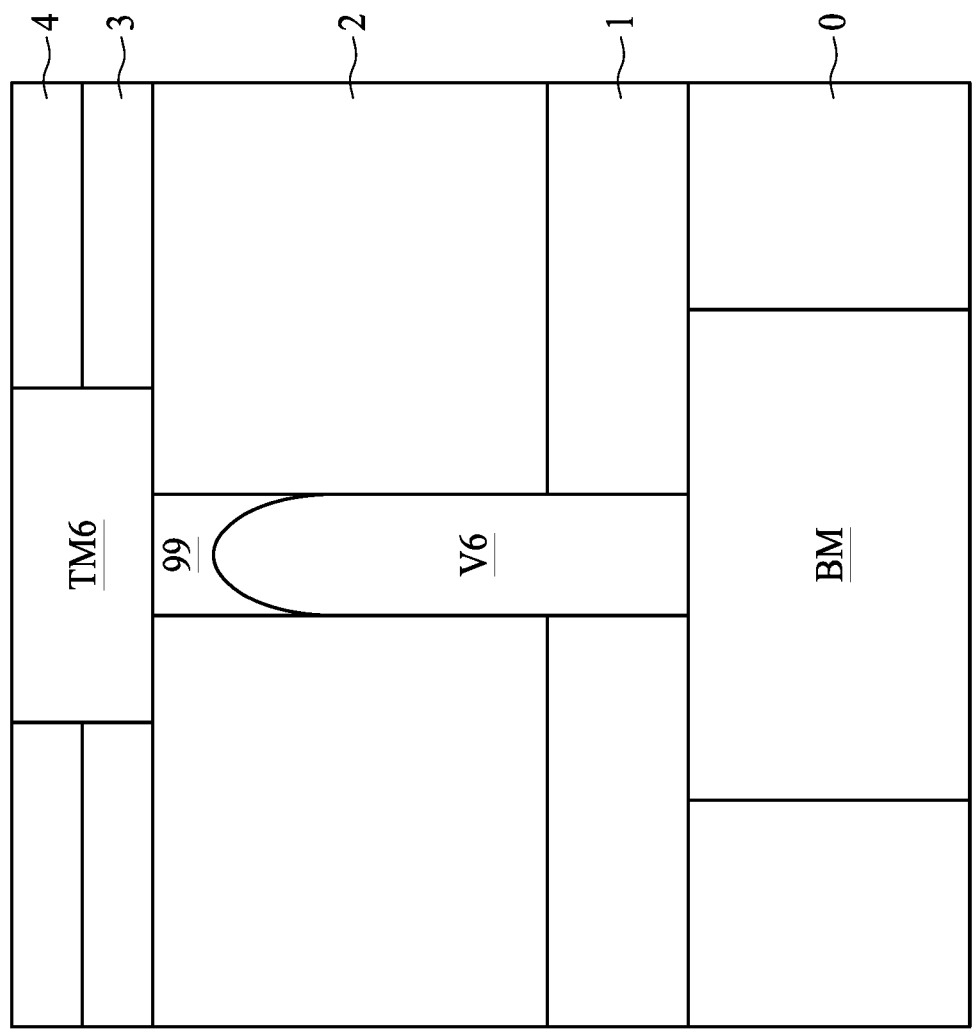
Figure 13A:
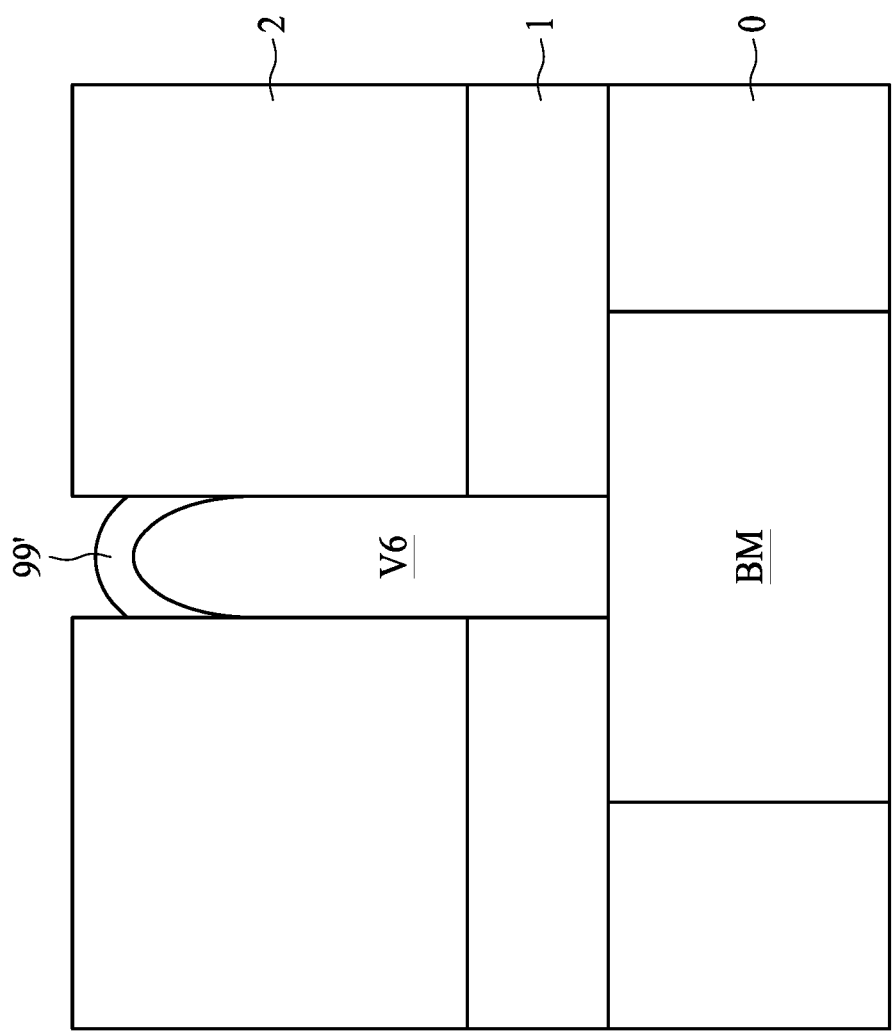
Figure 13B:
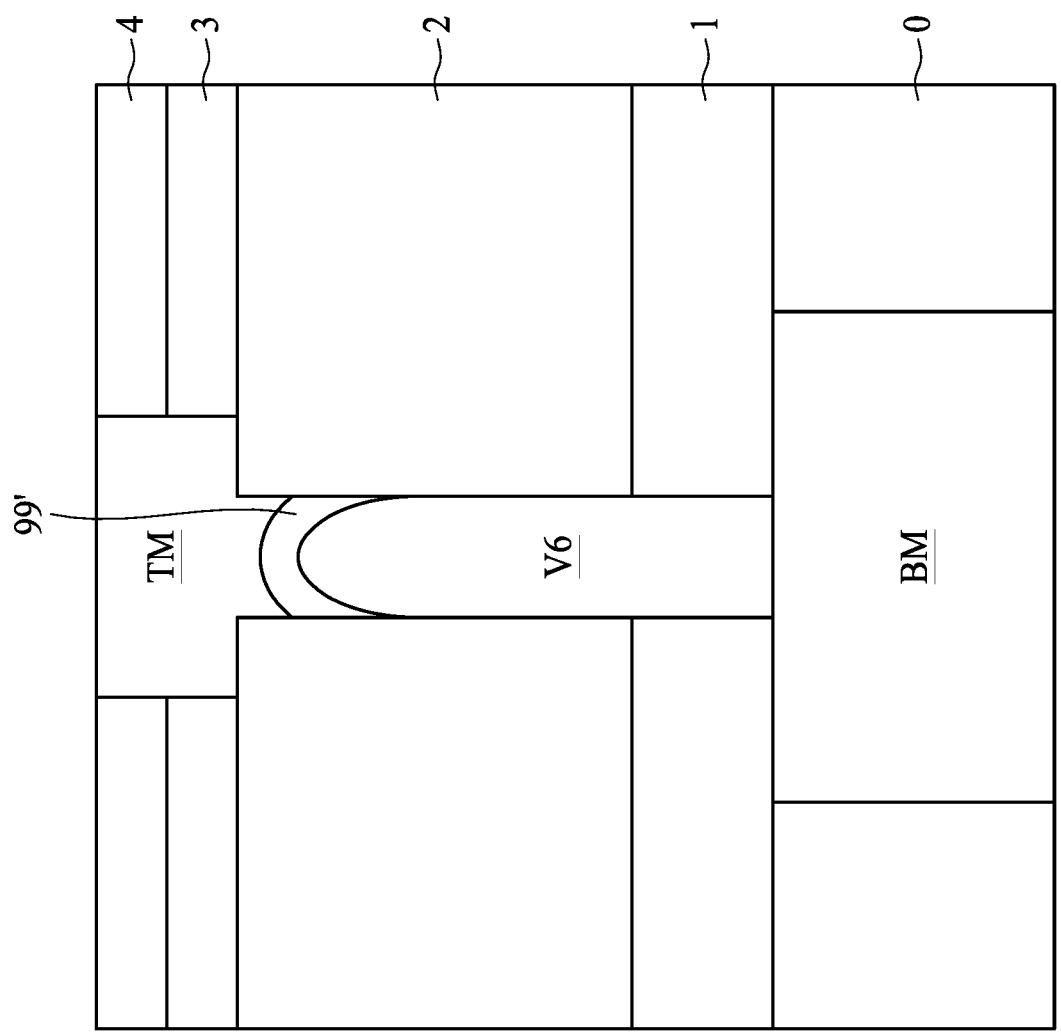
Figure 13A:
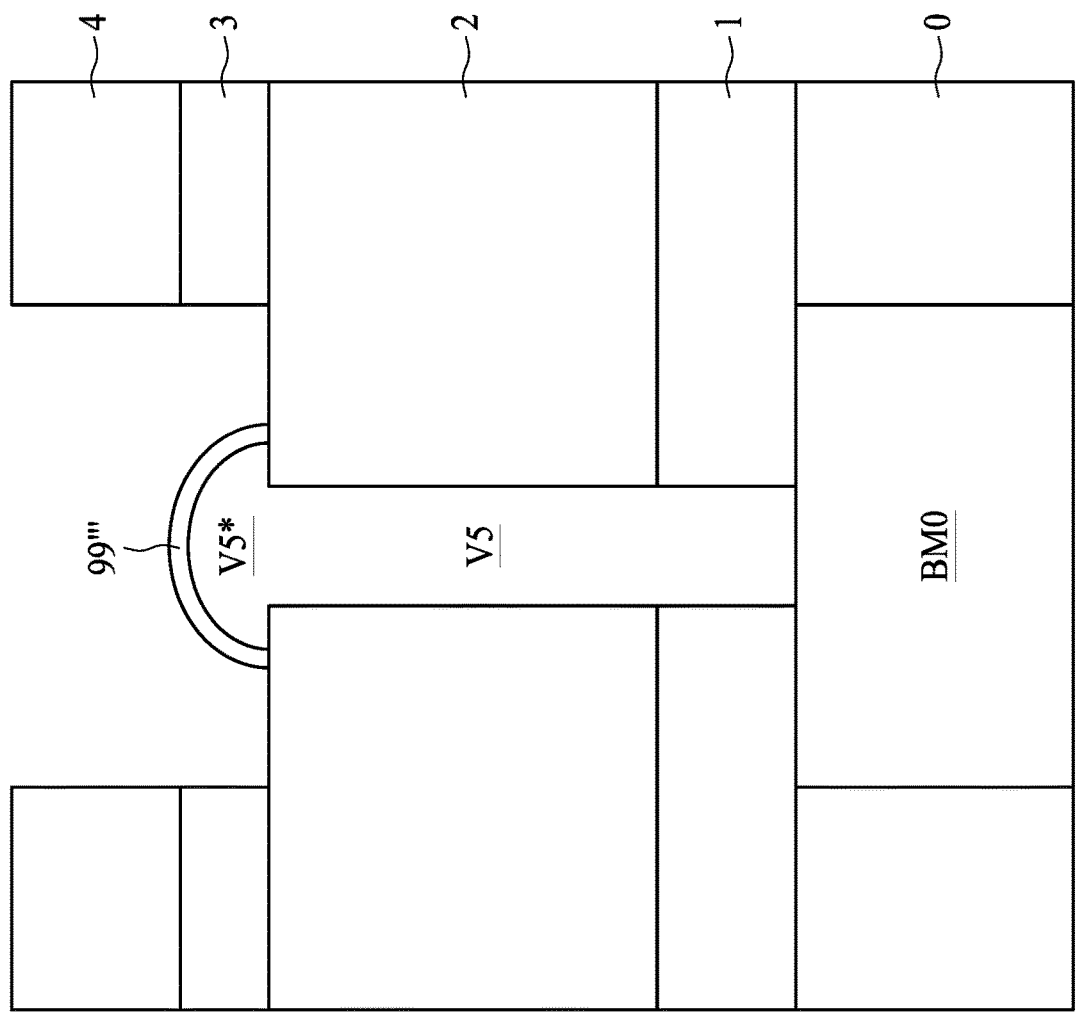
Figure 13B:
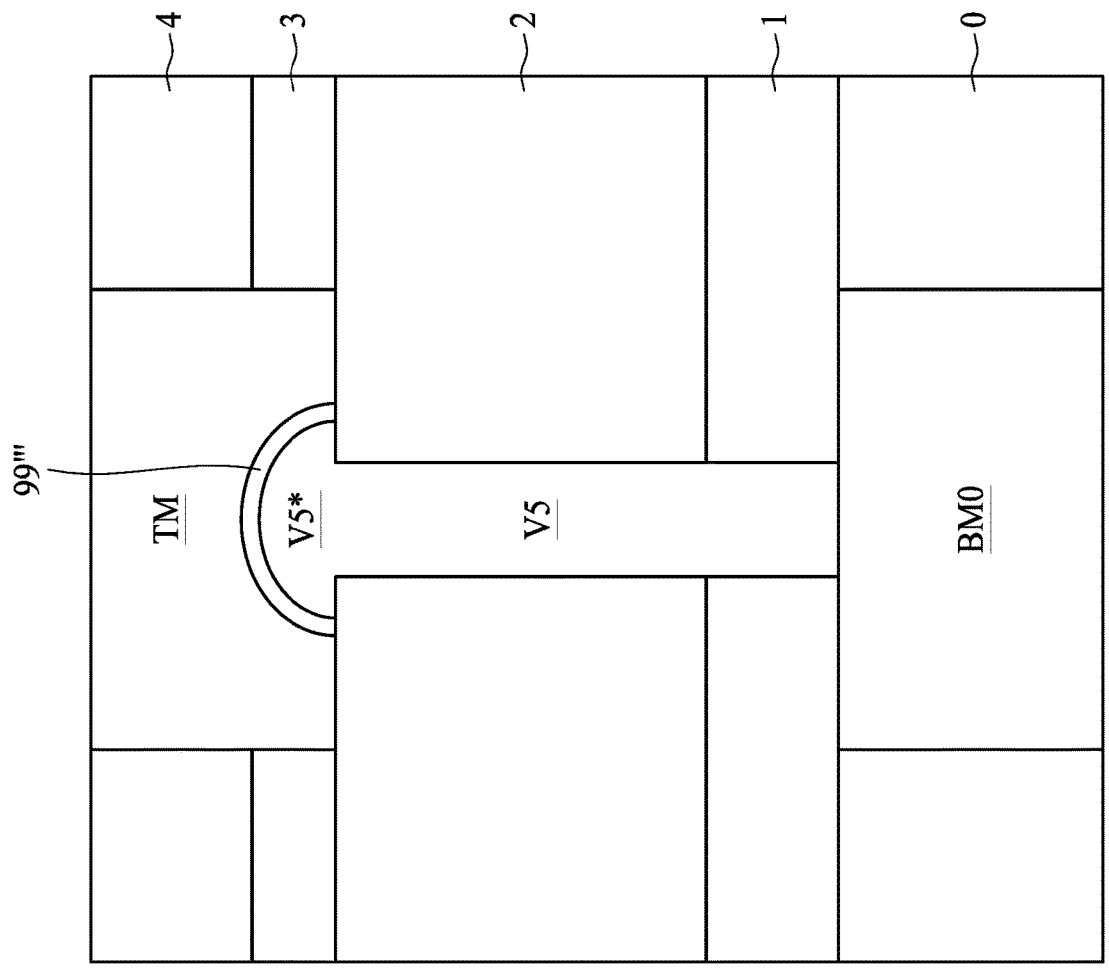

Referring to FIG. 13A, FIG. 13A is a cross sectional view of an interconnect structure during intermediate stages of manufacturing operations, according to some embodiments of the present disclosure. Subsequent to performing an etching operation to remove a top portion of the conductive material layer including second metal (FIG. 9D), a block layer material 99M is formed over the via V6 and the second ILD layer 2. Herein the block layer material 99M is conductive and has a second type of primary crystalline structure different from the first type. For example, when the first metal and the second metal have HCP crystalline structure (e.g. Co and Ru, respectively), the block layer material may have a BCC or FCC crystalline structure (e.g. W). Referring to FIG. 13B, FIG. 13B is a cross sectional view of an interconnect structure during intermediate stages of manufacturing operations, according to some embodiments of the present disclosure. A planarization operation, such as chemical mechanical planarization (CMP), is performed to remove excessive portion of the block layer material 99M over the second ILD layer 2 to form a block layer 99. Referring to FIG. 13C, FIG. 13C is a cross sectional view of an interconnect structure during intermediate stages of manufacturing operations, according to some embodiments of the present disclosure. A second etch stop layer 3 is formed over the second ILD layer 2, and a third ILD layer 4 is formed over the second etch stop layer 3. A top metal line TM is formed in the second etch stop layer 3 and the third ILD layer 4 and over the via V6.

Referring to FIG. 13A', FIG. 13A' is a cross sectional view of an interconnect structure during intermediate stages of manufacturing operations, according to some embodiments of the present disclosure. Subsequent to performing an etching operation to remove a top portion of the conductive material layer including second metal (FIG. 9D), a block layer 99' is selectively deposited over the via V6. In some of the embodiments, a top surface of the block layer 99' is lower than a top surface of the second ILD layer 2. Similar to the discussion in FIG. 13A, a material of the block layer 99' is conductive and has a second type of primary crystalline structure different from the first type. Referring to FIG. 13B', FIG. 13B' is a cross sectional view of an interconnect structure during intermediate stages of manufacturing operations, according to some embodiments of the present disclosure. A second etch stop layer 3 is formed over the second ILD layer 2, and a third ILD layer 4 is formed over the second etch stop layer 3. A top metal line TM is formed in the second etch stop layer 3 and the third ILD layer 4 and over the via V6. In some embodiments, a bottom portion of the top metal line TM is laterally surrounded by the second ILD layer 2.

Referring to FIG. 13A" to FIG. 13B", FIG. 13A" to FIG. 13B" are cross sectional views of an interconnect structure during intermediate stages of manufacturing operations, according to some embodiments of the present disclosure. Subsequent to forming a second recess R6' by an etching operation (FIG. 9F), a block layer 99" is conformably formed over a bottom surface and a sidewall of the second recess R6'. Similar to the discussion in FIG. 13A' to FIG. 13B', a material of the block layer 99" is conductive and has a second type of primary crystalline structure different from the first type. The block layer 99" has a bottom portion 99B" laterally surrounded by the second ILD 2. A top metal line TM is formed in a recess Rk surrounded by the block layer 99", over and electrically connected to the via V7 (excessive portion of the top metal line TM may be removed by planarization operation).

Referring to FIG. 13A''' to FIG. 13B''', FIG. 13A''' to FIG. 13B''' are cross sectional views of an interconnect structure during intermediate stages of manufacturing operations, according to some embodiments of the present disclosure. Subsequent to forming a second recess R4' or R5' by an etching operation (FIG. 7E or FIG. 8F), a block layer 99''' is conformally formed over a top surface of the top portion V4* (in FIG. 7E) or over a top surface of the protruding portion V5* (in FIG. 8F). Similar to the discussion in FIG. 13A', a material of the block layer 99''' is conductive and has a second type of primary crystalline structure different from the first type. A second etch stop layer 3 is formed over the second ILD layer 2, and a third ILD layer 4 is formed over the second etch stop layer 3. A top metal line TM is formed in a recess Rk surrounded by the block layer 99''', over and electrically connected to the top portion V4* or the protruding portion V5* (excessive portion of the top metal line TM may be removed by planarization operation).

The present disclosure provides embodiments of interconnect structures having a smaller via dimension (e.g. less than 18 nm). In order to remain lower bulk resistance and alleviate interfacial resistance, the present disclosure provide the baseline and exemplary combinations of selecting a first metal for bottom metal line, a second metal for via, and third metal for top metal line, wherein the first metal and the second metal (and/or the second metal and the third metal) has identical type of primary crystalline structure, and an intermixing interface can be occurred therebetween due to identical type of primary crystalline structure, less lattice mismatch, or in some of the cases, having higher tendency of diffusion when one of the selected metal has lower melting point. Furthermore, the second metal for metal via has a lower value of free mean path $\lambda_{rt}$ times by resistivity $\rho$ (less than 7E-17 $\Omega$-m$^2$), which may have less bulk resistivity and incurring less interfacial resistance. It can be observed that intermixing effect may help the interconnect structure to inhibit the electron scattering effect, thus improving the device performance.

The present disclosure further provides embodiments of configurations of interconnect structures. Specifically, each set of embodiments discussed in FIG. 4A to FIG. 4E, FIG. 5A to FIG. 5E, and FIG. 6A to 6I can be applied to the configuration and fabrication method of the bottom metal line and the via; each set of embodiments discussed in FIG. 7A to FIG. 7F, FIG. 8A to FIG. 8G, FIG. 9A to FIG. 9G, and FIG. 10A to 10G can be applied to the configuration and fabrication method of the via and the top metal line. By the aforesaid configurations, the area of the intermixing interface can be increased, and the interfacial resistance can be reduced.

In addition, FIG. 11A to FIG. 11C, FIG. 12, FIG. 13A to FIG. 13C, FIG. 13A' to FIG. 13B', FIG. 13A" to FIG. 13B", and FIG. 13A''' to FIG. 13B''' provide additional treatment for alleviating migration and/or material loss, and is compatible to the BEOL process and can be implemented to the aforesaid fabrication operations.

Some embodiments of the present disclosure provide an interconnect structure, including a first interlayer dielectric layer, a bottom metal line including a first metal in the first interlayer dielectric layer, a conductive via including a second metal over the bottom metal line, wherein the second metal is different from the first metal, and the first metal has a first type of primary crystalline structure, and the second metal has the first type of primary crystalline structure, a total area of a bottom surface of the conductive via is greater than a total cross sectional area of the conductive via, and a top metal line over the conductive via, wherein the top metal line comprises a third metal different from the second metal.

Some embodiments of the present disclosure provide an electron scattering inhibiting interconnect structure, including electron scattering inhibiting interconnect structure, including a first interlayer dielectric layer, a bottom metal line including a first metal in the first interlayer dielectric layer, a conductive via comprising a second metal over the bottom metal line, wherein the second metal is different from the first metal, and the first metal intermixes with the second metal, and a top metal line over the conductive via, wherein the top metal line includes a third metal different from the second metal.

Some embodiments of the present disclosure provide a method for forming an interconnect structure, including forming a bottom metal line in a first interlayer dielectric layer, forming a second interlayer dielectric layer over the bottom metal line, removing a portion of the second dielectric layer, forming a conductive via over the bottom metal line, increasing a total surface area of a top surface of the conductive via, and forming a top metal line over the conductive via.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An interconnect structure, comprising:
   a first interlayer dielectric layer;
   a bottom metal line comprising a first metal in the first interlayer dielectric layer;
   a conductive via comprising a second metal over the bottom metal line, wherein the second metal is different from the first metal, and the first metal has a first type of primary crystalline structure, and the second metal has the first type of primary crystalline structure, a total area of a bottom surface of the conductive via is greater than a total cross sectional area of the conductive via; and
   a top metal line over the conductive via, wherein the top metal line comprises a third metal different from the second metal.

2. The interconnect structure of claim 1, wherein the first metal comprises a melting point lower than a melting point of the second metal.

3. The interconnect structure of claim 1, wherein the second metal has a first type of primary crystalline structure, and the third metal has the first type of primary crystalline structure.

4. The interconnect structure of claim 1, wherein the first type of primary crystalline structure is face-centered cubic (FCC).

5. The interconnect structure of claim 1, wherein a bottom surface of the conductive via is concaved away from the first interlayer dielectric layer.

6. The interconnect structure of claim 1, wherein a total area of a top surface of the conductive via is greater than the total cross sectional area of the conductive via and less than a total cross sectional area of the top metal line.

7. The interconnect structure of claim 1, wherein a top portion of the conductive via is laterally surrounded by the top metal line.

8. An electron scattering inhibiting interconnect structure, comprising:
   a first interlayer dielectric layer;
   a bottom metal line comprising a first metal in the first interlayer dielectric layer;
   a conductive via comprising a second metal over the bottom metal line, wherein the second metal is different from the first metal, and the first metal intermixes with the second metal; and
   a top metal line over the conductive via, wherein the top metal line comprises a third metal different from the second metal.

9. The electron scattering inhibiting interconnect structure of claim 8, wherein each of the first metal, the second metal, and the third metal has a first type of primary crystalline structure.

10. The electron scattering inhibiting interconnect structure of claim 9, wherein the bottom metal line comprises a protruding portion protruding toward the conductive via.

11. The electron scattering inhibiting interconnect structure of claim 10, wherein the protruding portion comprises a fourth metal different from the first metal, the fourth metal has the first type of primary crystalline structure.

12. The electron scattering inhibiting interconnect structure of claim 8, further comprising a block layer between a top surface of the conductive via and a bottom surface of the top metal line, wherein the block layer has a second type of primary crystalline structure different from the first type of primary crystalline structure.

13. A method for forming an interconnect structure, comprising:
   forming a bottom metal line in a first interlayer dielectric layer;
   forming a second interlayer dielectric layer over the bottom metal line;
   removing a portion of the second dielectric layer;
   forming a conductive via over the bottom metal line;
   increasing a total surface area of a top surface of the conductive via; and
   forming a top metal line over the conductive via.

14. The method of claim 13, further comprising removing a portion of the bottom metal line subsequent to removing a portion of the second dielectric layer.

15. The method of claim 13, further comprising removing a portion of the bottom metal line prior to forming a portion of the second dielectric layer.

16. The method of claim 13, wherein increasing the total surface area of the top surface of the conductive via comprises removing a portion of the conductive via.

17. The method of claim 13, wherein increasing the total surface area of the top surface of the conductive via comprises depositing a conductive material over the conductive via.

18. The method of claim 13, further comprising forming an etch stop layer over the conductive via and performing a thermal annealing operation subsequent to forming the etch stop layer.

19. The method of claim 13, further comprising forming a drive-in layer over the second dielectric layer prior to forming the top metal line, wherein a material of the drive-in layer is identical with a material of the bottom metal line.

20. The method of claim 13, further comprising forming a block layer over the top surface of the conductive via, wherein a type of primary crystalline structure of the block layer is different from a type of primary crystalline structure of the conductive via.

* * * * *